United States Patent
Ye et al.

(10) Patent No.: US 11,868,201 B2
(45) Date of Patent: *Jan. 9, 2024

(54) MEMORY EVALUATION METHOD AND APPARATUS

(71) Applicant: Huawei Technologies Co., Ltd., Shenzhen (CN)

(72) Inventors: Zheng Ye, Shenzhen (CN); Fei Zhang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/741,765

(22) Filed: May 11, 2022

(65) Prior Publication Data
US 2022/0269553 A1 Aug. 25, 2022

Related U.S. Application Data

(63) Continuation of application No. 16/816,597, filed on Mar. 12, 2020, which is a continuation of application No. PCT/CN2018/087360, filed on May 17, 2018.

(30) Foreign Application Priority Data

Sep. 18, 2017 (CN) .......................... 201710841912.5

(51) Int. Cl.
*G06F 11/00* (2006.01)
*G06F 11/07* (2006.01)

(52) U.S. Cl.
CPC ........ *G06F 11/0772* (2013.01); *G06F 11/073* (2013.01); *G06F 11/076* (2013.01)

(58) Field of Classification Search
CPC ... G06F 11/073; G06F 11/076; G06F 11/0772
See application file for complete search history.

(56) References Cited

U.S. PATENT DOCUMENTS

| | | |
|---|---|---|
| 5,471,479 A | 11/1995 | McRoberts et al. |
| 8,838,430 B1 | 9/2014 | Lang et al. |
| 9,471,423 B1 | 10/2016 | Healy et al. |
| 10,019,195 B1 | 7/2018 | Azmandian et al. |
| 10,387,287 B1 | 8/2019 | Wu et al. |
| 2004/0030957 A1 | 2/2004 | Yadavalli et al. |
| 2005/0188269 A1 | 8/2005 | El-Shimi et al. |

(Continued)

FOREIGN PATENT DOCUMENTS

| | | |
|---|---|---|
| CN | 103092739 A | 5/2013 |
| CN | 103646670 A | 3/2014 |

(Continued)

*Primary Examiner* — Joshua P Lottich
(74) *Attorney, Agent, or Firm* — Conley Rose, P.C.

(57) ABSTRACT

A memory evaluation method includes determining a health degree evaluation model indicating a relationship in which a health degree of a memory changes with at least one health degree influencing factor of the memory; obtaining at least one running parameter value corresponding to each of the at least one health degree influencing factor; separately matching the at least one running parameter value corresponding to each health degree influencing factor to the health degree evaluation model, to obtain the health degree of the memory; and outputting health degree indication information indicating whether the memory needs to be replaced.

20 Claims, 33 Drawing Sheets

(56) References Cited

U.S. PATENT DOCUMENTS

| | | |
|---|---|---|
| 2014/0380106 A1 | 12/2014 | Presman et al. |
| 2015/0074469 A1 | 3/2015 | Cher et al. |
| 2015/0234698 A1 | 8/2015 | Chan |
| 2015/0309908 A1 | 10/2015 | Pearson et al. |
| 2016/0026405 A1 | 1/2016 | Dhuse |
| 2016/0179618 A1 | 6/2016 | Resch et al. |
| 2016/0321136 A1 | 11/2016 | Baptist et al. |
| 2017/0046212 A1 | 2/2017 | Fernandez et al. |
| 2017/0255507 A1 | 9/2017 | Milor et al. |
| 2018/0113626 A1 | 4/2018 | Baptist |
| 2018/0115604 A1 | 4/2018 | Cocagne |
| 2018/0189125 A1 | 7/2018 | Karlik et al. |
| 2018/0337997 A1 | 11/2018 | Motwani et al. |
| 2019/0281114 A1 | 9/2019 | Cocagne |

FOREIGN PATENT DOCUMENTS

| | | |
|---|---|---|
| CN | 105243007 A | 1/2016 |
| CN | 106227647 A | 12/2016 |
| CN | 106934242 A | 7/2017 |
| CN | 106940678 A | 7/2017 |

| Name ▼ | Vendor ▼ | Capacity ▼ | Dominant frequency ▼ | Serial number ▼ | Memory type ▼ | Minimum voltage ▼ | Quantity of ranks(rank) ▼ | Bit width ▼ | Technology ▼ |
|---|---|---|---|---|---|---|---|---|---|
| DIMM000 | Vendor A | 32768 MB | 2400 MHz | 0x27EACEEA | DDR4 | 1200 mV | 2 ranks | 72 bits | Synchronous \| Registered (Buffered) |
| DIMM001 | Vendor B | 16384 MB | 2133 MHz | 0x0205D25E | DDR4 | 1200 mV | 2 ranks | 72 bits | Synchronous \| Registered (Buffered) |
| DIMM002 | Vendor C | 8192 MB | 2133 MHz | 0xB1028528 | DDR4 | 1200 mV | 1 rank | 72 bits | Synchronous \| Registered (Buffered) |
| DIMM010 | Vendor B | 8192 MB | 2400 MHz | 0x0301163D | DDR4 | 1200 mV | 2 ranks | 72 bits | Synchronous \| Registered (Buffered) |
| DIMM011 | Vendor A | 16384 MB | 2400 MHz | 0x14C2C01E | DDR4 | 1200 mV | 2 ranks | 72 bits | Synchronous \| Registered (Buffered) |
| DIMM012 | Vendor B | 8192 MB | 2133 MHz | 0x1025CEEB | DDR4 | 1200 mV | 1 rank | 72 bits | Synchronous \| Registered (Buffered) |

FIG. 3

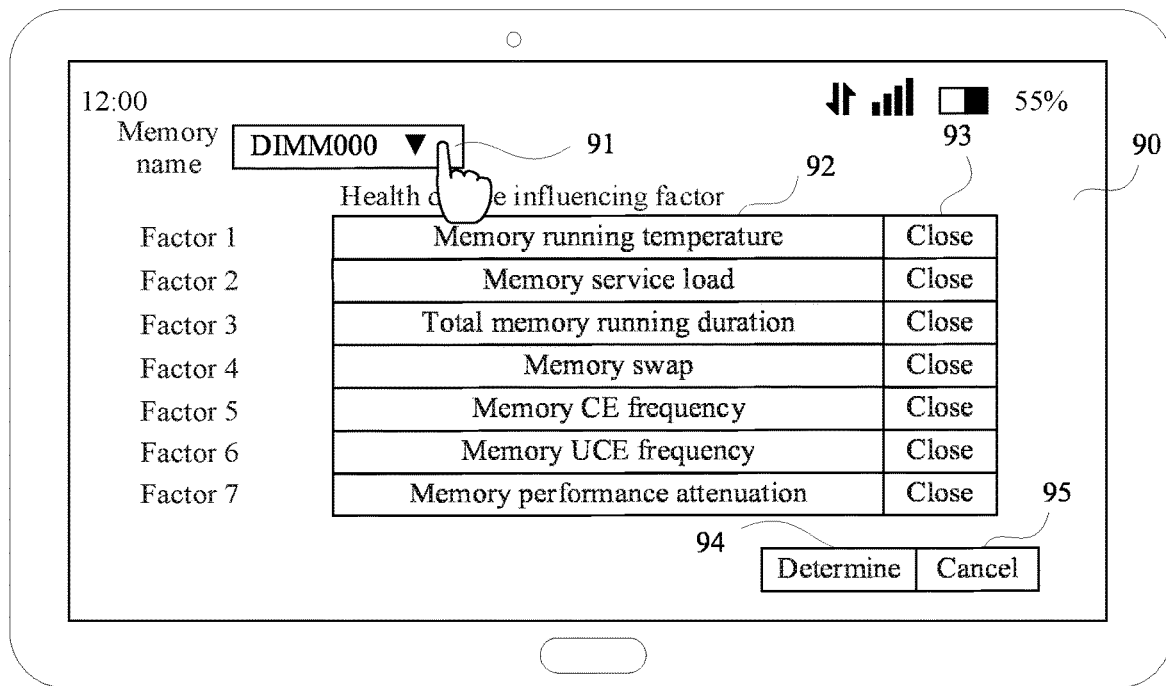
FIG. 9A
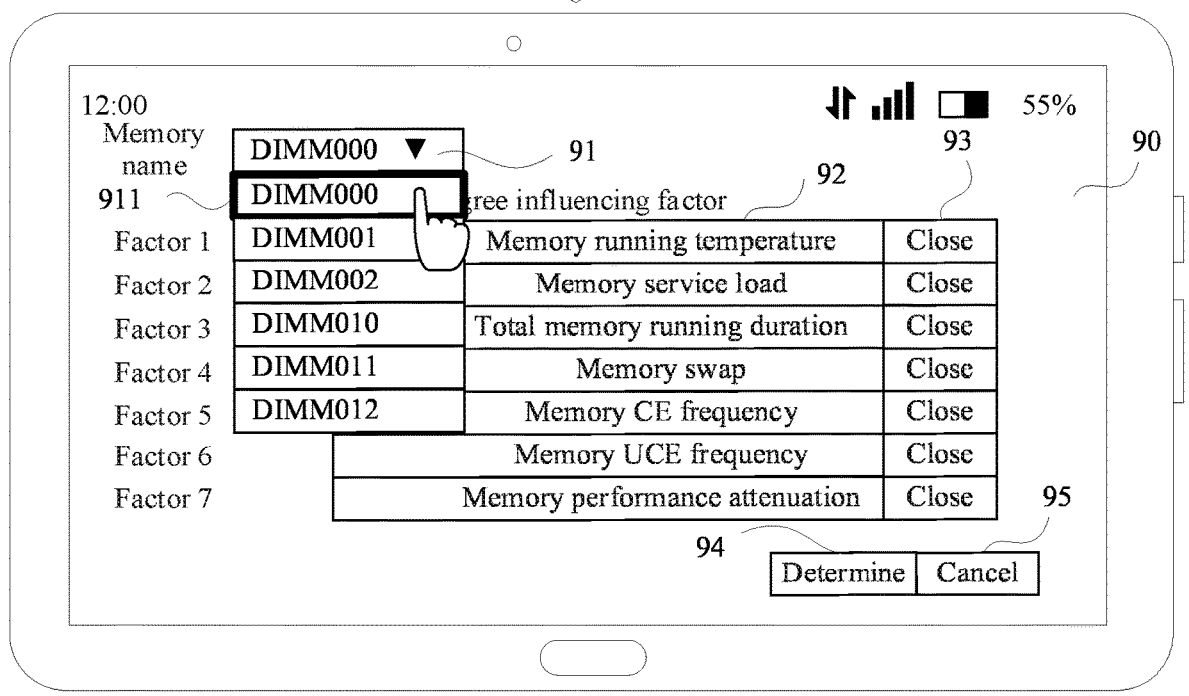
FIG. 9B

| Name ▶ | Vendor ▶ | Capacity ▶ | Dominant frequency ▶ | Serial number ▶ | Memory type ▶ | Minimum voltage ▶ | Quantity of ranks ▶ | Bit width ▶ | Technology ▶ | Health degree |
|---|---|---|---|---|---|---|---|---|---|---|
| DIMM000 | Vendor A | 32768 MB | 2400 MHz | 0x27EACEEA | DDR4 | 1200 mV | 2 ranks | 72 bits | Synchronous \| Registered (Buffered) | 95 |
| DIMM001 | Vendor B | 16384 MB | 2133 MHz | 0x0205D25E | DDR4 | 1200 mV | 2 ranks | 72 bits | Synchronous \| Registered (Buffered) | 23 |
| DIMM002 | Vendor C | 8192 MB | 2133 MHz | 0xB1028528 | DDR4 | 1200 mV | 1 rank | 72 bits | Synchronous \| Registered (Buffered) | 85 |
| DIMM010 | Vendor B | 8192 MB | 2400 MHz | 0x0301163D | DDR4 | 1200 mV | 2 ranks | 72 bits | Synchronous \| Registered (Buffered) | 40 |
| DIMM011 | Vendor A | 16384 MB | 2400 MHz | 0x14C2C01E | DDR4 | 1200 mV | 2 ranks | 72 bits | Synchronous \| Registered (Buffered) | 100 |
| DIMM012 | Vendor B | 8192 MB | 2133 MHz | 0x1025CEEB | DDR4 | 1200 mV | 1 rank | 72 bits | Synchronous \| Registered (Buffered) | 64 |

FIG. 27

| Name ▶ | Vendor ▶ | Capacity ▶ | Dominant frequency ▶ | Serial number ▶ | Memory type ▶ | Minimum voltage ▶ | Quantity of ranks ▶ | Bit width ▶ | Technology | Health degree |
|---|---|---|---|---|---|---|---|---|---|---|
| DIMM000 | Vendor A | 32768 MB | 2400 MHz | 0x27EACEEA | DDR4 | 1200 mV | 2 ranks | 72 bits | Synchronous \| Registered (Buffered) | Healthy |
| DIMM001 | Vendor B | 16384 MB | 2133 MHz | 0x0205D25E | DDR4 | 1200 mV | 2 ranks | 72 bits | Synchronous \| Registered (Buffered) | Alarm |
| DIMM002 | Vendor C | 8192 MB | 2133 MHz | 0xB1028528 | DDR4 | 1200 mV | 1 rank | 72 bits | Synchronous \| Registered (Buffered) | Healthy |
| DIMM010 | Vendor B | 8192 MB | 2400 MHz | 0x0301163D | DDR4 | 1200 mV | 2 ranks | 72 bits | Synchronous \| Registered (Buffered) | Alarm |
| DIMM011 | Vendor A | 16384 MB | 2400 MHz | 0x14C2C01E | DDR4 | 1200 mV | 2 ranks | 72 bits | Synchronous \| Registered (Buffered) | Healthy |
| DIMM012 | Vendor B | 8192 MB | 2133 MHz | 0x1025CEEB | DDR4 | 1200 mV | 1 rank | 72 bits | Synchronous \| Registered (Buffered) | Mediocre |

FIG. 28

Setting interface

Memory name: DIMM000 ▼ — 51

Health degree influencing factor — 52

| | Health degree influencing factor | Weight 56 | 57 | Algorithm 58 | 53 |
|---|---|---|---|---|---|
| Factor 1 | Memory running temperature | 20% | Set | Addition | Close |
| Factor 2 | Memory service load | 5% | Set | Addition | Close |
| Factor 3 | Total memory running duration | 25% | Set | Addition | Close |
| Factor 4 | Memory swap | 5% | Set | Addition | Close |
| Factor 5 | Memory CE frequency | 10% | Set | Addition | Close |
| Factor 6 | Memory UCE frequency | 15% | Set | Multiplication | Close |
| Factor 7 | Memory performance attenuation | 5% | Set | Addition | Close |
| Factor 8 | Customize | Customize % | Set | Addition | Close |

Add — 59

| First preset value range | 75–100 | — 5101 |
| Second preset value range | 45–74 | — 5102 |
| Third preset value range | 0–44 | — 5103 |

54 — Determine | Cancel — 55

MEMORY EVALUATION METHOD AND APPARATUS

CROSS-REFERENCE TO RELATED APPLICATIONS

This application is a continuation of U.S. patent application Ser. No. 16/816,597, filed on Mar. 12, 2020, which is a continuation of International Patent Application No. PCT/CN2018/087360, filed on May 17, 2018, which claims priority to Chinese Patent Application No. 201710841912.5, filed on Sep. 18, 2017. All of the aforementioned patent applications are hereby incorporated by reference in their entireties.

TECHNICAL FIELD

The present disclosure relates to the field of computer technologies, and in particular, to a memory evaluation method and apparatus.

BACKGROUND

With development of an internet technology (IT), a total capacity of a memory of a server is increasingly large. Normal functioning of the memory is important to normal operations of the server. Therefore, to support normal operations of the server, determining whether the memory is functioning normally needs to be performed before the memory is faulty.

In some approaches, for some servers such as an x86 server, whether a memory is working normally is usually determined based on whether the memory is available, whether the server can identify the memory, whether an uncorrectable error (UCE) occurs in the memory, or the like. In other words, whether the memory is working normally is determined based on whether the memory is faulty. After it is determined that the memory of the server is faulty, a user is prompted to replace the faulty memory.

An existing problem is as follows. In some approaches, determining whether the memory can work normally is based on whether the memory is faulty such as when a fault of the memory has affected normal operations of the server. For example, when it is determined that the memory is unavailable, the memory has caused severe impact such as breakdown, service impairment, and even data loss of the server.

SUMMARY

This application provides a memory evaluation method and apparatus, to evaluate a health degree of a memory in a server, and to prompt a user to replace the memory when the memory is not faulty and has a relatively low health degree, so that the memory can support normal operations of the server.

To achieve the foregoing objectives, the following technical solutions are used in this application.

According to a first aspect, a memory evaluation method is provided. The method includes: determining a health degree evaluation model of a to-be-evaluated memory, where The health degree evaluation model is a relationship in which a health degree of the to-be-evaluated memory changes with at least one health degree influencing factor of the to-be-evaluated memory, One health degree influencing factor corresponds to one running parameter and one failure rate parameter, and one health degree influencing factor corresponds to one weight, where the weight is a constant; obtaining at least one running parameter value corresponding to each of the at least one health degree influencing factor, where the at least one running parameter value corresponds to one running parameter; separately matching the at least one running parameter value corresponding to each health degree influencing factor to the health degree evaluation model, to obtain the health degree of the to-be-evaluated memory; and outputting health degree indication information of the to-be-evaluated memory based on the health degree of the to-be-evaluated memory, where the health degree indication information of the to-be-evaluated memory is used to indicate, to a user, whether the to-be-evaluated memory needs to be replaced.

It should be noted that this application provides the health degree evaluation model that describes the relationship in which the health degree of the to-be-evaluated memory changes with the at least one health degree influencing factor of the to-be-evaluated memory, so that a memory evaluation apparatus can obtain the health degree of the to-be-evaluated memory based on the health degree evaluation model of the to-be-evaluated memory. Therefore, the memory evaluation apparatus can generate the health degree indication information of the to-be-evaluated memory based on a value of the health degree of the to-be-evaluated memory. To be specific, before the to-be-evaluated memory is faulty, the memory evaluation apparatus can determine, based on the health degree of the to-be-evaluated memory, whether to replace the to-be-evaluated memory. In addition, the memory evaluation apparatus can output the health degree indication information of the to-be-evaluated memory when the memory is not faulty and the health degree of the memory is relatively low, to prompt the user to replace the memory, so that the memory can support normal operations of the server.

In addition, the weight corresponding to one health degree influencing factor can indicate an extent to which the health degree influencing factor affects the health degree of the to-be-evaluated memory, and health degree influencing factors corresponding to different weights have different impact on the health degree of the to-be-evaluated memory. For example, a larger weight corresponding to a health degree influencing factor indicates greater impact of the health degree influencing factor on the health degree of the to-be-evaluated memory. In this way, a weight corresponding to each health degree influencing factor in the health degree evaluation model provided in this application can indicate impact of each health degree influencing factor on the health degree of the to-be-evaluated memory, so that impact extents of different health degree evaluation factors for the to-be-evaluated memory in the health degree evaluation model are more proper for the to-be-evaluated memory. This helps to accurately evaluate the health degree of the to-be-evaluated memory.

In a possible implementation, separately matching the at least one running parameter value corresponding to each health degree influencing factor to the health degree evaluation model, to obtain the health degree of the to-be-evaluated memory may include: separately matching the at least one running parameter value corresponding to each health degree influencing factor to a first submodel of the corresponding health degree influencing factor in the health degree evaluation model, to obtain a health degree impairment value corresponding to each health degree influencing factor, where the health degree evaluation model includes a second submodel and a first submodel that corresponds to each health degree influencing factor, a first submodel of one health degree influencing factor is a relationship between a health degree impairment value corresponding to the health degree influencing factor and a running parameter and failure rate parameter corresponding to the health degree influencing factor, and the second submodel is a relationship in which the health degree of the to-be-evaluated memory changes with the health degree impairment value corresponding to each health degree influencing factor and a relationship in which the health degree of the to-be-evaluated memory changes with a weight corresponding to each health degree influencing factor; and obtaining the health degree of the to-be-evaluated memory based on the health degree impairment value corresponding to each health degree influencing factor, the weight corresponding to each health degree influencing factor, and the second submodel.

It should be noted that the memory evaluation apparatus provided in this application can obtain, based on the first submodel corresponding to each health degree influencing factor in the health degree evaluation model, the health degree impairment value that is of the to-be-evaluated memory and that corresponds to each health degree influencing factor, to indicate impact of each health degree influencing factor on the health degree of the to-be-evaluated memory. In addition, the health degree impairment value corresponding to each health degree influencing factor and the weight corresponding to each health degree influencing factor are separately matched to the second submodel to obtain the health degree of the to-be-evaluated memory affected by health degree influencing factors corresponding to different weights (different weights). In this way, different health degree evaluation models can be generated for different to-be-evaluated memories. This helps increase accuracy of the health degree of the to-be-evaluated memory obtained based on the health degree evaluation model.

In a possible implementation, the at least one health degree influencing factor includes one or more of the following: a memory running temperature factor, a memory service load factor, a total memory running duration factor, a memory swap factor, a memory correctable error (CE) frequency factor, a memory uncorrectable error UCE frequency factor, and a memory performance attenuation factor.

A plurality of health degree influencing factors are preset in the health degree evaluation model provided in this application, so that the user can select corresponding health degree influencing factors for different to-be-evaluated memories. In this way, a health degree evaluation factor for the to-be-evaluated memory in the health degree evaluation model is more proper for the to-be-evaluated memory. This helps to accurately evaluate the health degree of the to-be-evaluated memory.

In a possible implementation, a running parameter corresponding to the memory running temperature factor is a running temperature of the to-be-evaluated memory; a running parameter corresponding to the memory service load factor is a quantity of charging/discharging times of the to-be-evaluated memory; a running parameter corresponding to the total memory running duration factor is total running duration of the to-be-evaluated memory; a running parameter corresponding to the memory swap factor is a quantity of swap times of the to-be-evaluated memory; a running parameter corresponding to the memory CE frequency factor is a quantity of CEs of the to-be-evaluated memory and/or a CE frequency of the to-be-evaluated memory; a running parameter corresponding to the memory UCE frequency factor is a quantity of UCEs of the to-be-evaluated memory and/or a UCE frequency of the to-be-evaluated memory; and a running parameter corresponding to the memory performance attenuation factor is a performance value attenuation magnitude of the to-be-evaluated memory.

It should be noted that the memory evaluation apparatus provided in this application can store data that describes a relationship between a running parameter and a failure rate parameter that correspond to each health degree influencing factor, for example, a curve that describes how a failure rate parameter of the to-be-evaluated memory changes with a corresponding running parameter. The curve that describes how a failure rate parameter of the to-be-evaluated memory changes with a corresponding running parameter is data pre-obtained through statistics collection. In this way, the memory evaluation apparatus can evaluate, based on existing data obtained through statistics collection, the health degree of the to-be-evaluated memory that is not yet faulty.

In a possible implementation, each of the at least one health degree influencing factor included in the health degree evaluation model corresponds to one algorithm, where the algorithm may be addition and/or multiplication. The "obtaining the health degree of the to-be-evaluated memory based on the health degree impairment value corresponding to each health degree influencing factor, the weight corresponding to each health degree influencing factor, and the second submodel" may include: obtaining the health degree of the to-be-evaluated memory based on the health degree impairment value corresponding to each health degree influencing factor, the weight corresponding to each health degree influencing factor, the second submodel, and the algorithm corresponding to each health degree influencing factor.

For one memory in the memory evaluation apparatus, that is, one memory in the server, while quantizing impact of each health degree influencing factor of the memory on a health degree of the memory based on a weight corresponding to the health degree influencing factor, the memory evaluation apparatus can further quantize an extent to which each health degree influencing factor affects the health degree of the memory, based on an algorithm corresponding to the health degree influencing factor. This helps increase accuracy of the health degree of the to-be-evaluated memory.

In a possible implementation, the outputting health degree indication information of the to-be-evaluated memory based on the health degree of the to-be-evaluated memory may include: outputting first health degree indication information when a value of the health degree of the to-be-evaluated memory is within a first preset value range, where the first health degree indication information is used to indicate, to the user, that the to-be-evaluated memory does not need to be replaced; outputting second health degree indication information when a value of the health degree of the to-be-evaluated memory is within a second preset value range, where the second health degree indication information is used to indicate, to the user, that the to-be-evaluated memory is replaceable; or outputting third health degree indication information when a value of the health degree of the to-be-evaluated memory is within a third preset value range, where the third health degree indication information is used to indicate, to the user, that the to-be-evaluated memory needs to be replaced.

It should be noted that in the memory evaluation method provided in this application, in a process of displaying the health degree indication information of the to-be-evaluated memory to the user, the memory evaluation apparatus may display different health degree indication information for to-be-evaluated memories with different health degree values. In this way, when the to-be-evaluated memory is not faulty and the health degree of the memory is relatively low (the value of the health degree is relatively small), the memory evaluation apparatus can prompt the user to replace the to-be-evaluated memory, so that the to-be-evaluated memory supports normal operations of the server.

In a possible implementation, the determining a health degree evaluation model of a to-be-evaluated memory includes: receiving the at least one health degree influencing factor that is set by the user; determining the at least one health degree influencing factor that is set by the user, as a health degree influencing factor included in the health degree evaluation model of the to-be-evaluated memory; determining a corresponding first submodel based on the at least one health degree influencing factor; receiving the weight and the algorithm that correspond to each of the at least one health degree influencing factor that is set by the user; and determining the second submodel based on the weight and the algorithm that correspond to each health degree influencing factor.

It should be noted that, different to-be-evaluated memories may have different health degree influencing factors, and data about how failure rate parameters corresponding to health degree influencing factors of different to-be-evaluated memories change with corresponding running parameters may be different. Therefore, health degree evaluation models corresponding to different to-be-evaluated memories may be different. In the memory evaluation method provided in this embodiment of the present application, the memory evaluation apparatus can determine first submodels corresponding to health degree influencing factors for different to-be-evaluated memories and second submodels for the to-be-evaluated memories, that is, determine health degree evaluation models for different to-be-evaluated memories. In this way, the health degree evaluation model provided in this embodiment of the present application can be proper for the to-be-evaluated memory. This helps to increase accuracy of the health degree, of the to-be-evaluated memory, obtained based on the health degree evaluation model.

In a possible implementation, before the health degree indication information of the to-be-evaluated memory is generated based on the health degree of the to-be-evaluated memory, the memory evaluation method provided in this application further includes: receiving the first preset value range, the second preset value range, and the third preset value range that are set by the user.

It should be noted that, according to the memory evaluation method provided in this application, the user can set different preset value ranges for different to-be-evaluated memories, so that the health degree indication information that is of the to-be-evaluated memory and that is obtained by the memory evaluation apparatus based on the preset value range is more proper for the to-be-evaluated memory. This helps to more accurately indicate, to the user, whether the to-be-evaluated memory needs to be replaced.

In a possible implementation, after the running parameter value corresponding to each health degree influencing factor is separately input to the health degree evaluation model, to obtain the health degree of the to-be-evaluated memory, the memory evaluation method provided in this application further includes: receiving template data that is of the to-be-evaluated memory and that is updated by the user, where the template data includes at least one or more of the following: the at least one health degree influencing factor, the running parameter corresponding to each of the at least one health degree influencing factor, the weight corresponding to each health degree influencing factor, the algorithm corresponding to each health degree influencing factor, the first preset value range, the second preset value range, and the third preset value range; and updating the health degree evaluation model based on the updated template data of the to-be-evaluated memory.

Because the user can update the health degree evaluation model of the to-be-evaluated memory, so that the health degree evaluation model is more proper for the to-be-evaluated memory, the health degree that is of the to-be-evaluated memory and that is obtained by the memory evaluation apparatus based on the updated health degree evaluation model is more accurate for the to-be-evaluated memory. This helps to more accurately indicate, to the user, whether the to-be-evaluated memory needs to be replaced.

According to a second aspect, this application provides a memory evaluation apparatus. The apparatus includes a determining module, an obtaining module, a matching module, and an output module. The determining module is configured to determine a health degree evaluation model of a to-be-evaluated memory. The health degree evaluation model is a relationship in which a health degree of the to-be-evaluated memory changes with at least one health degree influencing factor of the to-be-evaluated memory, one health degree influencing factor corresponds to one running parameter and one failure rate parameter, and one health degree influencing factor corresponds to one weight, where the weight is a constant. The obtaining module is configured to obtain at least one running parameter value that corresponds to each of the at least one health degree influencing factor determined by the determining module, where the at least one running parameter value corresponds to one running parameter. The matching module is configured to separately match, to the health degree evaluation model, the at least one running parameter value that corresponds to each health degree influencing factor and that is obtained by the obtaining module, to obtain the health degree of the to-be-evaluated memory. The output module is configured to output health degree indication information of the to-be-evaluated memory based on the health degree that is of the to-be-evaluated memory and that is obtained by the matching module, where the health degree indication information of the to-be-evaluated memory is used to indicate, to a user, whether the to-be-evaluated memory needs to be replaced.

In a possible implementation, the matching module is further configured to: separately match the at least one running parameter value corresponding to each health degree influencing factor to a first submodel of the corresponding health degree influencing factor in the health degree evaluation model, to obtain a health degree impairment value corresponding to each health degree influencing factor, where the health degree evaluation model includes a second submodel and a first submodel that corresponds to each health degree influencing factor, a first submodel of one health degree influencing factor is a relationship between a health degree impairment value corresponding to the health degree influencing factor and a running parameter and failure rate parameter corresponding to the health degree influencing factor, and the second submodel is a relationship in which the health degree of the to-be-evaluated memory changes with the health degree impairment value corresponding to each health degree influencing factor and a relationship in which the health degree of the to-be-evaluated memory changes with a weight corresponding to each health degree influencing factor; and obtain the health degree of the to-be-evaluated memory based on the health degree impairment value corresponding to each health degree influencing factor, the weight corresponding to each health degree influencing factor, and the second submodel.

In a possible implementation, the at least one health degree influencing factor includes one or more of the following: a memory running temperature factor, a memory service load factor, a total memory running duration factor, a memory swap factor, a memory correctable error CE frequency factor, a memory uncorrectable error UCE frequency factor, and a memory performance attenuation factor.

In a possible implementation, a running parameter corresponding to the memory running temperature factor is a running temperature of the to-be-evaluated memory; a running parameter corresponding to the memory service load factor is a quantity of charging/discharging times of the to-be-evaluated memory; a running parameter corresponding to the total memory running duration factor is total running duration of the to-be-evaluated memory; a running parameter corresponding to the memory swap factor is a quantity of swap times of the to-be-evaluated memory; a running parameter corresponding to the memory CE frequency factor is a quantity of CEs of the to-be-evaluated memory and/or a CE frequency of the to-be-evaluated memory; a running parameter corresponding to the memory UCE frequency factor is a quantity of UCEs of the to-be-evaluated memory and/or a UCE frequency of the to-be-evaluated memory; and a running parameter corresponding to the memory performance attenuation factor is a performance value attenuation magnitude of the to-be-evaluated memory.

In a possible implementation, each of the at least one health degree influencing factor included in the health degree evaluation model corresponds to one algorithm, where the algorithm may be addition and/or multiplication. The matching module is further configured to obtain the health degree of the to-be-evaluated memory based on the health degree impairment value corresponding to each health degree influencing factor, the weight corresponding to each health degree influencing factor, the second submodel, and the algorithm corresponding to each health degree influencing factor.

In a possible implementation, the output module is further configured to: output first health degree indication information when a value of the health degree of the to-be-evaluated memory is within a first preset value range, where the first health degree indication information is used to indicate, to the user, that the to-be-evaluated memory does not need to be replaced; output second health degree indication information when a value of the health degree of the to-be-evaluated memory is within a second preset value range, where the second health degree indication information is used to indicate, to the user, that the to-be-evaluated memory is replaceable; or output third health degree indication information when a value of the health degree of the to-be-evaluated memory is within a third preset value range, where the third health degree indication information is used to indicate, to the user, that the to-be-evaluated memory needs to be replaced.

In a possible implementation, the determining module includes a receiving submodule and a determining submodule. The receiving submodule is configured to receive the at least one health degree influencing factor that is set by the user. The determining submodule is configured to: determine the at least one health degree influencing factor that is set by the user and that is received by the receiving submodule, as a health degree influencing factor included in the health degree evaluation model of the to-be-evaluated memory; and determine a corresponding first submodel based on the at least one health degree influencing factor. The receiving submodule is further configured to receive the weight and the algorithm that correspond to each of the at least one health degree influencing factor that is set by the user. The determining submodule is further configured to determine the second submodel based on the weight and the algorithm that correspond to each health degree influencing factor and that are received by the receiving submodule.

In a possible implementation, the receiving submodule is further configured to receive the at least one health degree influencing factor that is set by the user and the running parameter and the failure rate parameter that correspond to each health degree influencing factor.

In a possible implementation, the receiving submodule is further configured to: before the health degree indication information of the to-be-evaluated memory is generated based on the health degree of the to-be-evaluated memory, receive the first preset value range, the second preset value range, and the third preset value range that are set by the user.

In a possible implementation, the receiving submodule is further configured to: after the matching module separately matches the running parameter value corresponding to each health degree influencing factor to the health degree evaluation model, to obtain the health degree of the to-be-evaluated memory, receive template data that is of the to-be-evaluated memory and that is updated by the user, where the template data includes at least one or more of the following: the at least one health degree influencing factor, the running parameter corresponding to each of the at least one health degree influencing factor, the weight corresponding to each health degree influencing factor, the algorithm corresponding to each health degree influencing factor, the first preset value range, the second preset value range, and the third preset value range. The determining submodule is further configured to update the health degree evaluation model based on the updated template data that is of the to-be-evaluated memory and that is obtained by the receiving submodule.

According to a third aspect, this application provides a memory evaluation apparatus. The apparatus includes a processor, a hard disk, at least one memory, a communications interface, an input device, a display, and a bus. The hard disk and the at least one memory are configured to store at least one instruction. The processor, the hard disk, the at least one memory, the communications interface, the input device, and the display are connected by using the bus. When the memory evaluation apparatus runs, the processor executes the at least one instruction stored in the hard disk and the at least one memory, so that the memory evaluation apparatus performs the memory evaluation method according to any one of the first aspect or the implementations of the first aspect.

According to a fourth aspect, this application provides a computer storage medium. The computer storage medium includes at least one instruction, and when the at least one instruction is run on a computer, the computer is enabled to perform the memory evaluation method according to any one of the first aspect or the implementations of the first aspect.

According to a fifth aspect, this application provides a computer program product. The computer program product includes at least one instruction, and when the at least one instruction is run on a computer, the computer is enabled to perform the memory evaluation method according to any one of the first aspect or the implementations of the first aspect.

BRIEF DESCRIPTION OF DRAWINGS

To describe technical solutions in embodiments of this application or in the background more clearly, the following describes the accompanying drawings for describing the embodiments of this application or the background.

FIG. 3 is a schematic diagram of a management controller (MC) interface according to an embodiment of the present application;

FIG. 9A and FIG. 9B are schematic diagrams of another MC interface according to an embodiment of the present application;

FIG. 27 is a schematic diagram of another MC interface according to an embodiment of the present application;

FIG. 28 is a schematic diagram of another MC interface according to an embodiment of the present application;

FIG. 30 is a schematic diagram of another MC interface according to an embodiment of the present application;

DESCRIPTION OF EMBODIMENTS

Figure 1:
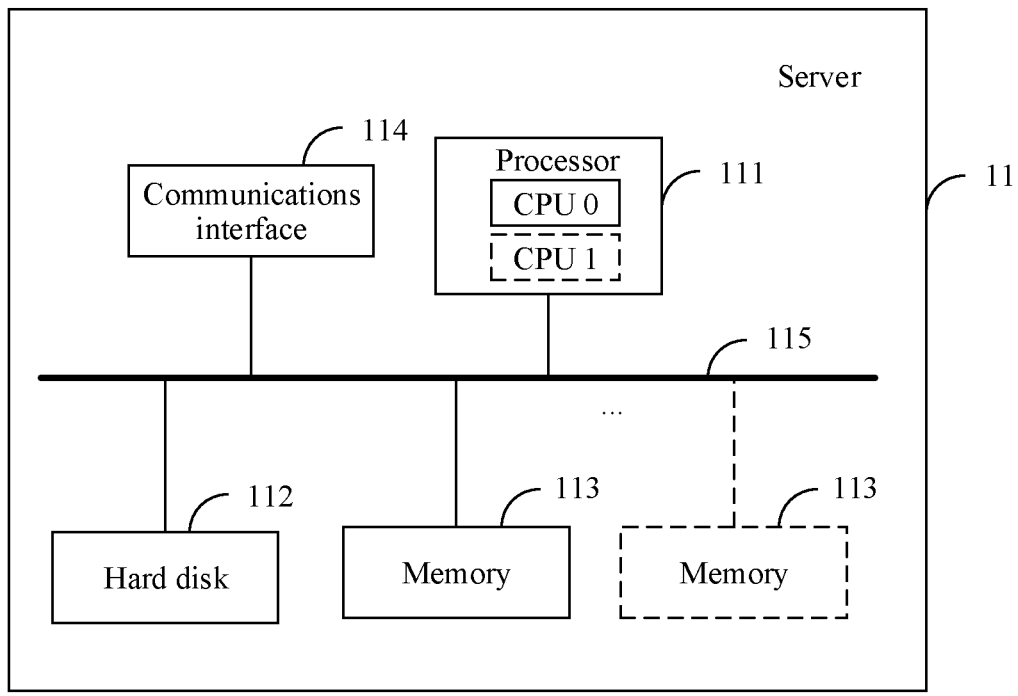
FIG. 1 is a schematic diagram of a hardware structure of a server according to an embodiment of the present application.

Embodiments of the present application provide a memory evaluation method and apparatus, to evaluate a health degree of a memory in a server, and to prompt a user to replace the memory when the memory is not faulty and has a relatively low health degree, so that the memory can support normal operations of the server.

It should be noted that the memory evaluation method provided in the embodiments of the present application is applied to a server, where the server is a device configured to provide a computing service. For example, the server provided in the embodiments of the present application may be an x86 server. An x86 server is a server that uses a complex instruction set computer (CISC) architecture. Certainly, the server provided in the embodiments of the present application may alternatively be a non-x86 server. This is not limited in solutions provided in this application. In the embodiments of the present application, the following uses only the x86 server as an example to describe the memory evaluation method provided in the embodiments of the present application.

A server such as the x86 server includes a hardware system and a software system. The hardware system may include components such as a processor, a communications interface, a system bus, a hard disk, and a memory. The software system may include an operating system and a management system. The management system may be implemented by management software, for example, a management controller (MC). It should be noted that the MC in the server may be configured to monitor and manage running data and inherent parameters of components in the server, for example, running data of a memory in the server and an inherent parameter of the memory. The running data of the memory may include data such as a running temperature and running duration of the memory. It should be noted that, in the following embodiments of the present application, "running data of a memory" may be referred to as "a running parameter value of a memory" or "a running parameter of a memory". Different names are merely used for ease of description, and do not limit the running data of the memory.

In addition, the inherent parameter of the memory may include a vendor of the memory, a capacity of the memory, a dominant frequency of the memory, a serial number of the memory, a minimum voltage of the memory, a quantity of ranks of the memory, a bit width of the memory, a technology used for the memory, and the like. For example, the capacity of the memory may be 32768 megabytes (MB). The dominant frequency may be 2400 MHz (MHz). The serial number is used to uniquely identify one memory, for example, the serial number is 0x27EACEEA. The minimum voltage may be 1200 millivolts (mV). The quantity of ranks may be one rank (rank), two ranks, or the like. The bit width may be 64 bits (bit), 72 bits, or the like. The used technology may be "Synchronous|Registered (Buffered)".

The health degree of the memory provided in the embodiments of the present application can reflect a possibility of a memory failure. A higher health degree of the memory indicates a lower possibility of a memory failure (that is, a lower memory failure rate), and usually indicates that the memory can run normally and does not need to be replaced. A lower health degree of the memory indicates a higher possibility of a memory failure (that is, a higher memory failure rate), and usually indicates that the memory cannot run normally and needs to be replaced. According to the memory evaluation method provided in the embodiments of the present application, whether to replace the memory may be determined based on the health degree of the memory before the memory is faulty.

The following describes the technical solutions in the embodiments of the present application in detail with reference to the accompanying drawings in the embodiments of the present application.

For example, FIG. 1 is a schematic diagram of a hardware structure of a server according to an embodiment of the present application. The server 11 shown in FIG. 1 may include a processor 111, a hard disk 112, at least one memory 113, a communications interface 114, and a bus 115.

Specifically, the following further describes constituent parts of the server with reference to FIG. 1.

The processor 111 is a control center of the server, and may be one processor or may be a collective term of a plurality of processing elements. For example, the processor 111 may be a central processing unit (CPU), or an application-specific integrated circuit (ASIC), or may be configured as one or more integrated circuits implementing this embodiment of the present application, for example, one or more microprocessors (DSP) or one or more field programmable gate arrays (FPGA). For example, the processor 111 may monitor running data of the memory in the server 11 by using an MC.

In specific implementation, in an embodiment, the processor 111 may include one or more CPUs, for example, a CPU 0 and a CPU 1 shown in FIG. 1. Certainly, in specific implementation, in an embodiment, the server may include a plurality of processors. Each of the processors may be a single-core (single-CPU) processor, or may be a multi-core (multi-CPU) processor. The processor herein may be one or more devices, circuits, and/or processing cores configured to process data (for example, a computer program instruction).

The hard disk 112 is an external storage of the server, also referred to as an external storage, and is configured to store a large amount of permanent data. Even if the server is powered off, the data is not lost. For example, the hard disk 112 may store a system log in a process in which the running data of the memory is monitored by using the MC. Specifically, the hard disk may be implemented by a read-only memory (ROM). In specific implementation, in an embodiment, the hard disk may be a solid-state drive (SSD), a hard disk drive (HDD), or the like.

Certainly, in addition to the hard disk, the external storage of the server may alternatively be a compact disc read-only memory (CD-ROM) or another compact disc storage, or an optical disc storage (including a compact disc, a laser disc, an optical disc, a digital versatile disc, a Blu-ray disc, and the like). This is not described in detail in this embodiment of the present application.

In this embodiment of the present application, only one of the at least one memory 113 is used as an example to describe the memory.

The memory 113 is an internal memory that directly exchanges data with the processor, and is also referred to as a main memory. The memory 113 may be random-access memory (RAM). The memory 113 is configured to temporarily store operational data in the processor and data exchanged with an external storage such as the hard disk, and all programs in the server are run in the memory. Specifically, the processor 111 may perform functions of the server by running or executing software or a program stored in the at least one memory 113 and by invoking data stored in the hard disk 112 and/or the at least one memory 113. For example, the memory 113 may store a program that is used by the processor 111 to monitor the running data of the memory in the server 11.

In an embodiment, the memory 113 may be a RAM such as a static RAM (SRAM) or a dynamic RAM (DRAM). The memory provided in this embodiment of the present application may be a swappable memory module in the server. In an embodiment, the memory 113 may be implemented by a dual in-line memory module (DIMM), or a double data rate synchronous dynamic RAM (DDR SDRAM) that is also referred to as DDR.

It should be noted that the inherent parameter of the memory may further include a memory type. For example, memory types may include types such as DDR, DDR2, DDR3, and DDR4. In addition, each memory in the server may further have a name, for example, DIMM000, DIMM011, or the like.

The communications interface 114 may be configured to interact with an external device. For example, the communications interface 114 may include two communications interfaces: a sending interface configured to send data to the external device and a receiving interface configured to receive data from the external device. To be specific, a sending device may respectively receive and send data through the two different communications interfaces. For example, the data stored in the hard disk 112 and the at least one memory 113 may be sent through one communications interface of the server 11 to the external device. In an embodiment, the communications interface 114 may integrate a data receiving function and a data sending function into one communications interface, and the communications interface has both the data receiving function and the data sending function. For example, the communications interface 114 may be an MC interface.

The processor 111, the hard disk 112, the at least one memory 113, and the communications interface 114 may be connected by using the bus 115. The bus 115 may be a Peripheral Component Interconnect (PCI) bus, an Extended Industry Standard Architecture (EISA) bus, or the like. The bus 115 may be classified into an address bus, a data bus, a control bus, and the like. For ease of representation, only one thick line is used to represent the bus in FIG. 1, but this does not mean that there is only one bus or only one type of bus.

For example, with reference to the server 11 shown in FIG. 2, one memory 113 may be installed below each CPU in the processor 111 in the server 11.

The hardware structure of the server shown in FIG. 1 does not constitute a limitation on the server. The server may include more or fewer components than those shown in the figure, or combine some components, or have a different component arrangement. For example, the server 11 further includes components such as one or more temperature sensors. The one or more temperature sensors may be configured to detect temperatures of some components in the server, for example, a temperature of a CPU and a temperature of each memory.

It should be noted that, while the running data of the at least one memory 113 is being detected by using the MC in the server 11, the MC may be managed in a human-computer interaction manner, so that a user can intuitively observe or manage the data obtained by the MC, for example, the running data and the inherent parameter of the at least one memory 113. In an embodiment, an input device and a display may be connected to the server 11, to implement human-computer interaction.

Figure 2A:
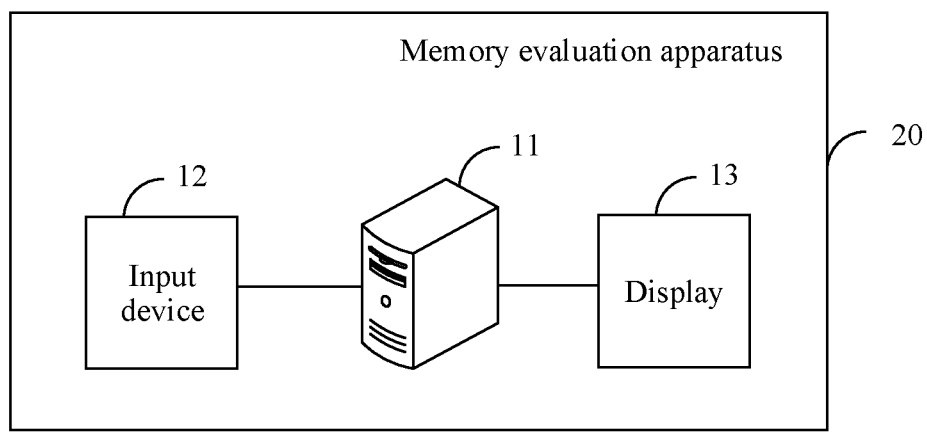
FIG. 2A is a schematic architectural diagram of a memory evaluation apparatus according to an embodiment of the present application.

For example, FIG. 2A is a schematic architectural diagram of a memory evaluation apparatus according to an embodiment of the present application. The memory evaluation apparatus 20 shown in FIG. 2A includes a server 11, an input device 12, and a display 13. In FIG. 2, only a straight line is used to represent a connection relationship between the server 11, the input device 12, and the display 13. A connection between the server 11, the input device 12, and the display 13 may be a wired connection or a wireless connection. This is not limited in this embodiment of the present application.

Optionally, the input device 12 and the display 13 may be provided with a service by the server 11, and a service in the server 11 may be implemented by the processor 111 in combination with the input device 12 and the display 13. The memory evaluation apparatus 20 may be implemented by a terminal device such as a desktop computer. In this case, the server 11 is referred to as a host, and the input device 12 may be an apparatus such as a keyboard or a mouse. For example, the memory evaluation apparatus 20 including the server 11, the input device 12, and the display 13 may belong to a same desktop computer that is denoted as a terminal device 1.

Optionally, the input device 12 and the display 13 are not provided with a service by the server 11, but are provided with a service by another server. For example, the server 11 provides a service for the terminal device 1, whereas the input device 12 and the display 13 belong to a terminal device 2. The terminal device 2 may be another desktop computer.

In addition, in an embodiment, the terminal device 2 may be a terminal device that has a touchscreen. The terminal device may be a terminal device such as a mobile phone, a tablet computer, a notebook computer, an ultra-mobile personal computer (UMPC), a netbook, or a personal digital assistant (PDA). In this case, the input device 12 and the display 13 may be implemented by the touchscreen of the terminal device 2.

A specific composition manner of the server 11, the input device 12, and the display 13 that are included in the memory evaluation apparatus provided in this embodiment of the present application is not limited. The following describes the memory evaluation method provided in the embodiments of the present application by using only an example in which the server 11, the input device 12, and the display 13 that are included in the memory evaluation apparatus provided in this embodiment of the present application are provided by a same terminal device.

Figure 2B:
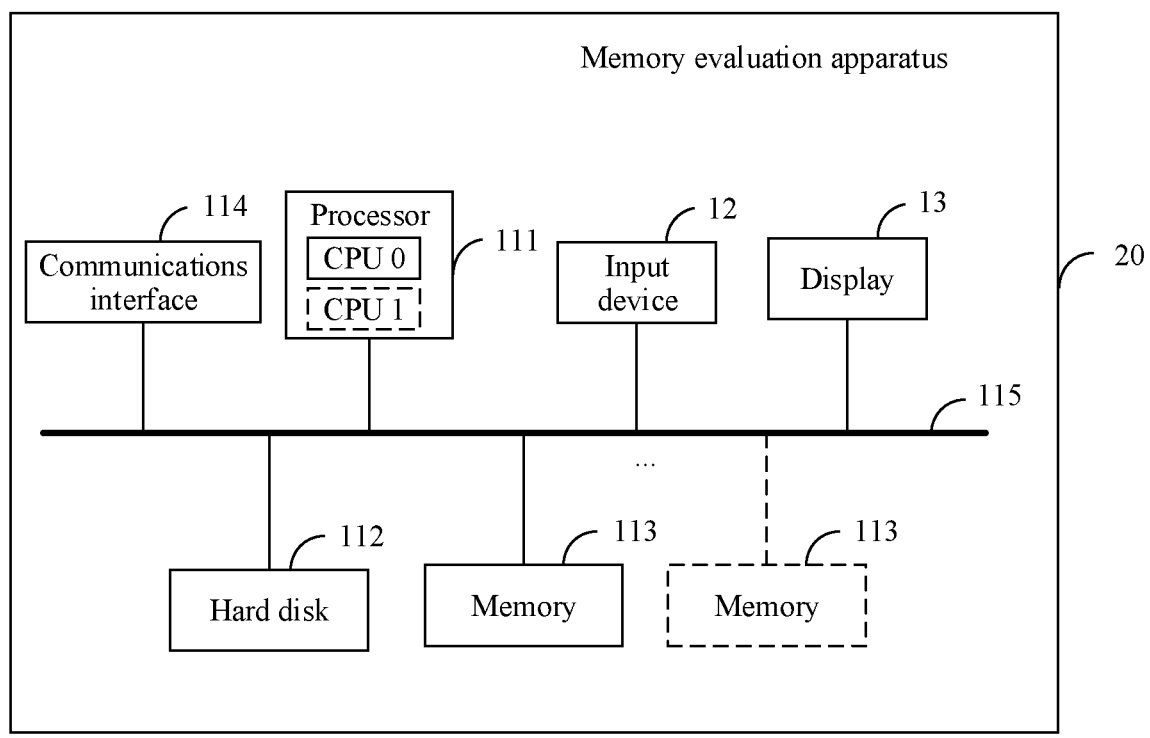
FIG. 2B2B is another schematic structural diagram of a memory evaluation apparatus according to an embodiment of the present application.

Specifically, with reference to the memory evaluation apparatus 20 shown in FIG. 2A and the server 11 shown in FIG. 1, FIG. 2B is another schematic structural diagram of a memory evaluation apparatus according to an embodiment of the present application. In FIG. 2B, the memory evaluation apparatus 20 includes a processor 111, a hard disk 112, at least one memory 113, a communications interface 114, a bus 115, an input device 12, and a display 13.

It should be noted that, according to the memory evaluation method provided in the embodiments of the present application, a human-computer interaction interface of an MC may be displayed by using the display 13, and the human-computer interaction interface of the MC may be a DOS interface or a browser interface. In the embodiments of the present application, the following describes the memory evaluation method provided in the embodiments of the present application by using only an example in which the human-computer interaction interface of the MC is the browser interface. One MC may correspond to one login address, for example, a uniform resource locator (URL). In this case, the input device 12 may receive the login address that is of the MC and that is entered by a user, and the display 13 may display the human-computer interaction interface (hereinafter referred to as an MC interface) of the MC by using the browser interface. In the embodiments of the present application, the following describes the memory evaluation method provided in the embodiments of the present application by using only an example in which the display displays the MC interface after the user already enters the login address of the MC by using the input device.

Specifically, the MC interface displayed on the display may be a graphical user interface (GUI). In addition, the GUI includes a graphic option in a text form and a graphic option in an icon form. In the GUI, both the graphic option in the text form and the graphic option in the icon form may be operated by the user by using a mouse, a keyboard, a touchscreen, or another input device.

The GUI includes a window, a drop-down list, a dialog box, and a corresponding control mechanism (for example, a CPU of the server) of the GUI. In addition, the GUI is standardized in various types of new application programs or new software, to be specific, a same operation is always completed in a same manner. For example, a tap/click operation performed on any graphic option (hereinafter referred to as an option) in a text form or an icon form in the GUI may be clicking the option by the user by using the mouse, or tapping the option on the touchscreen by the user by using a finger. After the user performs a tap/click operation on one option, the processor may generate a corresponding tap/click operation instruction, and respond to the tap/click operation.

For example, FIG. 3 is a schematic diagram of an MC interface according to an embodiment of the present application. The MC interface 30 in FIG. 3 separately shows inherent parameters of six memories named DIMM000, DIMM001, DIMM002, DIMM010, DIMM011, and DIMM012. The MC interface shown in FIG. 3 includes options such as "name ▼", "vendor ▼", "capacity ▼", "dominant frequency ▼", and "serial number ▼". "▼" included in each option corresponds to one drop-down list. For example, a user may perform a tap/click operation on an option 31 by using an input device, that is, a "▼" option in the "vendor ▼" option. After generating a corresponding tap/click operation instruction, a processor in a memory evaluation apparatus instructs a display to display a drop-down list 311 corresponding to "vendor ▼" shown in FIG. 3, where the drop-down list 311 includes three options: "vendor A", "vendor B", and "vendor C". If the user performs a tap/click operation on "vendor A" in the drop-down list 311, the processor in the memory evaluation apparatus may generate a corresponding tap/click operation instruction, and instruct the display to display, in the MC interface shown in FIG. 3, only an inherent parameter of a memory whose vendor is the vendor A.

Figure 4:
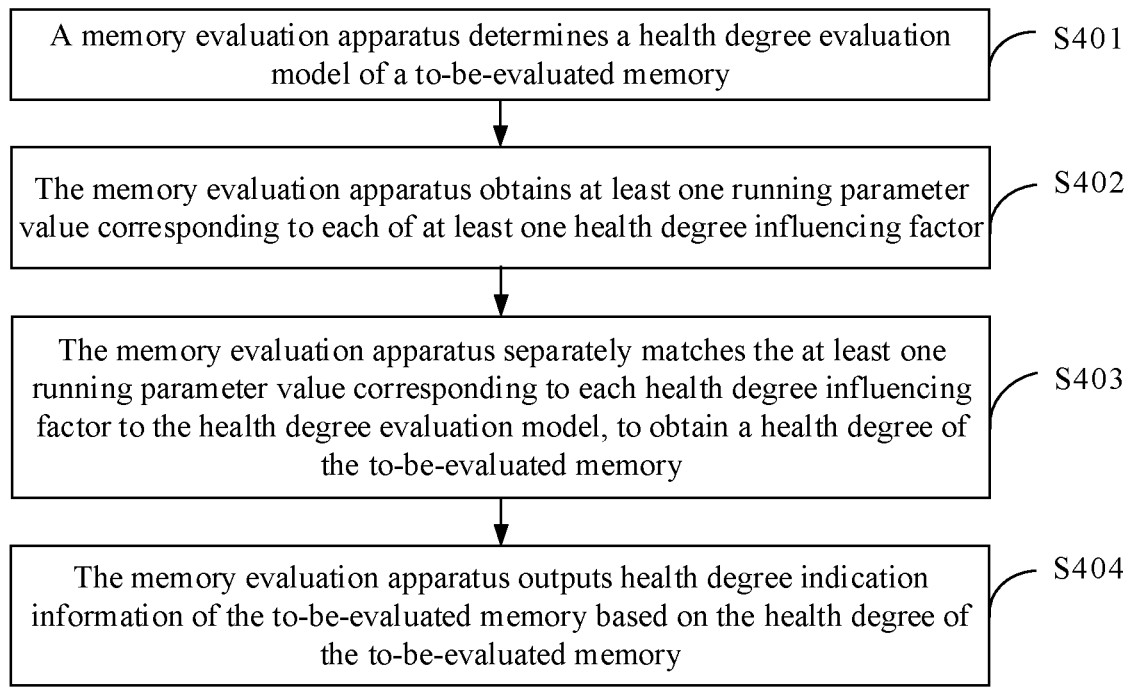
FIG. 4 is a schematic flowchart of a memory evaluation method according to an embodiment of the present application.

To make the objectives, technical solutions, and advantages of the embodiments of the present application clearer, the following describes in detail the memory evaluation method provided in the embodiments of the present application, with reference to specific components in the memory evaluation apparatus shown in FIG. 2B and by using a flowchart of a memory evaluation method shown in FIG. 4. In addition, although a logical sequence of the memory evaluation method provided in this embodiment of the present application is shown in the method flowchart, in some cases, the shown or described steps may be performed in a sequence different from the sequence herein.

S401: A memory evaluation apparatus determines a health degree evaluation model of a to-be-evaluated memory.

For example, step 401 may be performed by the processor 111 in the memory evaluation apparatus 20 shown in FIG. 2B.

The to-be-evaluated memory is one of at least one memory in a server, that is, one memory in the memory evaluation apparatus. The health degree evaluation model of the to-be-evaluated memory is used to evaluate a health degree of the to-be-evaluated memory, and the health degree of the to-be-evaluated memory can reflect a possibility of a failure of the to-be-evaluated memory, that is, a memory failure rate of the to-be-evaluated memory.

Specifically, the health degree evaluation model is a relationship in which the health degree of the to-be-evaluated memory changes with at least one health degree influencing factor of the to-be-evaluated memory, one health degree influencing factor corresponds to one running parameter and one failure rate parameter, and one health degree influencing factor corresponds to one weight, where the weight is a constant. For one health degree influencing factor, a value of a failure rate parameter of the memory (that is, a memory failure rate) changes with a value of a corresponding running parameter (that is, running data).

It should be noted that a health degree influencing factor corresponding to one memory may affect normal operations of the memory, and may cause a failure of the memory, that is, cause the memory to fail. For one health degree influencing factor corresponding to one memory (for example, the to-be-evaluated memory), the memory evaluation apparatus stores data that describes a relationship between a corresponding running parameter and a corresponding failure rate parameter, for example, a curve that describes the relationship between the failure rate parameter and the running parameter.

For one health degree influencing factor of the to-be-evaluated memory, data that is stored in the memory evaluation apparatus and that describes a relationship between a corresponding running parameter and a corresponding failure rate parameter may be obtained by a person skilled in the art through training based on a large amount of data (for example, a large amount of running data of a memory related to the to-be-evaluated memory), or may be obtained based on related documents in the art.

In addition, the weight corresponding to one health degree influencing factor can indicate an extent to which the health degree influencing factor affects the health degree of the to-be-evaluated memory, and health degree influencing factors corresponding to different weights have different impact on the health degree of the to-be-evaluated memory. For example, a larger weight corresponding to a health degree influencing factor indicates greater impact of the health degree influencing factor on the health degree of the to-be-evaluated memory. In this way, a weight corresponding to each health degree influencing factor in the health degree evaluation model provided in this embodiment of the present application can indicate impact of each health degree influencing factor on the health degree of the to-be-evaluated memory, so that impact extents of different health degree evaluation factors for the to-be-evaluated memory in the health degree evaluation model are more proper for the to-be-evaluated memory. This helps to accurately evaluate the health degree of the to-be-evaluated memory.

The weight corresponding to each health degree influencing factor in the health degree evaluation model of the to-be-evaluated memory may be preset by a person skilled in the art. In an embodiment, the weight corresponding to each health degree influencing factor may alternatively be independently set by a user based on experience or related statistics of the to-be-evaluated memory. Usually, a person skilled in the art may set different weights for all health degree influencing factors in the health degree evaluation model of the to-be-evaluated memory. For example, the to-be-evaluated memory corresponds to two health degree influencing factors, a weight corresponding to one of the two health degree influencing factors is 60%, and a weight corresponding to the other health degree influencing factor is 40%. A sum of the weights corresponding to all of the at least one health degree influencing factor is equal to 1.

Optionally, a person skilled in the art may set a same weight for all health degree influencing factors in the health degree evaluation model of the to-be-evaluated memory, or a person skilled in the art may not set a weight for any health degree influencing factor. In other words, all the health degree influencing factors have same impact on the health degree of the to-be-evaluated memory.

S402: The memory evaluation apparatus obtains at least one running parameter value corresponding to each of the at least one health degree influencing factor.

For example, step 402 may be performed by the processor 111 in the memory evaluation apparatus 20 shown in FIG. 2B.

For one health degree influencing factor corresponding to the to-be-evaluated memory, a running parameter included in the health degree evaluation model corresponds to at least one running parameter value. Therefore, for the one health degree influencing factor corresponding to the to-be-evaluated memory, the memory evaluation apparatus may obtain the at least one running parameter value based on the corresponding running parameter. For example, for the to-be-evaluated memory, the memory evaluation apparatus may obtain total running duration, of the to-be-evaluated memory, corresponding to a health degree influencing factor that is total memory running duration.

It may be figured out that before the processor in the memory evaluation apparatus obtains the total running duration of the to-be-evaluated memory, the total running duration of the to-be-evaluated memory may be stored in a hard disk of the memory evaluation apparatus, and may be updated by the processor in the memory evaluation apparatus.

S403: The memory evaluation apparatus separately matches the at least one running parameter value corresponding to each health degree influencing factor to the health degree evaluation model to obtain the health degree of the to-be-evaluated memory.

It should be noted that, when the health degree evaluation model is the relationship in which the health degree of the to-be-evaluated memory changes with the at least one health degree influencing factor of the to-be-evaluated memory, the memory evaluation apparatus may match, with the corresponding running parameter in the health degree evaluation model, the at least one running parameter value that corresponds to the health degree influencing factor and that is obtained by a memory evaluation model. In this way, the memory evaluation apparatus can obtain the health degree of the to-be-evaluated memory by using the health degree evaluation model of the to-be-evaluated memory.

For example, the health degree of the to-be-evaluated memory may be represented by a value in a range from 0 to 100, for example, 80. A larger value of the health degree of the to-be-evaluated memory indicates a higher health degree of the to-be-evaluated memory. A smaller value of the health degree of the to-be-evaluated memory indicates a lower health degree of the to-be-evaluated memory.

S404: The memory evaluation apparatus outputs health degree indication information of the to-be-evaluated memory based on the health degree of the to-be-evaluated memory.

For example, in step 402, the processor 111 in the memory evaluation apparatus 20 shown in FIG. 2B may generate the health degree indication information of the to-be-evaluated memory, and instruct the display 13 in the memory evaluation apparatus 20 to output the health degree indication information of the to-be-evaluated memory.

The health degree indication information of the to-be-evaluated memory is used to indicate, to the user, whether to replace the to-be-evaluated memory. For example, when the health degree of the to-be-evaluated memory is relatively low, the health degree indication information that is of the to-be-evaluated memory and that is output by the memory evaluation apparatus may indicate, to the user, that the to-be-evaluated memory needs to be replaced. In this case, there is a relatively high possibility of a failure of the to-be-evaluated memory. When the health degree of the to-be-evaluated memory is relatively high, the health degree indication information that is of the to-be-evaluated memory and that is output by the memory evaluation apparatus may indicate, to the user, that the to-be-evaluated memory does not need to be replaced. In this case, there is a relatively low possibility of a failure of the to-be-evaluated memory.

For example, when the value of the health degree of the to-be-evaluated memory is within a preset value range (for example, from 70 to 100), the memory evaluation apparatus outputs the health degree indication information of the to-be-evaluated memory to indicate, to the user, that the to-be-evaluated memory does not need to be replaced. When the value of the health degree of the to-be-evaluated memory is within a preset value range (for example, from 0 to 45), the memory evaluation apparatus outputs the health degree indication information of the to-be-evaluated memory to indicate, to the user, that the to-be-evaluated memory needs to be replaced.

It should be noted that the health degree evaluation model of the to-be-evaluated memory may be pre-stored by a person skilled in the art in the memory evaluation apparatus, for example, in the hard disk 112 in the memory evaluation apparatus 20 shown in FIG. 2B. In addition, in a process in which the memory evaluation apparatus executes the memory evaluation method provided in this embodiment of the present application, a log may be generated. The log may store data in the health degree evaluation model of the to-be-evaluated memory (for example, the at least one health degree influencing factor of the to-be-evaluated memory) and the health degree of the to-be-evaluated memory.

It should be noted that this embodiment of the present application can provide the health degree evaluation model that describes the relationship in which the health degree of the to-be-evaluated memory changes with the at least one health degree influencing factor of the to-be-evaluated memory, so that the memory evaluation apparatus can obtain the health degree of the to-be-evaluated memory based on the health degree evaluation model of the to-be-evaluated memory. Therefore, the memory evaluation apparatus can generate the health degree indication information of the to-be-evaluated memory based on the value of the health degree of the to-be-evaluated memory. In this way, before the to-be-evaluated memory is faulty, the memory evaluation apparatus can determine, based on the health degree of the to-be-evaluated memory, whether to replace the to-be-evaluated memory. In addition, the memory evaluation apparatus can output the health degree indication information of the to-be-evaluated memory when the memory is not faulty and the health degree of the memory is relatively low to prompt the user to replace the memory, so that the memory can support normal operations of the server.

In a specific embodiment, in addition to the total running duration of the to-be-evaluated memory, the at least one health degree influencing factor included in the health degree evaluation model may further include another health degree influencing factor.

Specifically, the at least one health degree influencing factor provided in this embodiment of the present application includes one or more of the following: a factor 1: a memory running temperature factor; a factor 2: a memory service load factor; a factor 3: a total memory running duration factor; a factor 4: a memory swap factor; a factor 5: a memory correctable error (CE) frequency factor; a factor 6: a memory UCE frequency factor; and a factor 7: a memory performance attenuation factor.

It should be noted that the health degree influencing factors provided in this embodiment of the present application may be obtained by a person skilled in the art through training based on a large amount of data (for example, running data of the memory), or may be obtained based on related documents in the art.

The health degree influencing factor provided in this embodiment of the present application is not limited to the foregoing listed health degree influencing factors (the factors 1 to 7), and may alternatively be another factor, for example, sulfidation intensity in air.

It should be noted that the MC interface provided in this embodiment of the present application may display the health degree evaluation model of the memory in addition to inherent parameters of memories.

Figure 5:
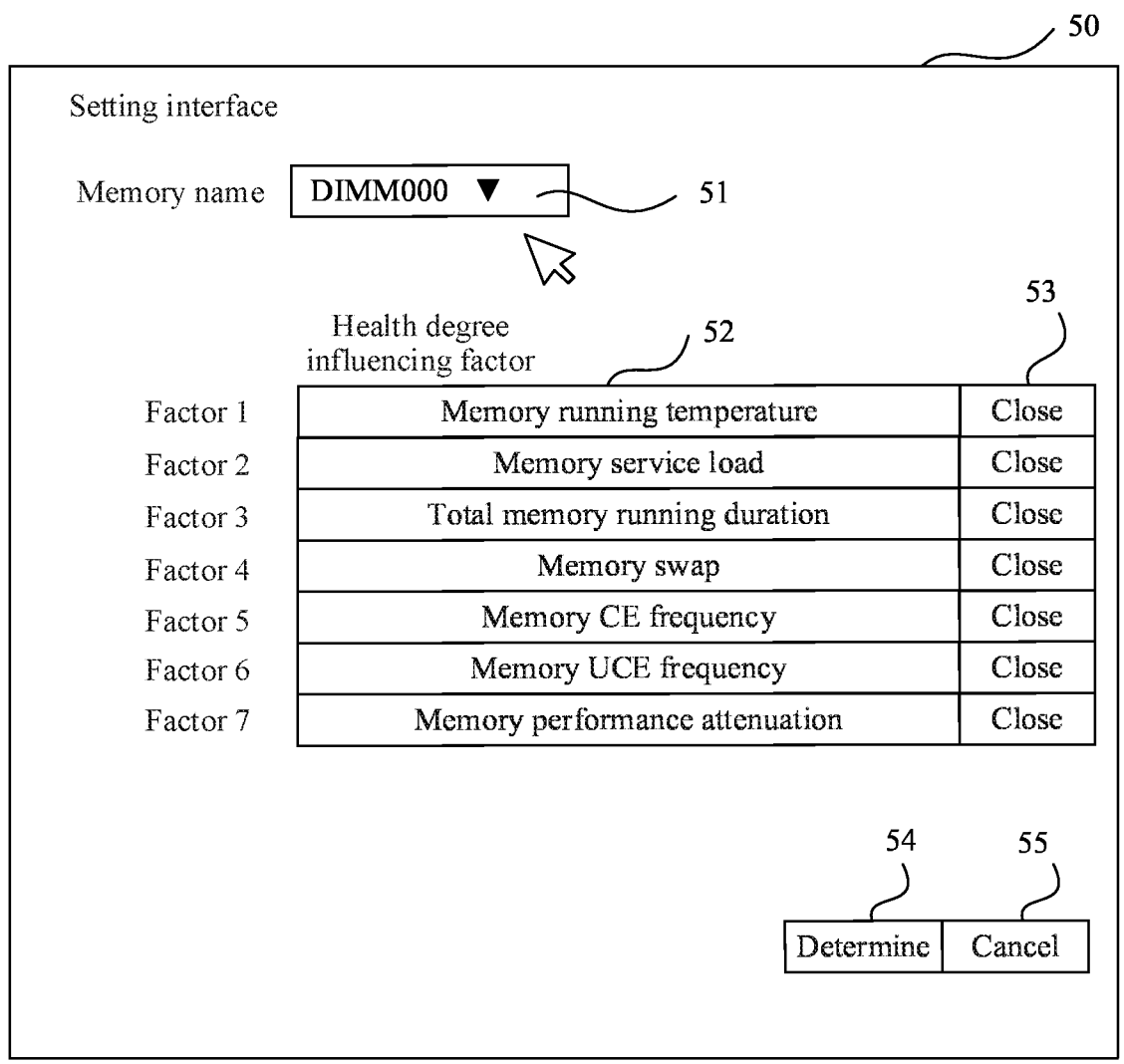
FIG. 5 is a schematic diagram of another MC interface according to an embodiment of the present application.

For example, FIG. 5 shows another MC interface according to an embodiment of the present application, and the MC interface is an interface used for setting health degree evaluation models for different to-be-evaluated memories. The MC interface shown in FIG. 5 may be an interface provided for a desktop computer. In this case, the display provided in this embodiment of the present application may be a display of the desktop computer, and the input device may be a device such as a mouse or a keyboard of the desktop computer.

The MC interface 50 shown in FIG. 5 includes a "memory name" option 51, and the option 51 includes a "▼" option. The MC interface 50 includes seven health degree influencing factor options: a "memory running temperature" option, a "memory service load" option, a "total memory running duration" option, a "memory swap" option, a "memory CE frequency" option, a "memory UCE frequency" option, and a "memory performance attenuation" option. Each health degree influencing factor corresponds to one "close" option. For example, a factor 1 corresponds to the "memory running temperature" option 52, and the factor 1 corresponds to a "close" option 53. In addition, the MC interface 50 shown in FIG. 5 further includes a "determine" option 54 and a "cancel" option 55.

Figure 6:
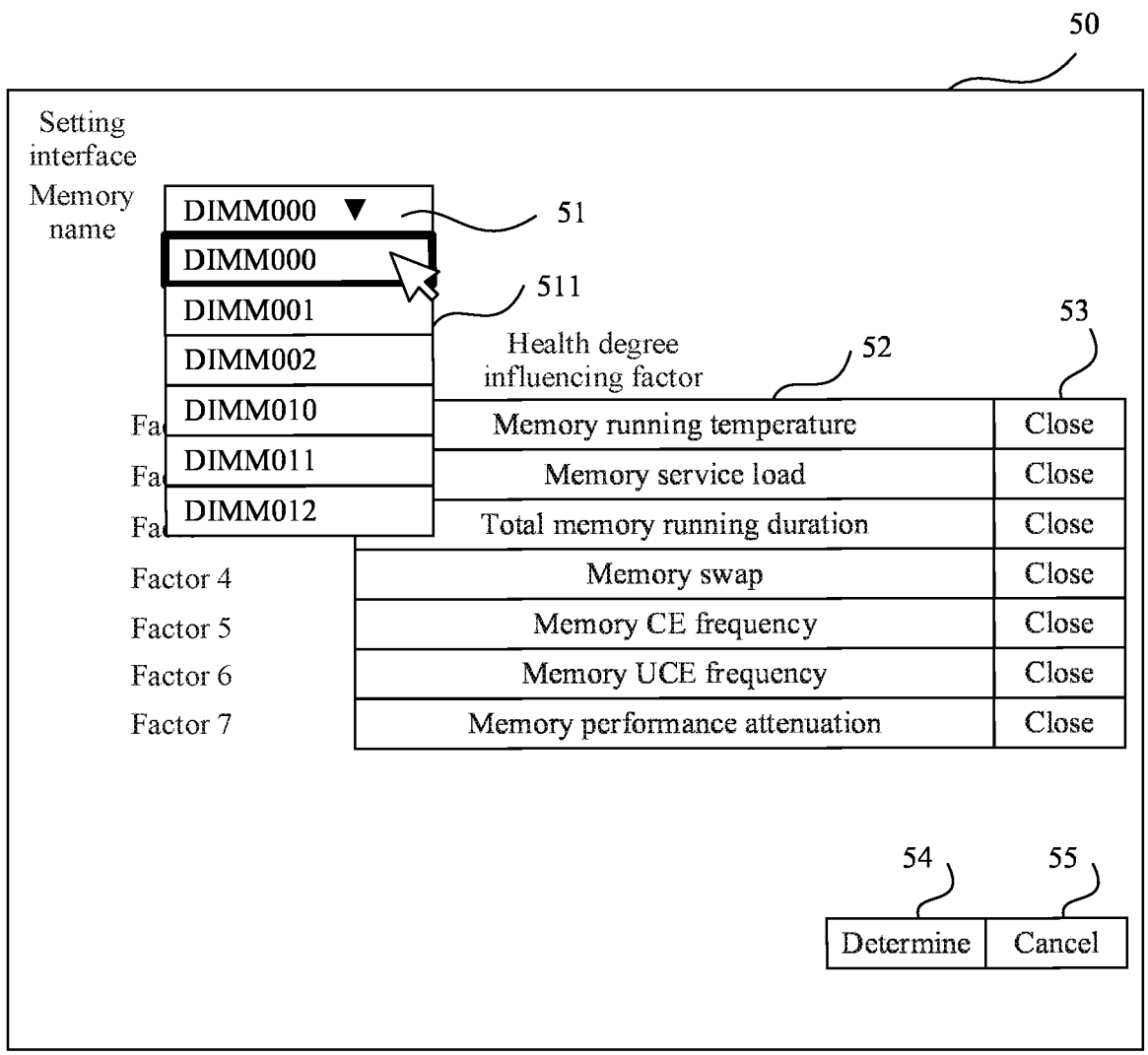
FIG. 6 is a schematic diagram of another MC interface according to an embodiment of the present application.

Specifically, the MC interface 50 may provide a user with choices of different memory names, so that the user sets health degree influencing factors included in health degree evaluation models for different memories. For example, the user performs a tap/click operation on a "▼" option included in the option 51 in the MC interface 50, so that after generating a corresponding tap/click operation instruction, a processor in a memory evaluation apparatus instructs the display to display, in the MC interface, a drop-down list 511 that is shown in FIG. 6. The drop-down list 511 includes six options: a "DIMM000" option, a "DIMM001" option, a "DIMM002" option, a "DIMM010" option, a "DIMM011" option, and a "DIMM012" option. The user performs a tap/click operation on any option (for example, the "DIMM000" option) included in the drop-down list 511, so that after receiving a corresponding operation instruction, the processor in the memory evaluation apparatus indicates that a health degree influencing factor option displayed in the MC interface 50 is a health degree influencing factor corresponding to a memory whose memory name is DIMM000. In this case, the memory whose memory name is DIMM000 is a to-be-evaluated memory. In an embodiment, after the user performs a tap/click operation on the "DIMM000" option included in the drop-down list 511 shown in FIG. 6, the processor in the memory evaluation apparatus may generate a corresponding tap/click operation instruction, and then may instruct the display to display the MC interface 50 shown in FIG. 5. The health degree influencing factor option displayed in the MC interface 50 in FIG. 5 is the health degree influencing factor corresponding to the memory whose memory name is DIMM000. That "the user performs a tap/click operation on the option" may be that the user clicks the option by using the mouse. An arrow shown in FIG. 5 is used to indicate a location of a cursor of the mouse on the display interface.

After the user performs a tap/click operation (one tap/click operation) on a "close" option corresponding to one health degree influencing factor option in the MC interface 50, the memory evaluation apparatus may determine that a corresponding health degree evaluation model does not include the health degree influencing factor, that is, ignore impact of the health degree influencing factor on a health degree of the to-be-evaluated memory. If the user does not perform a tap/click operation (or consecutively performs two tap/click operations) on the "close" option corresponding to the health degree influencing factor, the memory evaluation apparatus may determine that the health degree influencing factor in the corresponding health degree evaluation model has impact on the health degree of the to-be-evaluated memory. The following describes the memory evaluation method provided in the embodiments of the present application by using only an example in which one tap/click operation is performed on each option in the MC interface 50.

Figure 7:
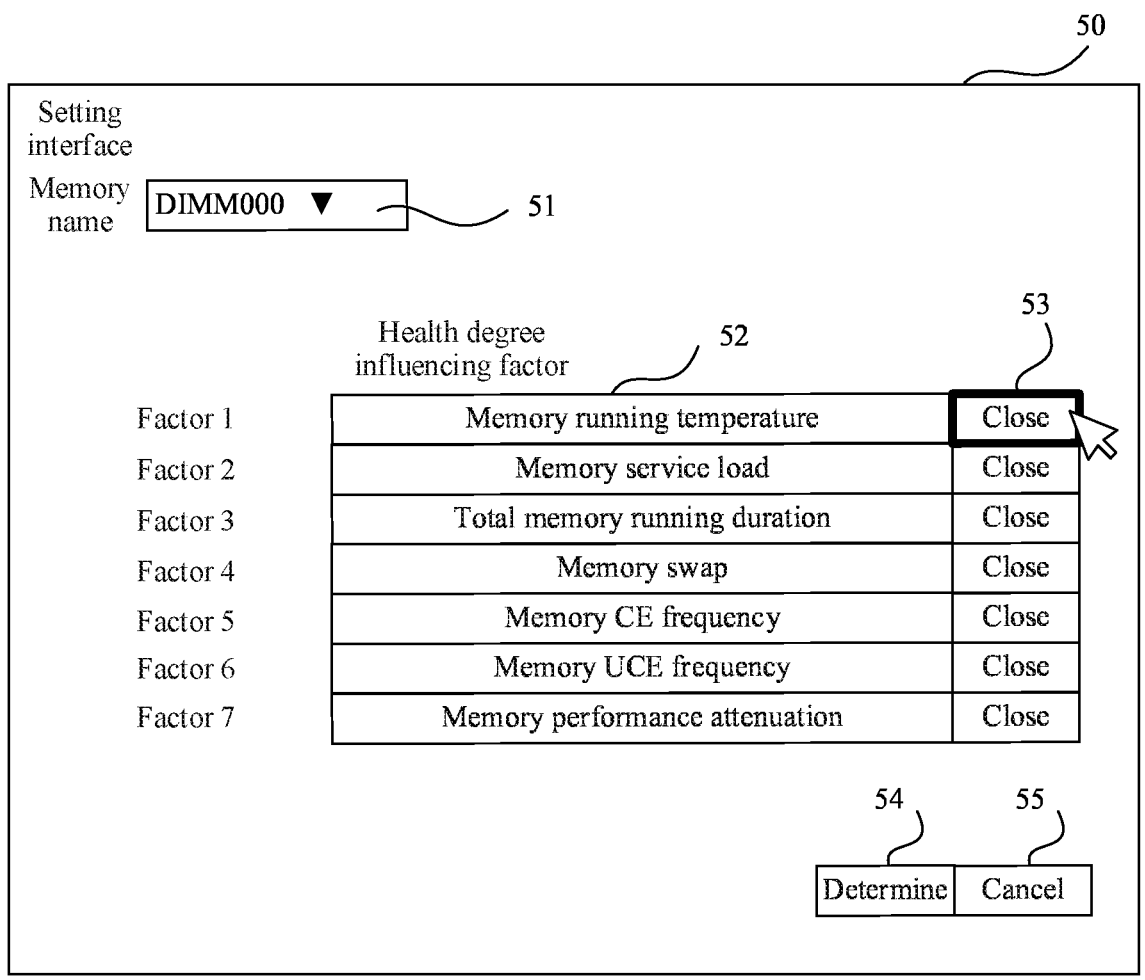
FIG. 7 is a schematic diagram of another MC interface according to an embodiment of the present application.

For example, a tap/click operation may be performed on a "close" option 53 corresponding to a factor 1 included in an MC interface 50 shown in FIG. 7. In this case, it may be considered that a health degree of a memory whose memory name is "DIMM000" is not affected by a health degree influencing factor that is a memory running temperature. To be specific, a user may select a health degree influencing factor of a memory by performing a tap/click operation on a related option in the MC interface 50.

It should be noted that, after selecting, in the MC interface 50, the health degree influencing factor of the memory whose memory name is "DIMM000", the user may perform a tap/click operation on a "determine" option 54, so that a processor in a memory evaluation apparatus determines a health degree evaluation model of the to-be-evaluated memory. Alternatively, the user may perform a tap/click operation on the "cancel" option 55, so that the processor re-determines a health degree evaluation model of the to-be-evaluated memory.

In addition, a display for displaying the MC interface provided in this embodiment of the present application may be implemented by a terminal device having a touchscreen, such as a mobile phone or a tablet computer.

Figures 8A, 8B:
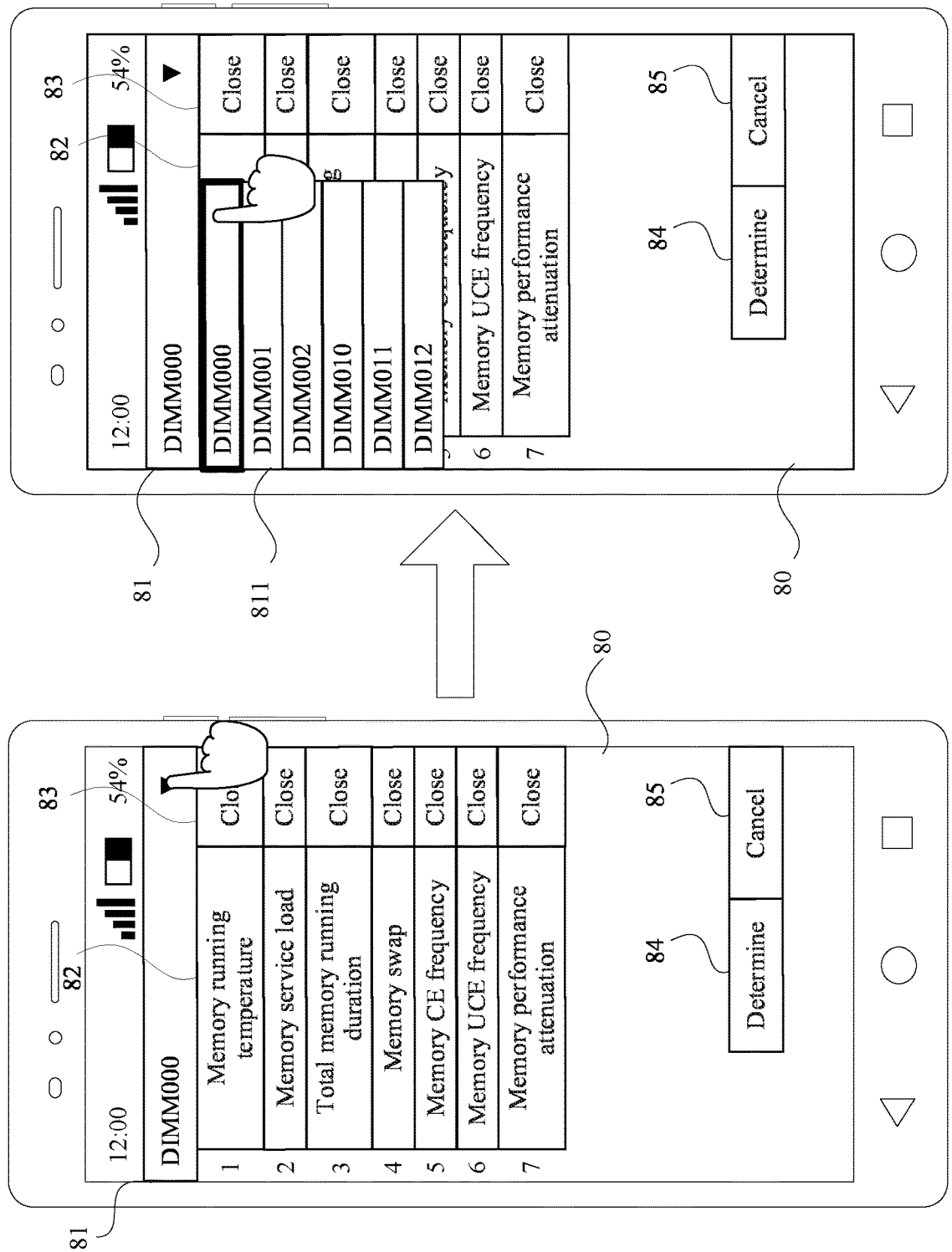
FIG. 8A and FIG. 8B are schematic diagrams of another MC interface according to an embodiment of the present application.

For example, FIG. 8A and FIG. 8B shows another MC interface according to an embodiment of the present application. The MC interface is implemented by a touchscreen of a mobile phone. Each of the MC interfaces 80 shown in FIG. 8A and FIG. 8B includes a memory name option 81, and the option 81 includes a "▼" option. The MC interface 80 includes seven health degree influencing factor options: a "memory running temperature" option, a "memory service load" option, a "total memory running duration" option, a "memory swap" option, a "memory CE frequency" option, a "memory UCE frequency" option, and a "memory performance attenuation" option. Each health degree influencing factor option corresponds to one "close" option. For example, a health degree influencing factor option corresponding to a factor 1 is a "memory running temperature" option 82, and the factor 1 corresponds to a "close" option 83. In addition, the MC interface 80 further includes a "determine" option 84 and a "cancel" option 85. A drop-down list 811 shown in FIG. 8B includes six options: a "DIMM000" option, a "DIMMW001" option, a "DIMM002" option, a "DIMM010" option, a "DIMM011" option, and a "DIMM012" option.

For example, FIG. 9A and FIG. 9B shows another MC interface according to an embodiment of the present application. The MC interface is implemented by a touchscreen of a tablet computer. Each of the MC interfaces 90 shown in FIG. 9A and FIG. 9B includes a memory name option 91, and the option 91 includes a "▼" option. The MC interface 90 includes seven health degree influencing factor options: a "memory running temperature" option, a "memory service load" option, a "total memory running duration" option, a "memory swap" option, a "memory CE frequency" option, a "memory UCE frequency" option, and a "memory performance attenuation" option. Each health degree influencing factor option corresponds to one "close" option. For example, a health degree influencing factor option corresponding to a factor 1 is a "memory running temperature" option 92, and the factor 1 corresponds to a "close" option 93. In addition, the MC interface 90 further includes a "determine" option 94 and a "cancel" option 95. A drop-down list 911 shown in FIG. 9B includes six options: a "DIMM000" option, a "DIMM001" option, a "DIMM002" option, a "DIMM010" option, a "DIMM011" option, and a "DIMM012" option.

A user may perform a tap operation by using a finger on the MC interface presented on the touchscreen shown in FIG. 8A, FIG. 8B or FIG. 9A, FIG. 9B, and then a processor in the mobile phone or the tablet computer may generate a corresponding tap operation instruction. A "hand icon" in FIG. 8A, FIG. 8B and FIG. 9A, FIG. 9B is used to schematically represent a hand. In this embodiment of the present application, the "hand icon" is merely used to represent a location of the finger of the user. In actuality, the "hand icon" is not displayed on the mobile phone or the tablet computer.

It should be noted that, for specific descriptions of the MC interface provided by the terminal device having the touchscreen, such as the mobile phone or the tablet computer, reference may be made to descriptions of the MC interface provided by the display of the desktop computer in the embodiment of the present application. The following describes the memory evaluation method provided in the embodiments of the present application by using only the MC interface provided by the display of the desktop computer as an example.

It may be determined that health degrees of memories of different lots or different models (to be specific, with different inherent parameters) may be related to different health degree influencing factors. For example, health degrees of some memories are more sensitive to a change of a memory running temperature, and health degrees of some memories are more sensitive to a change of memory running duration. In this case, a plurality of health degree influencing factors are preset in a health degree evaluation model provided in this embodiment of the present application, so that the user can select corresponding health degree influencing factors for different to-be-evaluated memories. In this way, a health degree evaluation factor for a to-be-evaluated memory in the health degree evaluation model is more proper for the to-be-evaluated memory. This helps to accurately evaluate a health degree of the to-be-evaluated memory.

Optionally, a person skilled in the art may set a same weight for all the health degree influencing factors in the health degree evaluation model of the to-be-evaluated memory, or a person skilled in the art may not set a weight for any health degree influencing factor. In other words, all the health degree influencing factors have same impact on the health degree of the to-be-evaluated memory.

For example, a weight corresponding to the factor 1 is 20%, a weight corresponding to a factor 2 is 5%, a weight corresponding to a factor 3 is 25%, a weight corresponding to a factor 4 is 5%, a weight corresponding to a factor 5 is 10%, a weight corresponding to a factor 6 is 15%, and a weight corresponding to a factor 7 is 20%. Each health degree influencing factor corresponds to one weight, and the weight may further indicate impact of each health degree influencing factor on the health degree of the to-be-evaluated memory.

Figure 10:
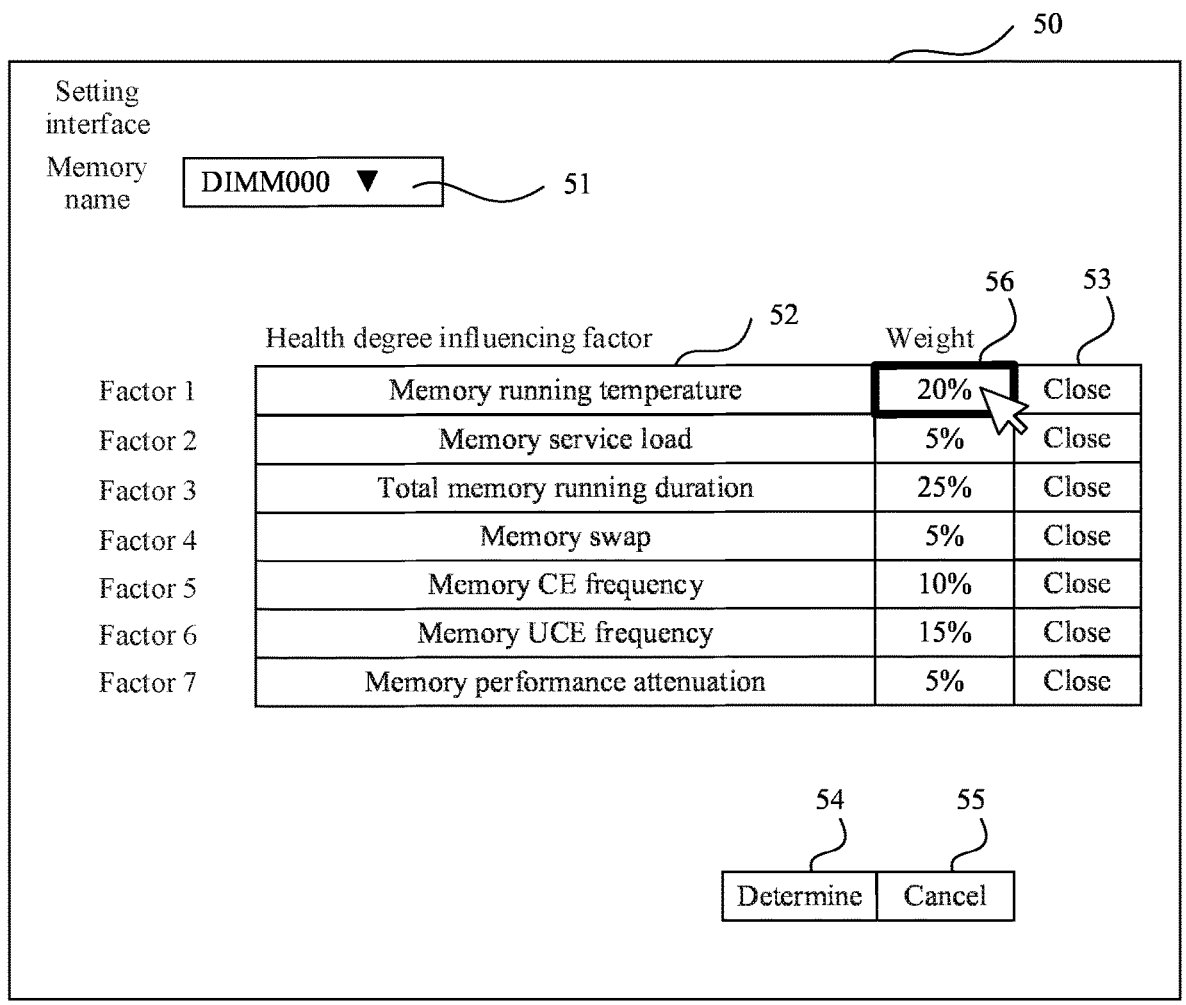
FIG. 10 is a schematic diagram of another MC interface according to an embodiment of the present application.

FIG. 10 is a schematic diagram of another MC interface according to an embodiment of the present application. In the MC interface 50 shown in FIG. 10, each health degree influencing factor corresponds to one weight option. For example, a factor 1 shown in FIG. 1 corresponds to a "20%" option (that is, an option 56). It may be determined that a user may change any weight displayed in the MC interface 50. For example, after a tap/click operation is performed on the option 56 shown in FIG. 10, a processor (a processor in a server) in a memory evaluation apparatus may generate a corresponding tap/click operation instruction, and receive a change that is performed by the user on the option 56 by using an input device (for example, a keyboard), for example, modify "20%" in the option 56 to "25%". In this case, in addition to "20%" in the option 56, a weight corresponding to another factor may be correspondingly modified.

In a specific embodiment, a running parameter corresponding to a memory running temperature factor (the factor 1) provided in this embodiment of the present application is a running temperature of a to-be-evaluated memory, a running parameter corresponding to the memory service load factor (a factor 2) is a quantity of charging/discharging times of the to-be-evaluated memory, a running parameter corresponding to the total memory running duration factor (a factor 3) is total running duration of the to-be-evaluated memory, a running parameter corresponding to the memory swap factor (a factor 4) is a quantity of swap times of the to-be-evaluated memory, a running parameter corresponding to the memory CE frequency factor (a factor 5) is a quantity of CEs of the to-be-evaluated memory or a CE frequency of the to-be-evaluated memory, a running parameter corresponding to the memory UCE frequency factor (a factor 6) is a quantity of UCEs of the to-be-evaluated memory or a UCE frequency of the to-be-evaluated memory, and a running parameter corresponding to the memory performance attenuation factor (a factor 7) is a performance value attenuation magnitude of the to-be-evaluated memory.

The running parameters corresponding to the health degree influencing factors provided in this embodiment of the present application may be obtained by a person skilled in the art through training based on a large amount of data, for example, obtained through training based on running data of a plurality of memories similar to the to-be-evaluated memory, or may be obtained based on related documents in the art.

Specifically, when a health degree influencing factor corresponding to the to-be-evaluated memory is the factor 1, the memory evaluation apparatus stores data that describes a relationship between the running temperature of the to-be-evaluated memory and a failure rate parameter, for example, a curve that describes how a memory failure rate of the to-be-evaluated memory changes with the running temperature of the to-be-evaluated memory. Generally, a higher running temperature of the to-be-evaluated memory indicates a higher possibility of a failure of the to-be-evaluated memory, that is, a higher failure rate.

Similarly, when a health degree influencing factor corresponding to the to-be-evaluated memory is the factor 2, the memory evaluation apparatus stores data that describes a relationship between the quantity of charging/discharging times of the to-be-evaluated memory and a failure rate parameter, for example, a curve that describes how a memory failure rate of the to-be-evaluated memory changes with the quantity of charging/discharging times of the to-be-evaluated memory. During normal working of one memory (for example, the to-be-evaluated memory), one or more services, such as a data storage service or a data modification service, may be run in the memory. Running of the services in the memory is accompanied with a service load pressure of the memory. The service load pressure of the memory may be represented by the quantity of charging/discharging times of the memory. Generally, a larger quantity of charging/discharging times of the memory indicates a higher service load pressure of the memory, a higher possibility of a failure of the memory, and a higher failure rate of the memory. A smaller quantity of charging/discharging times of the memory indicates a lower service load pressure of the memory, a lower possibility of a failure of the memory, and a lower failure rate of the memory.

When a health degree influencing factor corresponding to the to-be-evaluated memory is the factor 3, the memory evaluation apparatus stores data that describes a relationship between the total running duration of the to-be-evaluated memory and a failure rate parameter, for example, a curve that describes how a memory failure rate of the to-be-evaluated memory changes with the total running duration of the to-be-evaluated memory. Total running duration of one memory (for example, the to-be-evaluated memory) is limited. In other words, a life span of one memory is limited. Generally, longer total running duration of one memory indicates a higher possibility of a failure of the memory, and a higher failure rate.

When a health degree influencing factor corresponding to the to-be-evaluated memory is the factor 4, the memory evaluation apparatus stores data that describes a relationship between the quantity of swap times of the to-be-evaluated memory and a failure rate parameter, for example, a curve that describes how a memory failure rate of the to-be-evaluated memory changes with the quantity of swap times of the to-be-evaluated memory. The memory (for example, the to-be-evaluated memory) provided in this embodiment of the present application is mostly a memory module having a gold coating. Because a thickness of the gold coating of the memory module is fixed, and wear of the gold coating of the memory module is caused in a process of swapping the memory module, a quantity of memory swap times may be a health degree influencing factor of one memory. Specifically, a larger quantity of swap times of the to-be-evaluated memory indicates a higher possibility of a failure of the to-be-evaluated memory, and a higher failure rate. A smaller quantity of swap times of the to-be-evaluated memory indicates a lower possibility of a failure of the to-be-evaluated memory, and a lower failure rate.

When a health degree influencing factor corresponding to the to-be-evaluated memory is the factor 5, the memory evaluation apparatus stores data that describes a relationship between the quantity of CEs of the to-be-evaluated memory or the CE frequency of the to-be-evaluated memory and a failure rate parameter, for example, a curve that describes how a memory failure rate of the to-be-evaluated memory changes with the quantity of CEs of the to-be-evaluated memory or the CE frequency of the to-be-evaluated memory. A larger quantity of CEs generated by the to-be-evaluated memory in a period of time indicates a higher possibility of a failure of the to-be-evaluated memory, and a higher failure rate. A smaller quantity of CEs generated by the to-be-evaluated memory in a period of time indicates a lower possibility of a failure of the to-be-evaluated memory, and a lower failure rate. Alternatively, a higher CE frequency of the to-be-evaluated memory indicates a higher possibility of a failure of the to-be-evaluated memory, and a higher failure rate. A lower CE frequency of the to-be-evaluated memory indicates a lower possibility of a failure of the to-be-evaluated memory, and a lower failure rate.

When a health degree influencing factor corresponding to the to-be-evaluated memory is the factor 6, the memory evaluation apparatus stores data that describes a relationship between the quantity of UCEs of the to-be-evaluated memory or the UCE frequency of the to-be-evaluated memory and a failure rate parameter, for example, a curve that describes how a memory failure rate of the to-be-evaluated memory changes with the quantity of UCEs of the to-be-evaluated memory or the UCE frequency of the to-be-evaluated memory. A larger quantity of UCEs generated by the to-be-evaluated memory in a period of time (or a higher UCE frequency of the to-be-evaluated memory) indicates a higher possibility of a failure and a higher failure rate. A smaller quantity of UCEs generated by the to-be-evaluated memory in a period of time (or a lower CE frequency of the to-be-evaluated memory) indicates a lower possibility of a failure and a lower failure rate. For example, when the quantity of UCEs of the to-be-evaluated memory is 1 or 2, there is a relatively high possibility of a failure of the to-be-evaluated memory.

When a health degree influencing factor corresponding to the to-be-evaluated memory is the factor 7, the memory evaluation apparatus stores data that describes a relationship between the performance value attenuation magnitude of the to-be-evaluated memory and a failure rate parameter, for example, a curve that describes how a failure rate of the to-be-evaluated memory changes with the performance value attenuation magnitude of the to-be-evaluated memory. The performance value attenuation magnitude of the to-be-evaluated memory changes in a running process of the to-be-evaluated memory. Generally, a larger performance value attenuation magnitude and a smaller performance value of one memory (for example, the to-be-evaluated memory) indicate a higher possibility of a failure and a higher failure rate. A smaller performance value attenuation magnitude and a larger performance value of the memory indicate a lower possibility of a failure and a lower failure rate.

It should be noted that the MC interface provided in this embodiment of the present application may display data of a relationship between a running parameter and a failure rate parameter that correspond to each health degree influencing factor, for example, a curve that describes how a value of the failure rate parameter of the memory changes with a value of the corresponding running parameter. The memory evaluation apparatus stores a curve that describes how failure rates of memories (for example, a memory named "DIMM000" and a memory named "DIMM001") change with corresponding running parameters.

Figure 11:
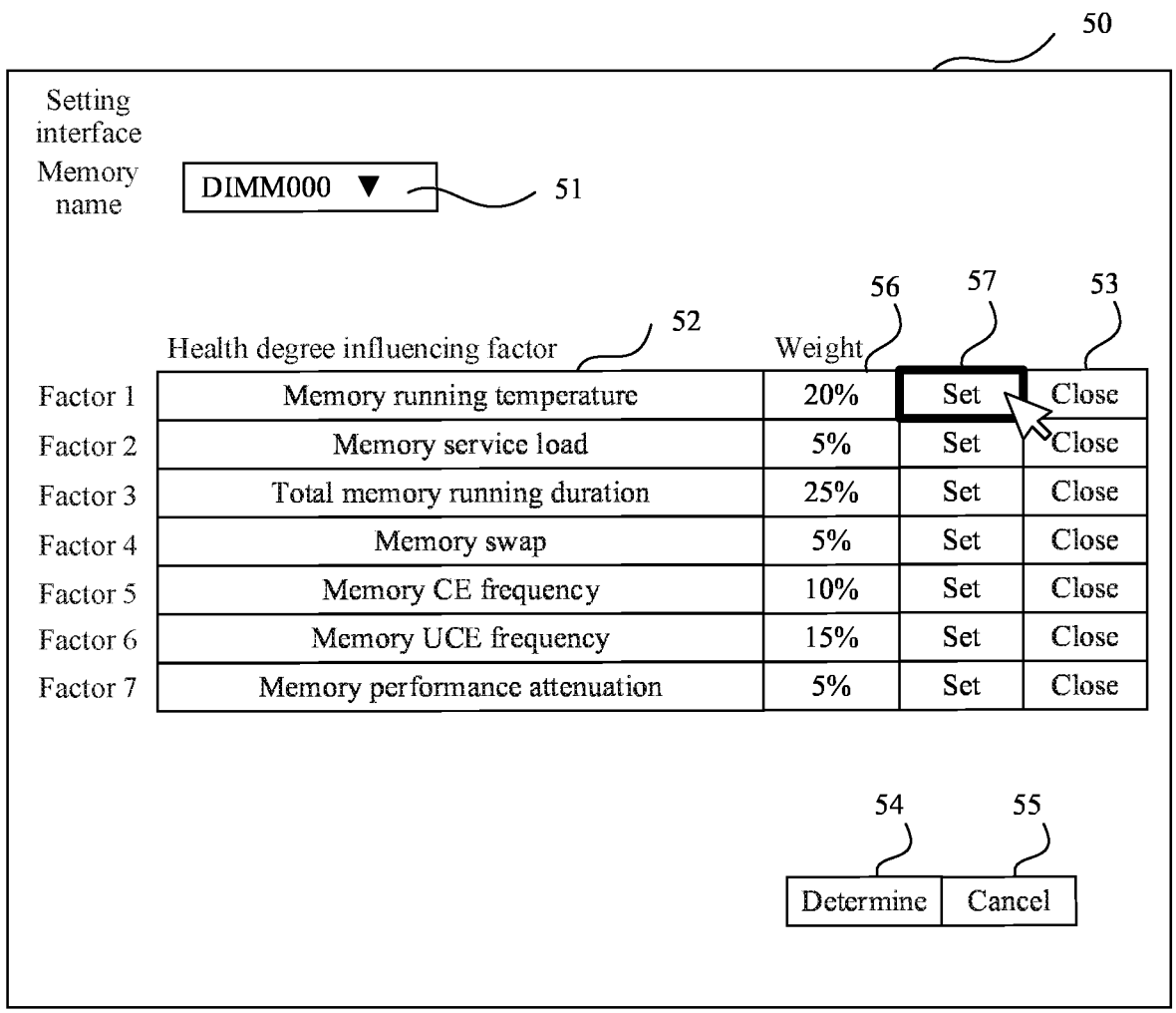
FIG. 11 is a schematic diagram of another MC interface according to an embodiment of the present application.

For example, FIG. 11 is a schematic diagram of another MC interface according to an embodiment of the present application. Each health degree influencing factor in the MC interface 50 shown in FIG. 11 corresponds to one "set" option. For example, a "memory running temperature" option 52 corresponds to a "set" option 57. Specifically, the "set" option 57 is used to enable an MC interface 50 shown in FIG. 12 to jump to an interface 50 displaying a "temperature-failure rate curve".

Figure 12:
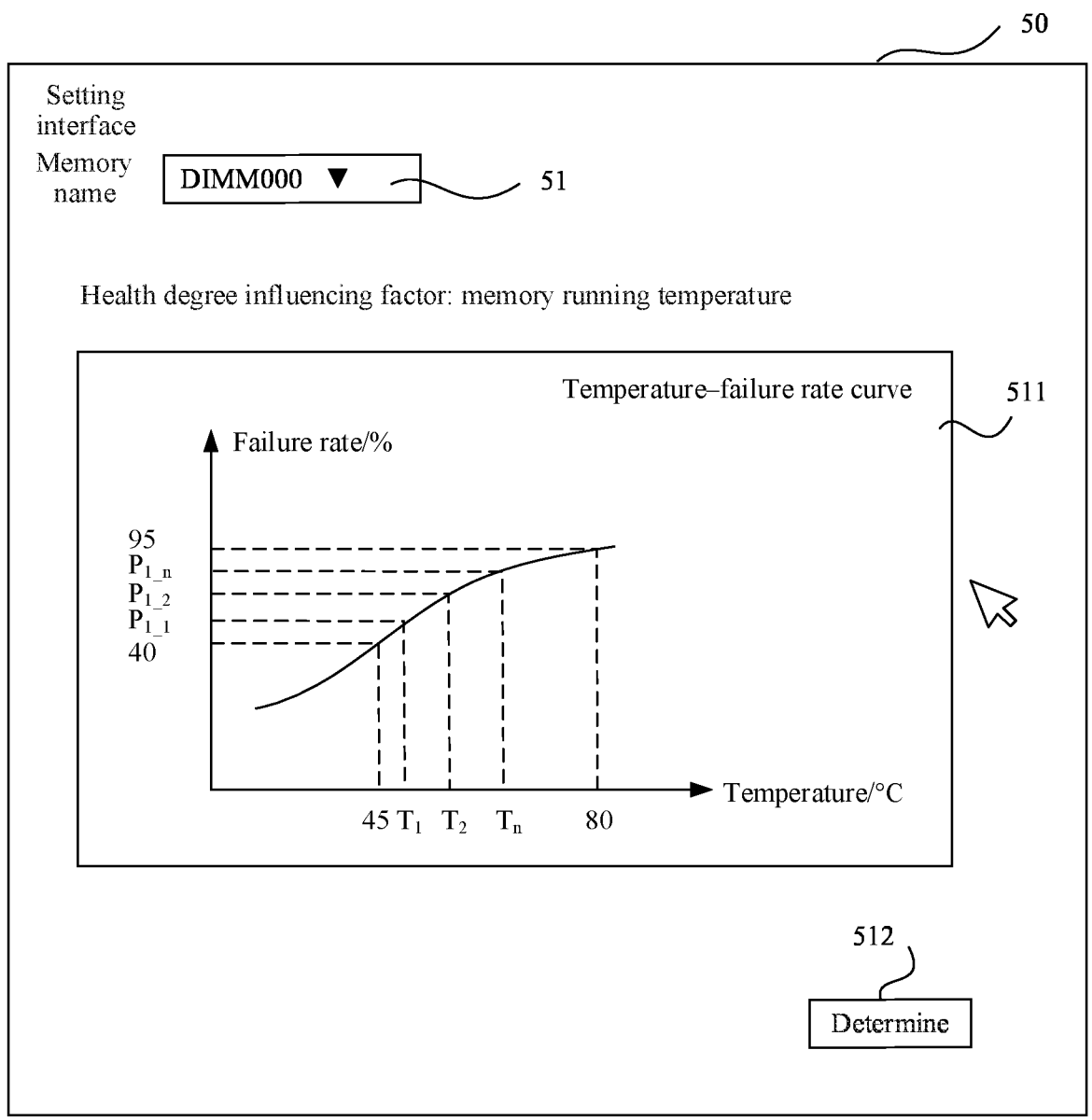
FIG. 12 is a schematic diagram of another MC interface according to an embodiment of the present application.

After a tap/click operation is performed on the "set" option 57 corresponding to a factor 1 shown in FIG. 11, a processor in a memory evaluation apparatus may generate a corresponding tap/click operation instruction, and instruct a display to display the MC interface 50 that includes a window 511 and that is shown in FIG. 12, where the window 511 displays the "temperature-failure rate curve". The "temperature-failure rate curve" shown in FIG. 12 is a curve that describes how a value of a failure rate parameter of a memory named "DIMM000" changes with a value of a running parameter that is a memory running temperature. The MC interface 50 shown in FIG. 12 further includes a "determine" option 512. The "determine" option 512 is used by a user to determine the "temperature-failure rate curve", so that the display displays the MC interface 50 shown in FIG. 11.

For example, referring to the "temperature-failure rate curve" in FIG. 12, when the running temperature of the memory named "DIMM000" is 45° C. for a long time, the failure rate of the memory is 40%. When the running temperature of the memory named "DIMM000" is 80° C. for a long time, the failure rate of the memory is 95%. The "long time" may be a time used by a person skilled in the art to detect a life span of one memory, and It should be noted that the "temperature-failure rate" curve is a curve for the memory named "DIMM000", and may be obtained by the memory evaluation apparatus through matching from a plurality of curves for different memories. The plurality of curves for different memories may be pre-stored in the memory evaluation apparatus. Specifically, the memory evaluation apparatus may autonomously obtain the foregoing "temperature-failure rate" curve through matching based on an inherent parameter such as a memory capacity of the memory named "DIMM000".

Figure 13:
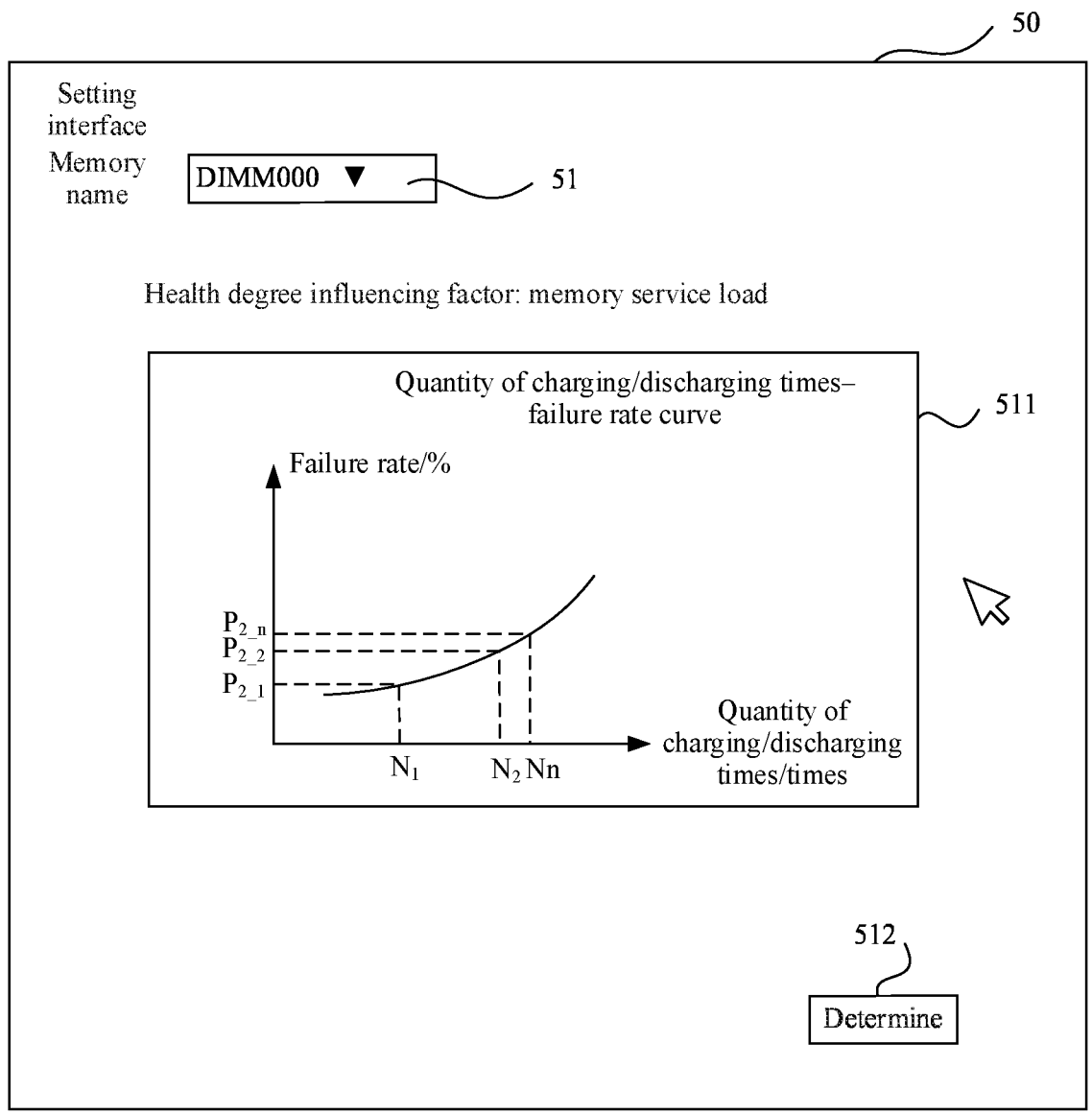
FIG. 13 is a schematic diagram of another MC interface according to an embodiment of the present application.

After a tap/click operation is performed on a "set" option corresponding to a factor 2 included in the MC interface shown in FIG. 11, the processor in the memory evaluation apparatus may generate a corresponding tap/click operation instruction, and instruct the display to display an MC interface 50 that includes a window 511 and that is shown in FIG. 13, where the window 511 displays a "quantity of charging times-failure rate" curve. The "quantity of charging times-failure rate" curve shown in FIG. 13 is a curve that describes how a value of a failure rate parameter of a memory named "DIMM000" changes with a value of a running parameter that is a quantity of charging/discharging times of the memory. The MC interface 50 shown in FIG. 13 further includes a "determine" option 512. The "determine" option 512 is further used by a user to determine the "quantity of charging/discharging times-failure rate" curve, so that the display displays the MC interface 50 shown in FIG. 11.

Similarly, the "quantity of charging times-failure rate" curve shown in FIG. 13 may be a curve that is for the memory named "DIMM000" and that is obtained by the memory evaluation apparatus through matching from a plurality of curves for different memories, and the plurality of curves for different memories are stored in the memory evaluation apparatus. Specifically, the memory evaluation apparatus may autonomously obtain the foregoing "quantity of charging/discharging times-failure rate" curve through matching based on an inherent parameter of the memory named "DIMM000", for example, a parameter such as a memory capacity.

It may be determined that the memory evaluation apparatus provided in this embodiment of the present application may alternatively store a "total running duration-failure rate" curve for a factor 3, a "quantity of swap times-failure rate" curve for a factor 4, a "quantity of CEs-failure rate" curve or a "CE frequency-failure rate" curve for a factor 5, a "quantity of UCEs-failure rate" curve or a "UCE frequency-failure rate" curve for a factor 6, and a "performance value attenuation magnitude-failure rate" curve for a factor 7. In this embodiment of the present application, for detailed descriptions of displaying corresponding curves in the MC interface after tap/click operations are performed on "set" options corresponding to the factor 3 to the factor 7, reference may be made to related descriptions of the factor 1 and the factor 2 in the foregoing embodiment.

It should be noted that the memory evaluation apparatus provided in this embodiment of the present application stores data that describes a relationship between a running parameter and a failure rate parameter that correspond to each health degree influencing factor, for example, a curve that describes how the failure rate parameter of the to-be-evaluated memory changes with the corresponding running parameter. The curve that describes how the failure rate parameter of the to-be-evaluated memory changes with the corresponding running parameter is data pre-obtained through statistics collection. In this way, the memory evaluation apparatus can evaluate, based on existing data obtained through statistics collection, a health degree of the to-be-evaluated memory that is not yet faulty.

In a specific embodiment, the health degree evaluation model of the to-be-evaluated memory provided in the embodiments of the present application may include a first submodel that corresponds to each health degree influencing factor and a second submodel. A first submodel of one health degree influencing factor is a relationship between a health degree impairment value corresponding to the health degree influencing factor and a running parameter and memory failure rate parameter corresponding to the health degree influencing factor. The second submodel is a relationship between the health degree of the to-be-evaluated memory and the health degree impairment value corresponding to each health degree influencing factor and a relationship between the health degree of the to-be-evaluated memory and the weight corresponding to each health degree influencing factor.

Figure 14:
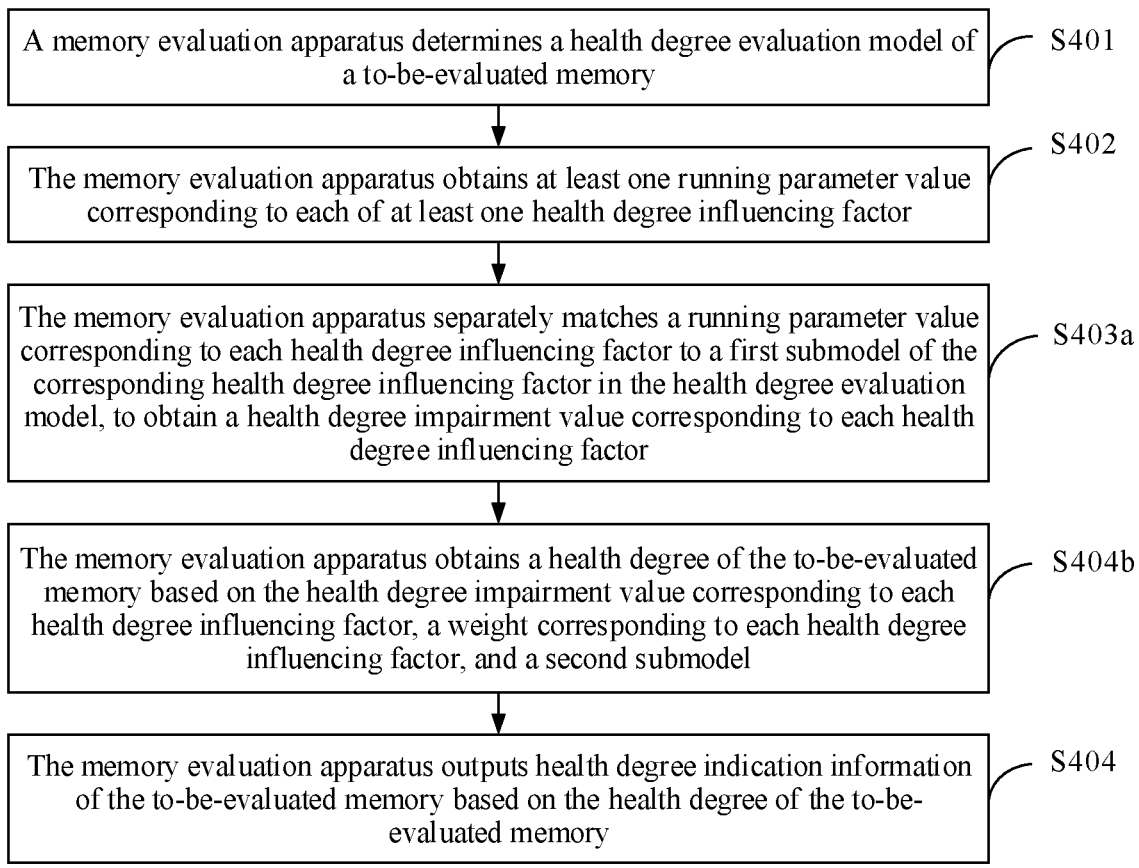
FIG. 14 is another schematic flowchart of a memory evaluation method according to an embodiment of the present application.

Specifically, in the memory evaluation method provided in the embodiments of the present application, step 403 may include step 403a and step 403b. For example, step 403 in a flowchart of a memory evaluation method shown in FIG. 14 may include step 403a and step 403b.

S403a: The memory evaluation apparatus separately matches a running parameter value corresponding to each health degree influencing factor to a first submodel of the corresponding health degree influencing factor in the health degree evaluation model, to obtain a health degree impairment value corresponding to each health degree influencing factor.

For example, step 403a may be performed by the processor 111 in the memory evaluation apparatus 20 shown in FIG. 2B.

The running parameter value corresponding to each health degree influencing factor of the to-be-evaluated memory may be obtained in real time by the memory evaluation apparatus. The health degree impairment value corresponding to each health degree influencing factor is used to indicate a result of impact of the health degree influencing factor on the health degree of the to-be-evaluated memory.

It should be noted that the first submodel provided in this embodiment of the present application may include the curve in the window 511 in the MC interface shown in FIG. 12 or FIG. 13.

For example, when the to-be-evaluated memory is the memory named "DIMM000", and a health degree influencing factor corresponding to the to-be-evaluated memory is the factor 1, the memory evaluation apparatus may obtain, by referring to an existing "temperature-failure rate" curve, for example, the "temperature-failure rate" curve in the window 511 shown in FIG. 12, a failure rate corresponding to each of the at least one running parameter value, and accumulate running duration to obtain a health degree impairment value (denoted as $P_1$) of the to-be-evaluated memory for the factor 1. For example, the at least one running parameter value of the to-be-evaluated memory is a running temperature value $T_1$, a running temperature value $T_2$, ..., and a running temperature $T_n$, where n is a positive integer. In addition, running duration of the to-be-evaluated memory is $t_{1\_1}$ when a running temperature is $T_1$, running duration of the to-be-evaluated memory is $t_{1\_2}$ when a running temperature is $T_2$, and running duration of the to-be-evaluated memory is $t_{1\_n}$ when a running temperature is $T_n$. In this case, with reference to data shown by the "temperature-failure rate" curve in FIG. 12, that is, a failure rate is $P_{1\_1}$ when the running temperature value is $T_1$, a failure rate is $P_{1\_2}$ when the running temperature value is $T_2$, and a failure rate is $P_{1\_n}$ when the running temperature value is $T_n$, the health degree impairment value of the to-be-evaluated memory for the factor 1 is $$P_1 = \frac{P_{1\_1} \times t_{1\_1} + P_{1\_2} \times t_{1\_2} + \ldots + P_{1\_n} \times t_{1\_n}}{t_{1\_1} + t_{1\_2} + \ldots + t_{1\_n}},$$

where $T_1$, $T_2$, $T_n$, $t_{1\_1}$, $t_{1\_2}$, and $t_{1\_n}$ are all positive numbers.

For example, when the to-be-evaluated memory is the memory named "DIMM000", and a health degree influencing factor corresponding to the to-be-evaluated memory is the factor 2, the memory evaluation apparatus may obtain, by referring to an existing "quantity of charging/discharging times-failure rate" curve, for example, the "quantity of charging/discharging times-failure rate" curve in the window 511 shown in FIG. 13, a failure rate corresponding to the at least one running parameter value, and accumulate running duration to obtain a health degree impairment value (denoted as $P_2$) of the to-be-evaluated memory for the factor 2. For example, the at least one running parameter value of the to-be-evaluated memory is a quantity $N_1$ of charging/discharging times, a quantity $N_2$ of charging/discharging times, ..., and a quantity $N_n$ of charging/discharging times, where n is a positive integer. In addition, a quantity of charging/discharging times of the to-be-evaluated memory in a time whose duration is $t_{2\_1}$ is $N_1$, a quantity of charging/discharging times of the to-be-evaluated memory in a time whose duration is $t_{2\_2}$ is $N_2$, and a quantity of charging/discharging times of the to-be-evaluated memory in a time whose duration is $t_{2\_n}$ is $N_n$. In this case, with reference to data shown by the "temperature-failure rate" curve in FIG. 13, that is, a failure rate is $P_{2\_1}$ when a value of the quantity of charging/discharging times is $N_1$, a failure rate is $P_{2\_2}$ when a value of the quantity of charging/discharging times is $N_2$, and a failure rate is $P_{2\_n}$ when a value of the quantity of charging/discharging times is $N_n$, the health degree impairment value of the to-be-evaluated memory for the factor 2 is $$P_2 = \frac{P_{2\_1} \times t_{2\_1} + P_{2\_2} \times t_{2\_2} + \ldots + P_{2\_n} \times t_{2\_n}}{t_{2\_1} + t_{2\_2} + \ldots + t_{2\_n}},$$

where $N_1$, $N_2$, $N_n$, $t_{2\_1}$, $t_{2\_2}$, and $t_{2\_n}$ are all positive numbers.

For example, when the to-be-evaluated memory is the memory named "DIMM000", and a health degree influencing factor corresponding to the to-be-evaluated memory is the factor 3, the memory evaluation apparatus may obtain, by referring to an existing "total running duration-failure rate" curve, a failure rate corresponding to the at least one running parameter value, and obtain a health degree impairment value (denoted as $P_3$) of the to-be-evaluated memory for the factor 3. For example, the at least one running parameter value of the to-be-evaluated memory is total running duration $L_1$. In addition, a failure rate is $P_{3\_1}$ when a value of the total running duration of the to-be-evaluated memory provided in the "total running duration-failure rate" curve is $L_1$. In this case, the health degree impairment value of the to-be-evaluated memory for the factor 3 is $P_3 = P_{3\_1}$, and $L_1$ is a positive number.

For example, when the to-be-evaluated memory is the memory named "DIMM000", and a corresponding health degree influencing factor is the factor 4, the memory evaluation apparatus may obtain, by referring to an existing "quantity of swap times-failure rate" curve, a failure rate corresponding to the at least one running parameter value, and obtain a health degree impairment value (denoted as $P_4$) of the to-be-evaluated memory for the factor 4. For example, the at least one running parameter value of the to-be-evaluated memory is a quantity $M_1$ of swap times. In addition, a failure rate is $P_{4\_1}$ when a value of the quantity of swap times of the to-be-evaluated memory provided in the "quantity of swap times-failure rate" curve is $M_1$. In this case, the health degree impairment value of the to-be-evaluated memory for the factor 4 is $P_4 = P_{4\_1}$, and $M_1$ is a positive number.

For example, when the to-be-evaluated memory is the memory named "DIMM000", and a health degree influencing factor corresponding to the to-be-evaluated memory is the factor 5, the memory evaluation apparatus may obtain, by referring to an existing "quantity of CEs-failure rate" curve, a failure rate corresponding to the at least one running parameter value, accumulate running duration, and then obtain, with reference to a change rate of each running parameter value, a health degree impairment value (denoted as $P_5$) of the to-be-evaluated memory for the factor 5. For example, the at least one running parameter value of the to-be-evaluated memory is a quantity $F_1$ of CEs, a quantity $F_2$ of CEs, ..., and a quantity $F_n$ of CEs. In addition, a quantity of CEs of the to-be-evaluated memory in the first time period whose duration is $t_{5\_1}$ is $F_1$, a quantity of CEs in the second time period whose duration is $t_{5\_1}$ is $F_2$, a quantity of CEs in the $n^{th}$ time period whose duration is $t_{5\_1}$ is $F_n$, where n is a positive integer. The memory evaluation apparatus collects, at a specific time interval, statistics on the quantity of CEs of the to-be-evaluated memory. In addition, a failure rate is $P_{5\_1}$ when a value of the quantity of CEs of the to-be-evaluated memory provided in the "quantity of CEs-failure rate" curve is $F_1$, a failure rate is $P_{5\_2}$ when a value of the quantity of CEs is $F_2$, and a failure rate is $P_{5\_n}$ when a value of the quantity of CEs is $F_n$. In addition, a change rate of the at least one running parameter value, that is, the quantity $F_1$ of CEs, the quantity $F_2$ of CEs, ..., and the quantity $F_n$ of CEs, may be denoted as $k_1$, where $k_1$ is a positive number greater than 0. In this case, the health degree impairment value of the to-be-evaluated memory for the factor 5 is $$P_5 = k_1 \times \frac{P_{5\_1} + P_{5\_2} + \ldots + P_{5\_n}}{n},$$

and $F_1$, $F_2$, $F_n$, and $t_{5\_1}$ are all positive numbers.

For example, when the to-be-evaluated memory is the memory named "DIMM000", and a health degree influencing factor corresponding to the to-be-evaluated memory is the factor 6, the memory evaluation apparatus may obtain, by referring to an existing "quantity of UCEs-failure rate" curve, a failure rate corresponding to the at least one running parameter value, to obtain a health degree impairment value (denoted as $P_6$) of the to-be-evaluated memory for the factor 6. In addition, a failure rate is $P_{6\_1}$ when a value of the quantity of UCEs of the to-be-evaluated memory provided in the "quantity of UCEs-failure rate" curve is $W_1$. In this case, the health degree impairment value of the to-be-evaluated memory for the factor 6 is $P_6=P_{6\_1}$, and $W_1$ is a positive integer.

For example, when the to-be-evaluated memory is the memory named "DIMM000", and a health degree influencing factor corresponding to the to-be-evaluated memory is the factor 7, the memory evaluation apparatus may obtain, by referring to an existing "performance value attenuation magnitude-failure rate" curve, a failure rate corresponding to the at least one running parameter value, and then obtain, with reference to a change rate of each running parameter value, a health degree impairment value (denoted as $P_7$) of the to-be-evaluated memory for the factor 7. For example, the at least one running parameter value of the to-be-evaluated memory is a performance value attenuation magnitude $Y_1$, a performance value attenuation magnitude $Y_2$, . . . , and a performance value attenuation magnitude $Y_n$, where n is a positive integer. In addition, a value of the performance value attenuation magnitude of the to-be-evaluated memory in the first time period whose duration is $t_{7\_1}$ is $Y_1$, a value of the performance value attenuation magnitude of the to-be-evaluated memory in the second time period whose duration is $t_{7\_1}$ is $Y_2$, and a value of the performance value attenuation magnitude of the to-be-evaluated memory in the $n^{th}$ time period whose duration is $t_{7\_1}$ is $Y_n$, where n is a positive integer. To be specific, the memory evaluation apparatus collects, at a specific time interval, statistics on a performance value and the performance value attenuation magnitude of the to-be-evaluated memory. In this case, a failure rate is $P_{7\_1}$ when the value of the performance value attenuation magnitude of the to-be-evaluated memory provided in the "performance value attenuation magnitude-failure rate" curve is $Y_1$, a failure rate is $P_{7\_2}$ when the value of the performance value attenuation magnitude is $Y_2$, and a failure rate is $P_{7\_n}$ when the value of the performance value attenuation magnitude is $Y_n$. In addition, a change rate of the at least one running parameter, that is, the performance value attenuation magnitude $Y_1$, the performance value attenuation magnitude $Y_2$, . . . , and the performance value attenuation magnitude $Y_n$, may be denoted as $k_2$, where $k_2$ is a positive number greater than 0. The health degree impairment value of the to-be-evaluated memory for the factor 7 is $$P_7 = k_2 \times \frac{P_{7\_1} + P_{7\_2} + \ldots + P_{7\_n}}{n},$$

where $Y_1$, $Y_2$, $Y_n$, and $t_{7\_1}$ are all positive numbers.

S403*b*: The memory evaluation apparatus obtains the health degree of the to-be-evaluated memory based on the health degree impairment value corresponding to each health degree influencing factor, the weight corresponding to each health degree influencing factor, and the second submodel.

For example, step 403*b* may be performed by the processor 111 in the memory evaluation apparatus 20 shown in FIG. 2B.

In this embodiment of the present application, the memory evaluation apparatus may obtain, based on the first submodel that corresponds to each health degree influencing factor in the health degree evaluation model, the health degree impairment value that is of the to-be-evaluated memory and that corresponds to each health degree influencing factor, to indicate impact of each health degree influencing factor on the health degree of the to-be-evaluated memory. In addition, the health degree impairment value corresponding to each health degree influencing factor and a weight corresponding to the health degree influencing factor are separately matched to the second submodel, to obtain the health degree of the to-be-evaluated memory affected by health degree influencing factors corresponding to different weights (different weights). In this way, different health degree evaluation models can be generated for different to-be-evaluated memories. This helps to increase accuracy of the health degree that is of the to-be-evaluated memory and that is obtained based on the health degree evaluation model.

In a possible implementation, each of the at least one health degree influencing factor included in the health degree evaluation model corresponds to one algorithm, where the algorithm may be addition and/or multiplication. The memory evaluation apparatus obtains the health degree of the to-be-evaluated memory based on the health degree impairment value corresponding to each health degree influencing factor, the weight corresponding to each health degree influencing factor, the second submodel, and the algorithm corresponding to each health degree influencing factor.

Figure 15:
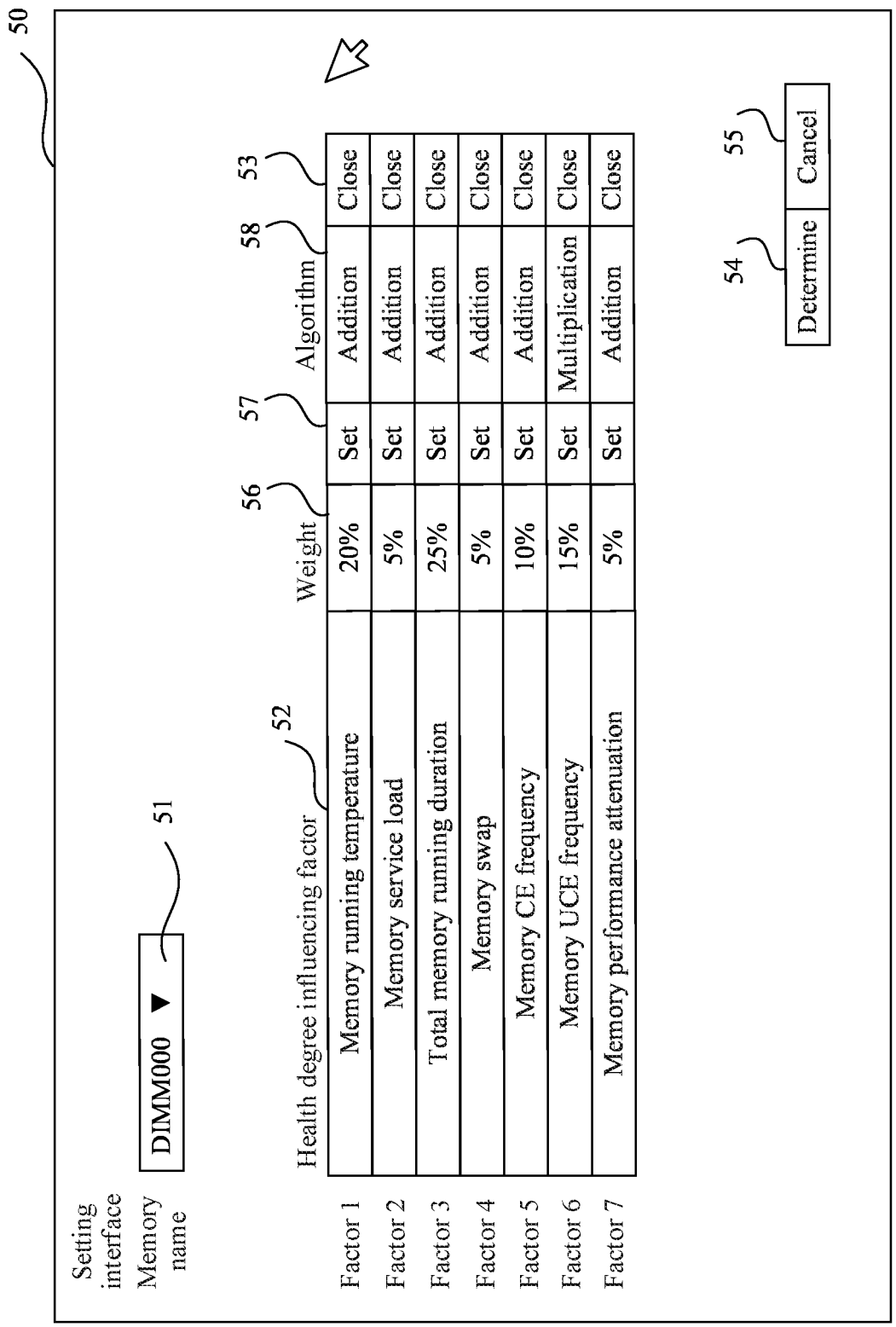
FIG. 15 is a schematic diagram of another MC interface according to an embodiment of the present application.

For example, FIG. 15 shows another MC interface according to an embodiment of the present application. Each of at least one health degree influencing factor included in the MC interface 50 shown in FIG. 15 corresponds to one "algorithm" option. For example, a factor 1 shown in FIG. 15 corresponds to an "algorithm" option 58.

Specifically, when an algorithm corresponding to each health degree influencing factor of a to-be-evaluated memory is addition, a memory evaluation apparatus multiplies each of at least one health degree impairment value of the to-be-evaluated memory by a corresponding weight based on a second model, to obtain at least one health degree component of the to-be-evaluated memory, and accumulate the at least one health degree component to obtain a health degree of the to-be-evaluated memory. For example, the at least one health degree influencing factor corresponding to the to-be-evaluated memory includes the factor 1, a factor 2, and a factor 5, and weights of the factor 1, the factor 2, and the factor 5 are respectively 20%, 5%, and 10%. A health degree component (denoted as $H_1$) corresponding to the factor 1 in the at least one health degree component is $H_1=P_1\times20\%$, a health degree component (denoted as $H_2$) corresponding to the factor 2 is $H_2=P_2\times5\%$, and a health degree component (denoted as $H_5$) corresponding to the factor 5 is $H_5=P_5\times10\%$. In this case, the health degree (denoted as H) of the to-be-evaluated memory is $H=P_1+P_2+P_5$.

When an algorithm corresponding to one health degree influencing factor of the to-be-evaluated memory is multiplication, that the memory evaluation apparatus obtains the health degree of the to-be-evaluated memory based on a health degree impairment value corresponding to each health degree influencing factor, the weight corresponding to each health degree influencing factor, and the second submodel includes that the memory evaluation apparatus uses a health degree impairment value of the to-be-evaluated memory as the health degree of the to-be-evaluated memory based on the second model. For example, for the to-be-evaluated memory, if an algorithm corresponding to a factor 3 is multiplication, the health degree of the to-be-evaluated memory is $H=H_3=P_3$, where $H_3$ is a health degree component corresponding to the factor 3 of to-be-evaluated memory, and $P_3$ is a health degree impairment value corresponding to the factor 3 of to-be-evaluated memory.

It should be noted that, in addition to the addition and the multiplication, the algorithm corresponding to the health degree influencing factor in a health degree evaluation model provided in this embodiment of the present application may alternatively be another algorithm, for example, an integration algorithm. For specific description that the algorithm corresponding to the health degree influencing factor provided in this embodiment of the present application is the integration algorithm, reference may be made to related description in the foregoing embodiment that the algorithm corresponding to the health degree influencing factor is the addition. Details are not described herein.

For one memory in the memory evaluation apparatus, that is, one memory in a server, while quantizing impact of each health degree influencing factor on a health degree of the memory based on a weight corresponding to each the health degree influencing factor of the memory, the memory evaluation apparatus may further quantize an impact extent of each the health degree influencing factor on the health degree of the memory based on an algorithm corresponding to each health degree influencing factor. This helps to increase accuracy of the health degree of the to-be-evaluated memory.

Figure 16:
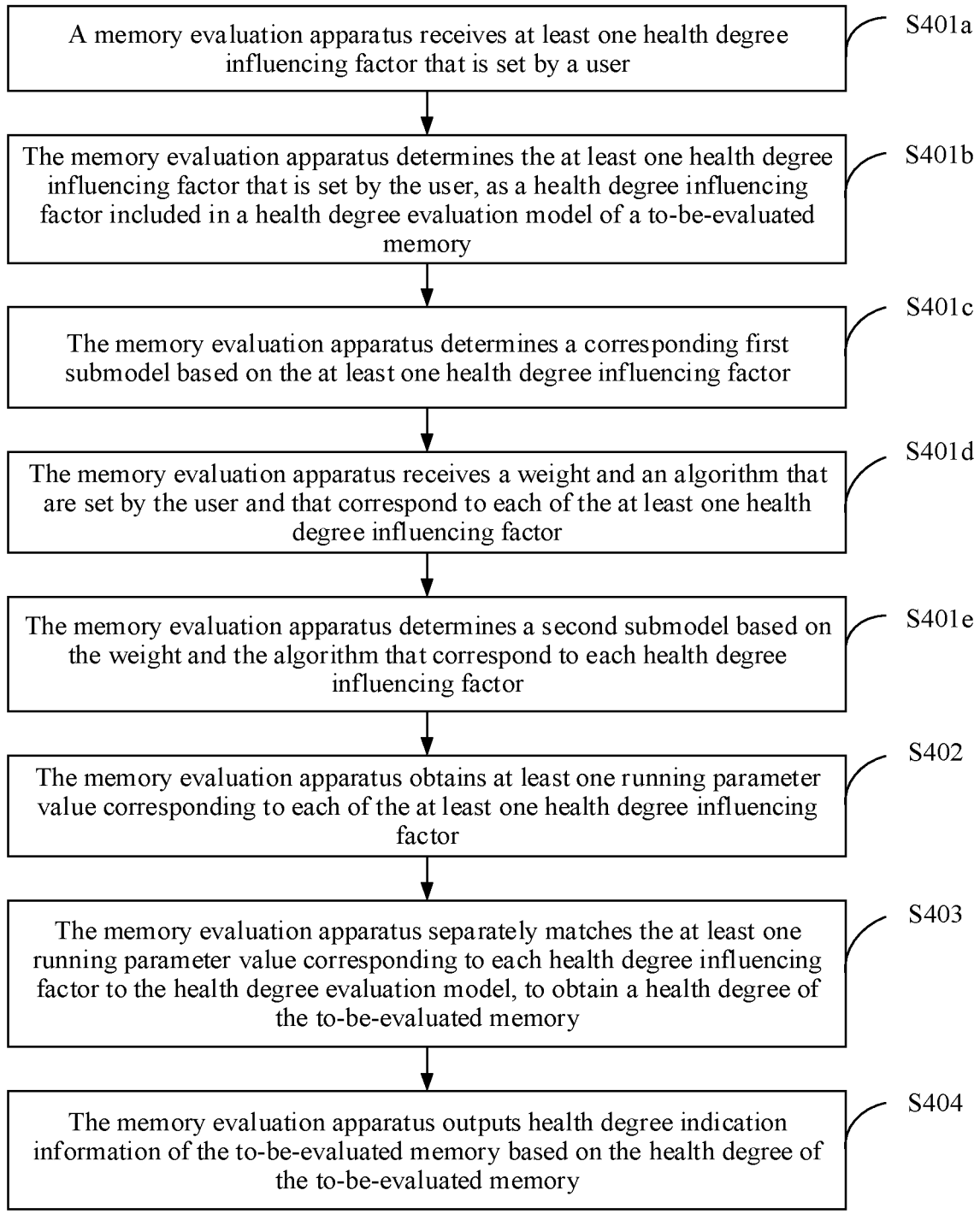
FIG. 16 is another schematic flowchart of a memory evaluation method according to an embodiment of the present application.

In a specific embodiment, the health degree evaluation model of the to-be-evaluated memory provided in the embodiments of the present application includes a first submodel that corresponds to each health degree influencing factor and a second submodel. Therefore, in determining the health degree evaluation model of the to-be-evaluated memory, the memory evaluation apparatus further determines the first submodel that corresponds to each health degree influencing factor in the health degree evaluation model and the second submodel of the to-be-evaluated memory. Specifically, in the memory evaluation method provided in this embodiment of the present application, step 401 includes step 401a to step 401e. For example, FIG. 16 is a schematic flowchart of another memory evaluation method according to an embodiment of the present application. In the method shown in FIG. 16, step 401 in FIG. 4 may include step 401a to step 401e.

S401a: The memory evaluation apparatus receives the at least one health degree influencing factor that is set by a user.

For example, step 401a may be performed by the communications interface 114 in the memory evaluation apparatus 20 shown in FIG. 2B.

It should be noted that the at least one health degree influencing factor is preset in the health degree evaluation model provided in this embodiment of the present application, and the user may select a health degree influencing factor for the to-be-evaluated memory from the at least one preset health degree influencing factor.

Specifically, referring to the MC interface shown in FIG. 15 in the foregoing embodiment, the MC interface 50 includes the factor 1 to a factor 7. For the to-be-evaluated memory (a memory named "DIMM000"), the user may perform a tap/click operation on a "close" option corresponding to each factor in the MC interface 50 by using an input device, and select the at least one health influencing factor corresponding to the to-be-evaluated memory from the factor 1 to the factor 7.

S401b: The memory evaluation apparatus determines the at least one health degree influencing factor that is set by the user, as a health degree influencing factor included in the health degree evaluation model of the to-be-evaluated memory.

For example, step 401b may be performed by the processor 111 in the memory evaluation apparatus 20 shown in FIG. 2B.

A processor in the memory evaluation apparatus may receive a tap/click operation instruction from the input device, and determine the at least one health degree influencing factor of the to-be-evaluated memory.

For example, for the to-be-evaluated memory (the memory named "DINM000"), the user may perform a tap/click operation, by using the input device, on a "close" option corresponding to each of a factor 5 to a factor 7 in the MC interface 50 shown in FIG. 5. The processor in the memory evaluation apparatus may generate a corresponding tap/click operation instruction, and determine that the at least one health degree influencing factor of the to-be-evaluated memory is the factor 1 to a factor 4.

S401c: The memory evaluation apparatus determines a corresponding first submodel based on the at least one health degree influencing factor.

For example, step 401c may be performed by the processor 111 in the memory evaluation apparatus 20 shown in FIG. 2B.

A first submodel of each of the at least one health degree influencing factor provided in the foregoing embodiment includes data of a relationship between a running parameter corresponding to the health degree influencing factor and a failure rate parameter, for example, a curve that describes how a failure rate parameter of the to-be-evaluated memory changes with a running parameter corresponding to each health degree influencing factor.

For one health degree influencing factor, the health degree evaluation model provided in this embodiment of the present application may include a curve that describes how values of a plurality of failure rate parameters (failure rates) change with values of running parameters corresponding to the health degree influencing factor. To be specific, one first submodel includes the curve that describes how the values of the plurality of failure rates change with the values of the running parameters corresponding to the health degree influencing factor.

It should be noted that the memory evaluation apparatus may autonomously obtain, through matching, the curve that describes how the failure rate of the to-be-evaluated memory change with the running parameter corresponding to each health degree influencing factor based on an inherent parameter (for example, a parameter such as a memory capacity) of the to-be-evaluated memory, or the user may select a corresponding curve from a plurality of curves included in the first submodel of one health degree influencing factor.

Figure 17:
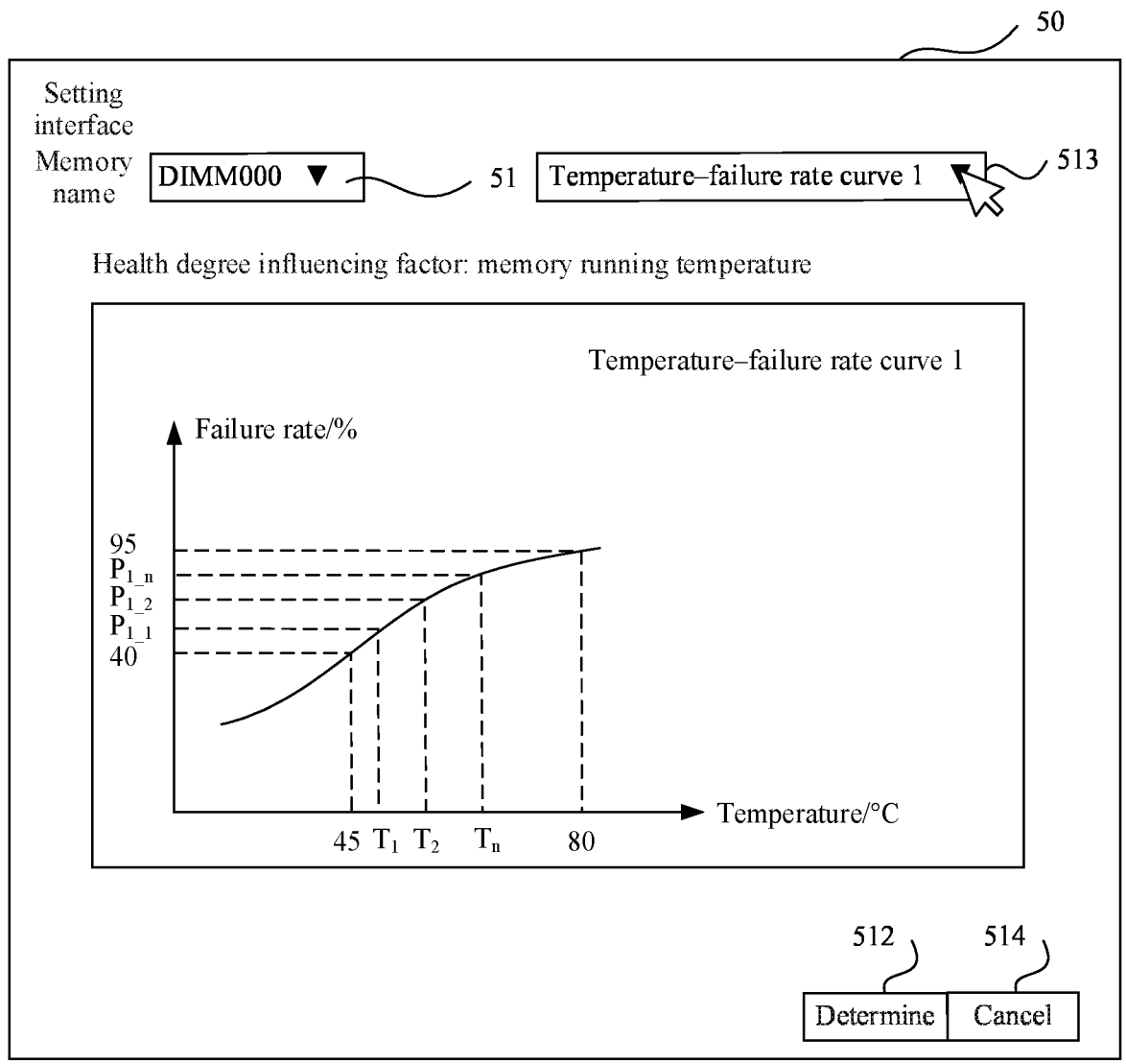
FIG. 17 is a schematic diagram of another MC interface according to an embodiment of the present application.
Figure 18:
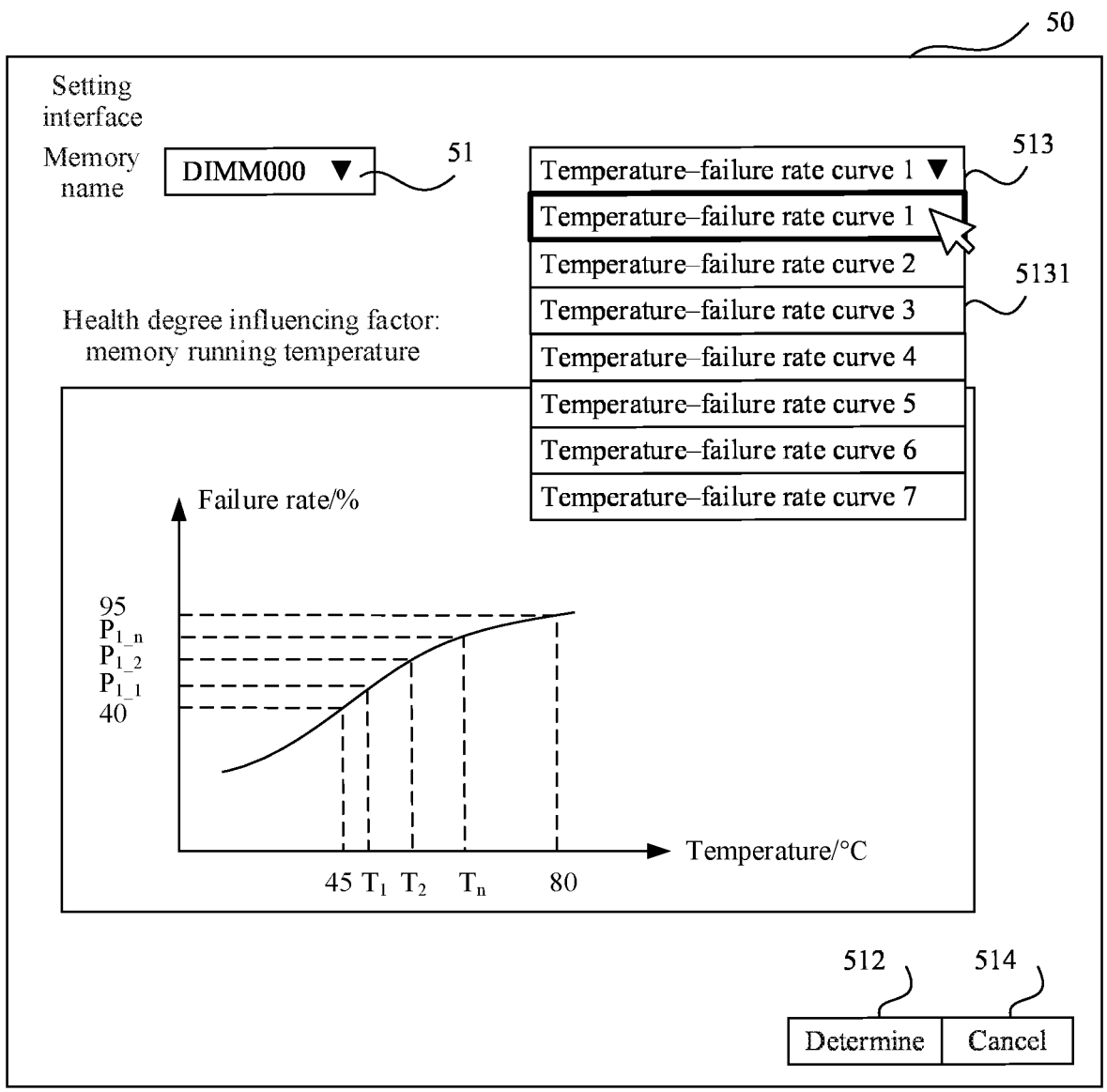
FIG. 18 is a schematic diagram of another MC interface according to an embodiment of the present application.

For example, FIG. 17 is a schematic diagram of another MC interface according to an embodiment of the present application. Referring to the MC interface 50 shown in FIG. 12, an MC interface 50 shown in FIG. 17 further includes an option 513 that allows a user to select a "temperature-failure rate curve 1". The option 513 includes a "▼" option, and the "▼" option may correspond to a drop-down window. After a tap/click operation is performed on the "▼" option in the option 513 included in the MC interface 50 shown in FIG. 17, a processor in a memory evaluation apparatus may generate a corresponding tap/click operation instruction, and instruct a display to display an MC interface 50 that includes a window 5131 and that is shown in FIG. 18. The window 5131 includes seven options: a "temperature-failure rate curve 1" option, a "temperature-failure rate curve 2" option, a "temperature-failure rate curve 3" option, a "temperature-failure rate curve 4" option, a "temperature-failure rate curve 5" option, a "temperature-failure rate curve 6" option, and a "temperature-failure rate curve 7".

It may be determined that, after a user performs a tap/click operation on the "temperature-failure rate curve 1" option in the drop-down window 5131 corresponding to the option 513 shown in the MC interface 50 shown in FIG. 18, a processor in a memory evaluation apparatus may generate a corresponding tap/click operation instruction, and instruct a display to display the MC interface 50 shown in FIG. 17. In addition, the MC interface 50 shown in FIG. 18 and FIG. 19 further includes a "cancel" option 514. The "cancel" option 514 is used to cancel the "temperature-failure rate curve 1" option selected by the user.

S401*d*: The memory evaluation apparatus receives a weight and an algorithm that are set by the user and that correspond to each of the at least one health degree influencing factor.

For example, step 401*c* may be performed by the communications interface 114 in the memory evaluation apparatus 20 shown in FIG. 2B.

The foregoing algorithm includes addition and/or multiplication. Certainly, the foregoing algorithm may alternatively be an integration algorithm or the like. In this embodiment of the present application, only an example in which the foregoing algorithm is the addition and/or the multiplication is used to describe the memory evaluation method in this embodiment of the present application.

Figure 19:
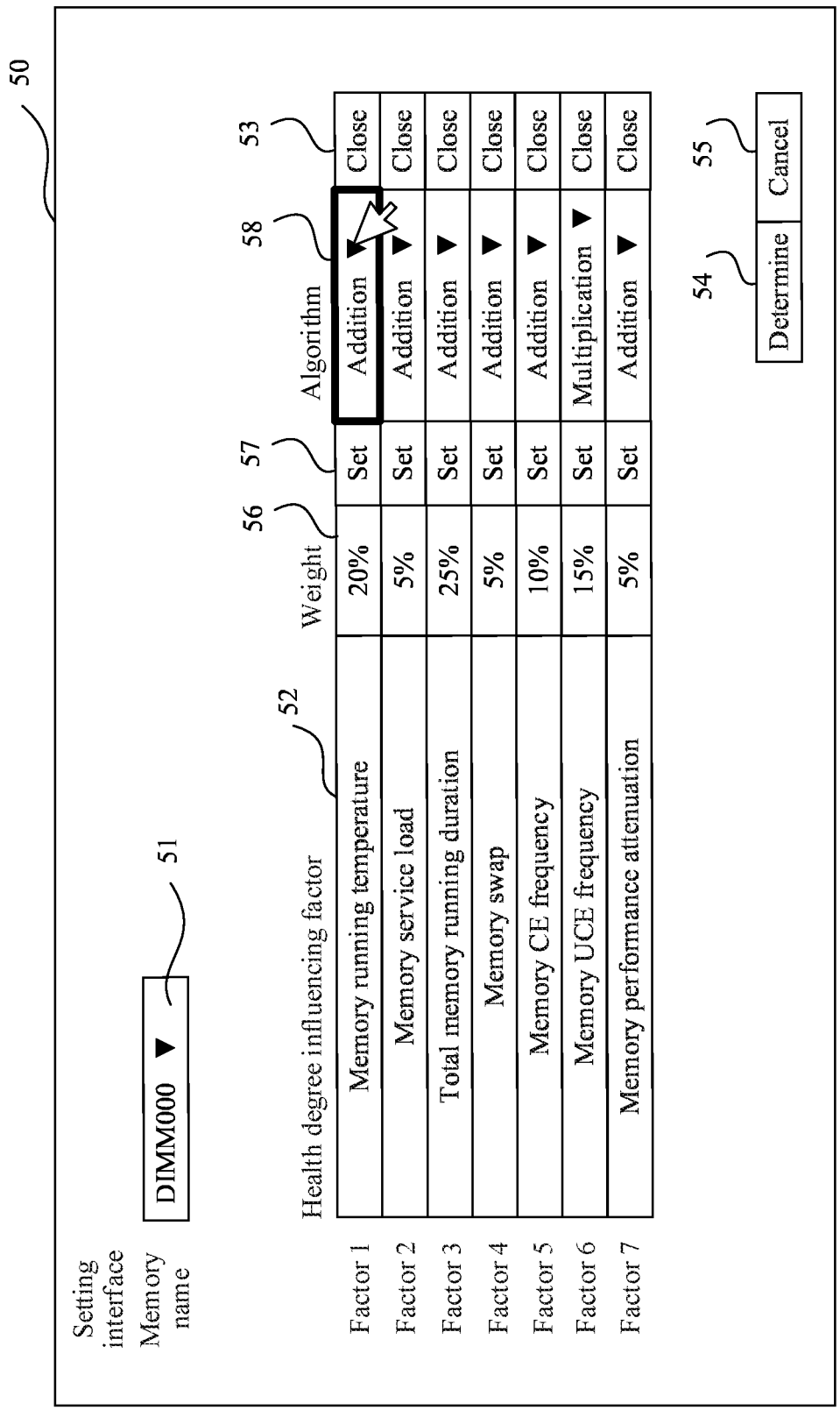
FIG. 19 is a schematic diagram of another MC interface according to an embodiment of the present application.
Figure 20:
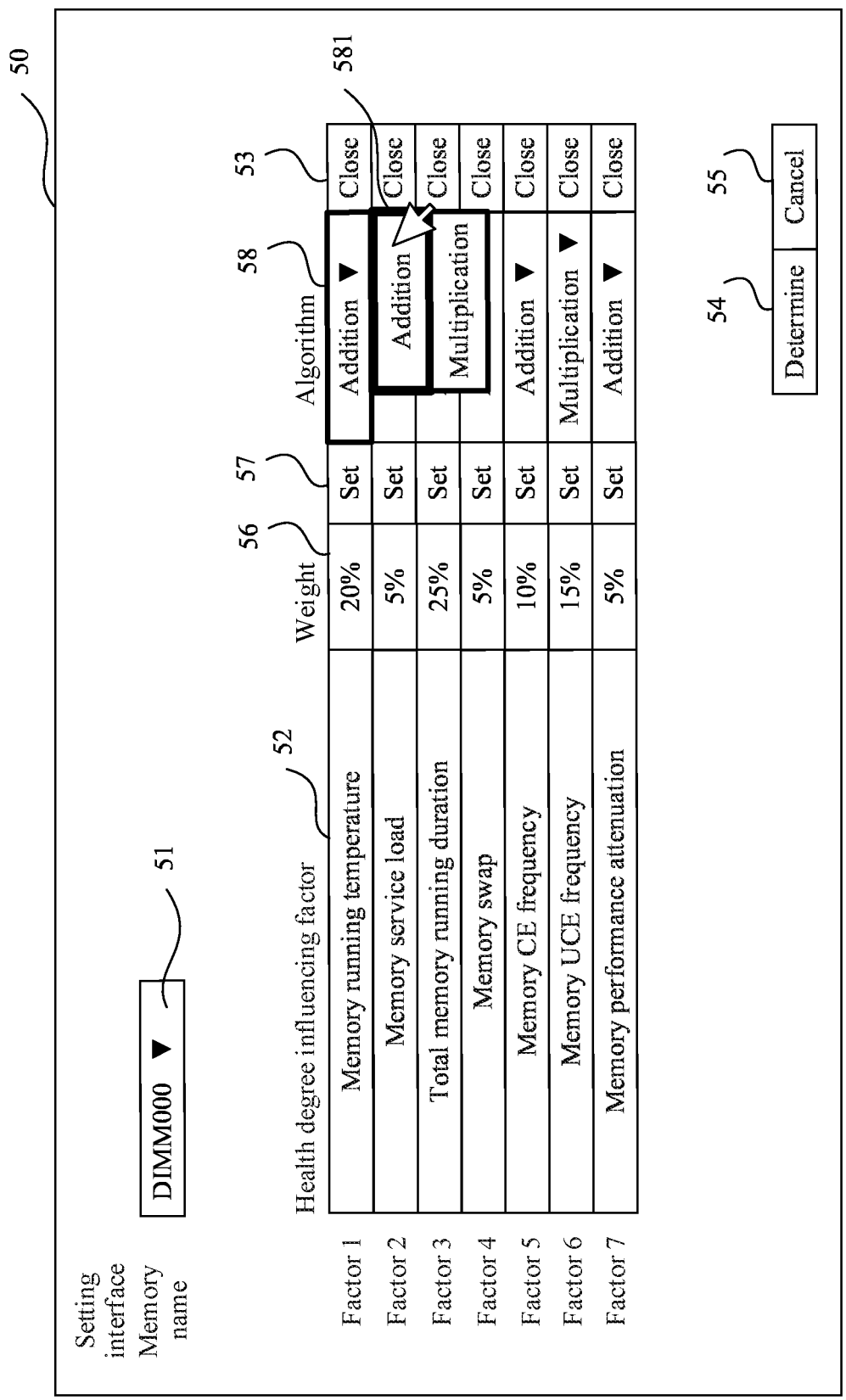
FIG. 20 is a schematic diagram of another MC interface according to an embodiment of the present application.

For example, FIG. 19 is a schematic diagram of another MC interface according to an embodiment of the present application. Referring to the MC interface 50 shown in FIG. 10, a weight corresponding to each health degree influencing factor in an MC interface 50 shown in FIG. 19 may be set by a user by using an input device. Referring to the MC interface 50 shown in FIG. 15, an algorithm option corresponding to each health degree influencing factor in the MC interface 50 shown in FIG. 19 further includes a "▼" option, and the "▼" option corresponds to one drop-down window. For example, the user performs a tap/click operation on a "▼" option in an option 58 corresponding to a factor 1 in the MC interface 50 shown in FIG. 19. A processor in a memory evaluation apparatus may generate a corresponding tap/click operation instruction, and instruct a display to display a drop-down window 581 in an MC interface 50 shown in FIG. 20. Specifically, after the user performs a tap/click operation on an "addition" option in the drop-down window 581 corresponding to the option 58 shown in the MC interface 50 shown in FIG. 20, a processor in a memory evaluation apparatus may generate a corresponding tap/click operation instruction, and instruct a display to display the MC interface 50 shown in FIG. 19.

S401*e*: The memory evaluation apparatus determines a second submodel based on the weight and the algorithm that correspond to each health degree influencing factor.

For example, step 401*c* may be performed by the processor 111 in the memory evaluation apparatus 20 shown in FIG. 2B.

Referring to the MC interface 50 shown in FIG. 19, a second submodel of a memory (the to-be-evaluated memory) named "DIMM000" may be determined by using a "weight" option and an "algorithm" option that correspond to each health degree influencing factor shown in the MC interface 50. The user may perform tap/click operations, by using the input device, on the "weight" option and the "algorithm" option that correspond to each health degree influencing factor in the MC interface 50 shown in FIG. 19, so that the processor in the memory evaluation apparatus generates corresponding tap/click operation instructions.

It should be noted that, different to-be-evaluated memories may have different health degree influencing factors, and data about how failure rate parameters corresponding to health degree influencing factors of different to-be-evaluated memories change with corresponding running parameters may be different. Therefore, health degree evaluation models corresponding to different to-be-evaluated memories may be different. In the memory evaluation method provided in this embodiment of the present application, the memory evaluation apparatus can determine first submodels corresponding to health degree influencing factors for different to-be-evaluated memories and second submodels for the to-be-evaluated memories, that is, determine the health degree evaluation models for the different to-be-evaluated memories. In this way, the health degree evaluation model provided in this embodiment of the present application can be proper for the to-be-evaluated memory. This helps to increase accuracy of the health degree, of the to-be-evaluated memory, obtained based on the health degree evaluation model.

In an embodiment, the at least one health degree influencing factor in the health degree evaluation model provided in this embodiment of the present application may be selected by the user for different to-be-evaluated memories. A plurality of curves included in the first submodel that corresponds to each health degree influencing factor in the health degree evaluation model may also be selected by the user for different to-be-evaluated memories. In addition, due to improvement of a manufacturing process of the memory, a health degree influencing factor of the to-be-evaluated memory and data about how a failure rate corresponding to the health degree influencing factor changes with a corresponding running parameter may also change. Therefore, in the memory evaluation method provided in this embodiment of the present application, adding, by the user, a health degree influencing factor to the health degree evaluation model and adding, by the user, a related curve to a first submodel that corresponds to one health degree influencing factor are further supported.

Figure 21:
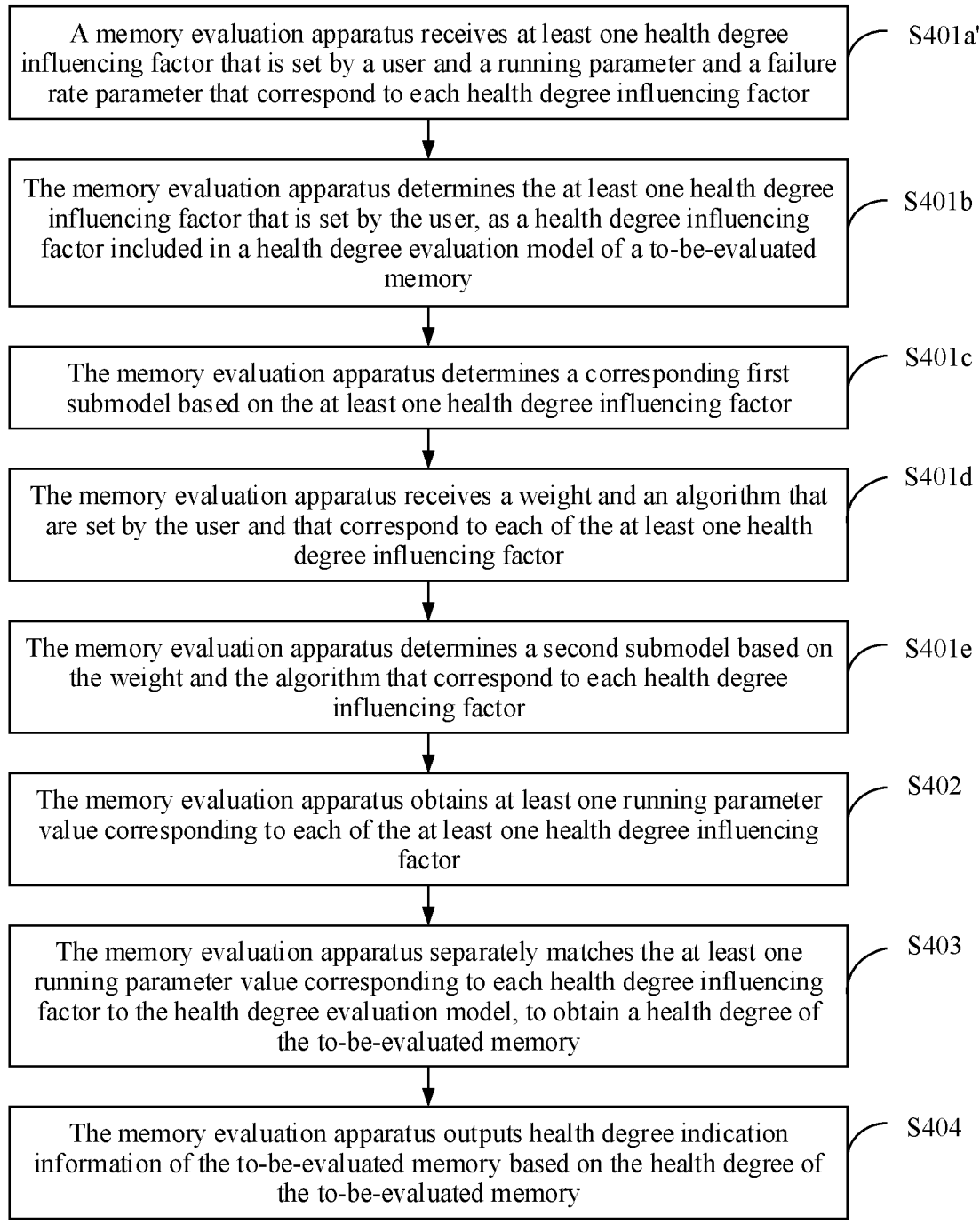
FIG. 21 is another schematic flowchart of a memory evaluation method according to an embodiment of the present application.

Specifically, in the memory evaluation method provided in this embodiment of the present application, step 401*a* may be replaced with step 401*a*'. For example, FIG. 21 is a schematic flowchart of another memory evaluation method according to an embodiment of the present application. In the method shown in FIG. 21, step 401*a* shown in FIG. 16 may be replaced with step 401*a*'.

401*a*': The memory evaluation apparatus receives the at least one health degree influencing factor that is set by a user and a running parameter and a failure rate parameter that correspond to each health degree influencing factor.

The running parameter and the failure rate parameter that correspond to each health degree influencing factor that is set by the user are data about how a value of the failure rate parameter changes with a value of the running parameter, for example, a curve that describes how the value of the failure rate parameter changes with the value of the running parameter.

Figure 22:
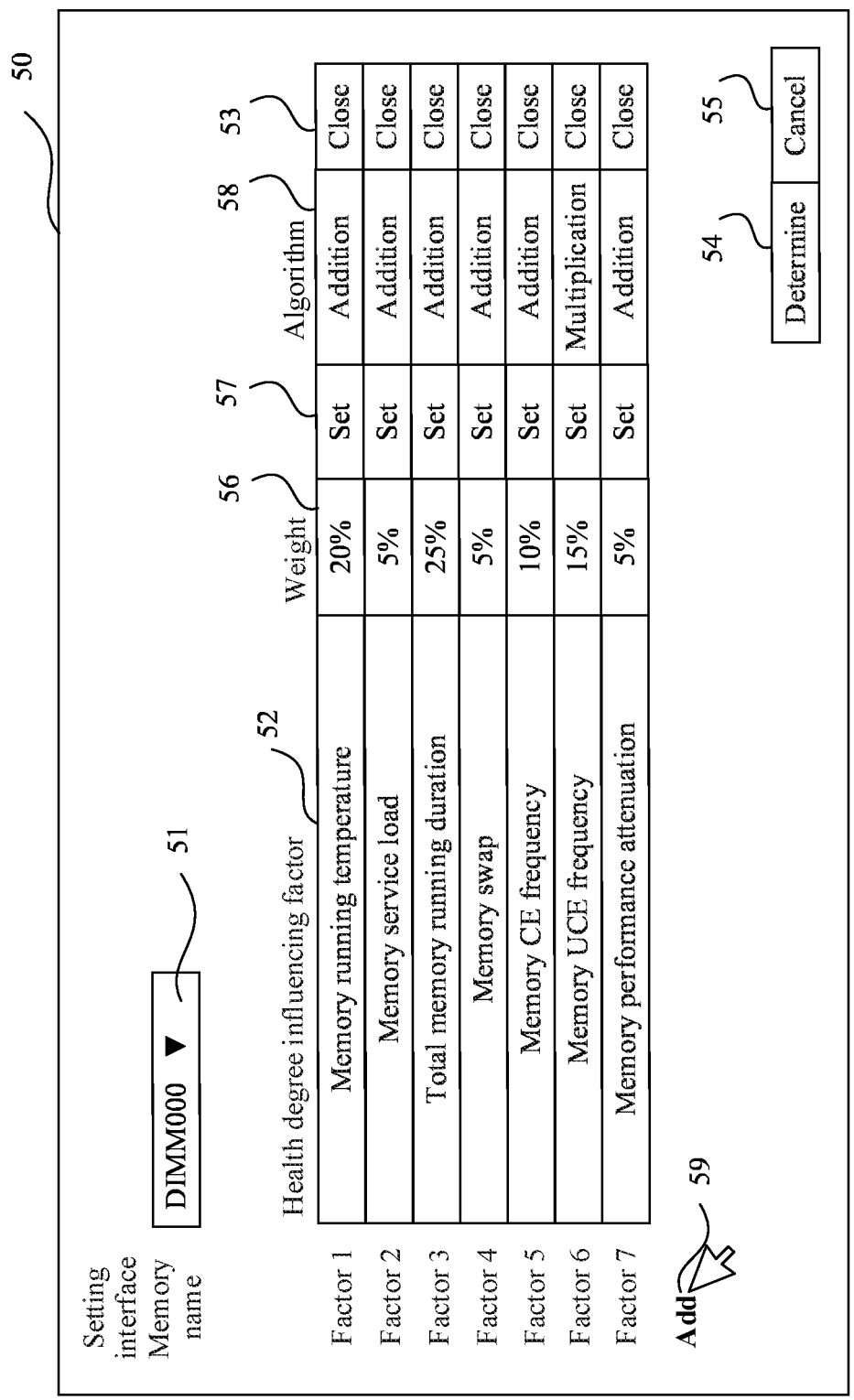
FIG. 22 is a schematic diagram of another MC interface according to an embodiment of the present application.
Figure 23:
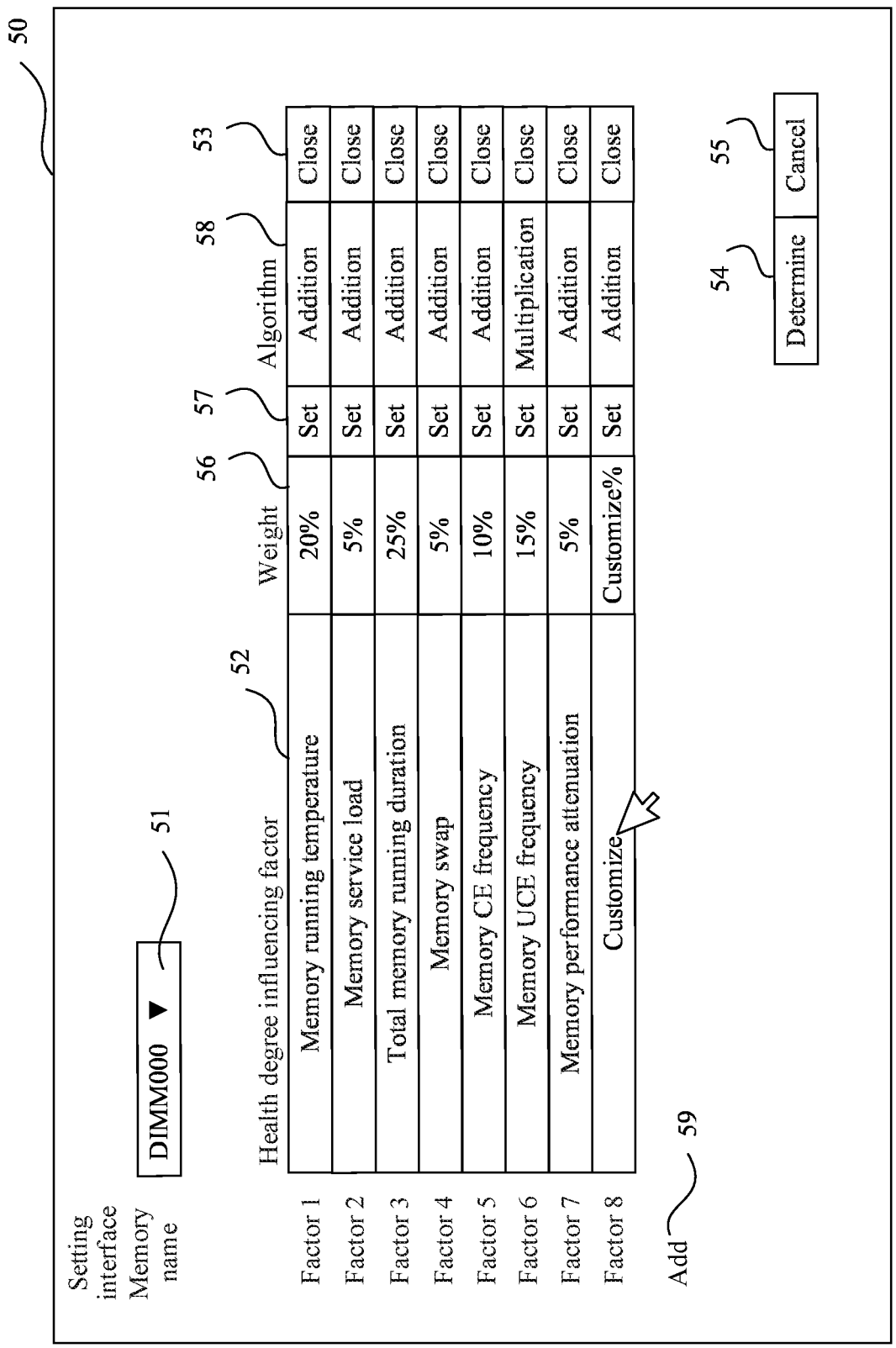
FIG. 23 is a schematic diagram of another MC interface according to an embodiment of the present application.

For example, an MC interface 50 shown in FIG. 22 or FIG. 23 further includes an "add" option 59, and the "add" option 59 is used to add one health degree influencing factor to a health degree evaluation model. After a user performs a tap/click operation on the "add" option 59 in the MC interface 50 shown in FIG. 22 by using an input device, a processor in a memory evaluation apparatus may generate a corresponding tap/click operation instruction, and instruct a display to display a factor 8 included in an MC interface 50 shown in FIG. 23, and a "set" option, a "weight" option, an "algorithm" option, and the like that correspond to the factor 8 and that are included in the MC interface 50 shown in FIG. 23.

Figure 24:
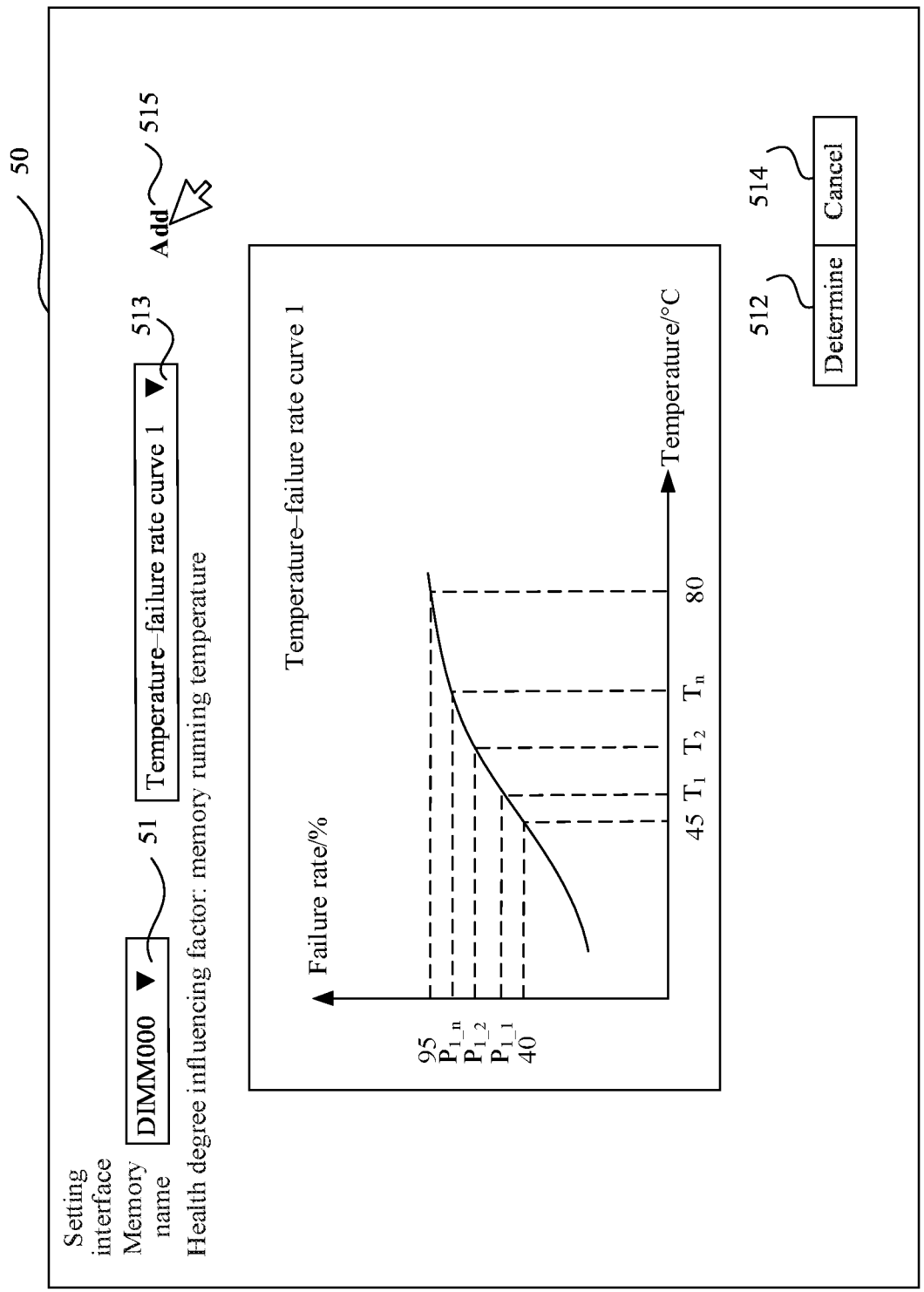
FIG. 24 is a schematic diagram of another MC interface according to an embodiment of the present application.
Figure 25:
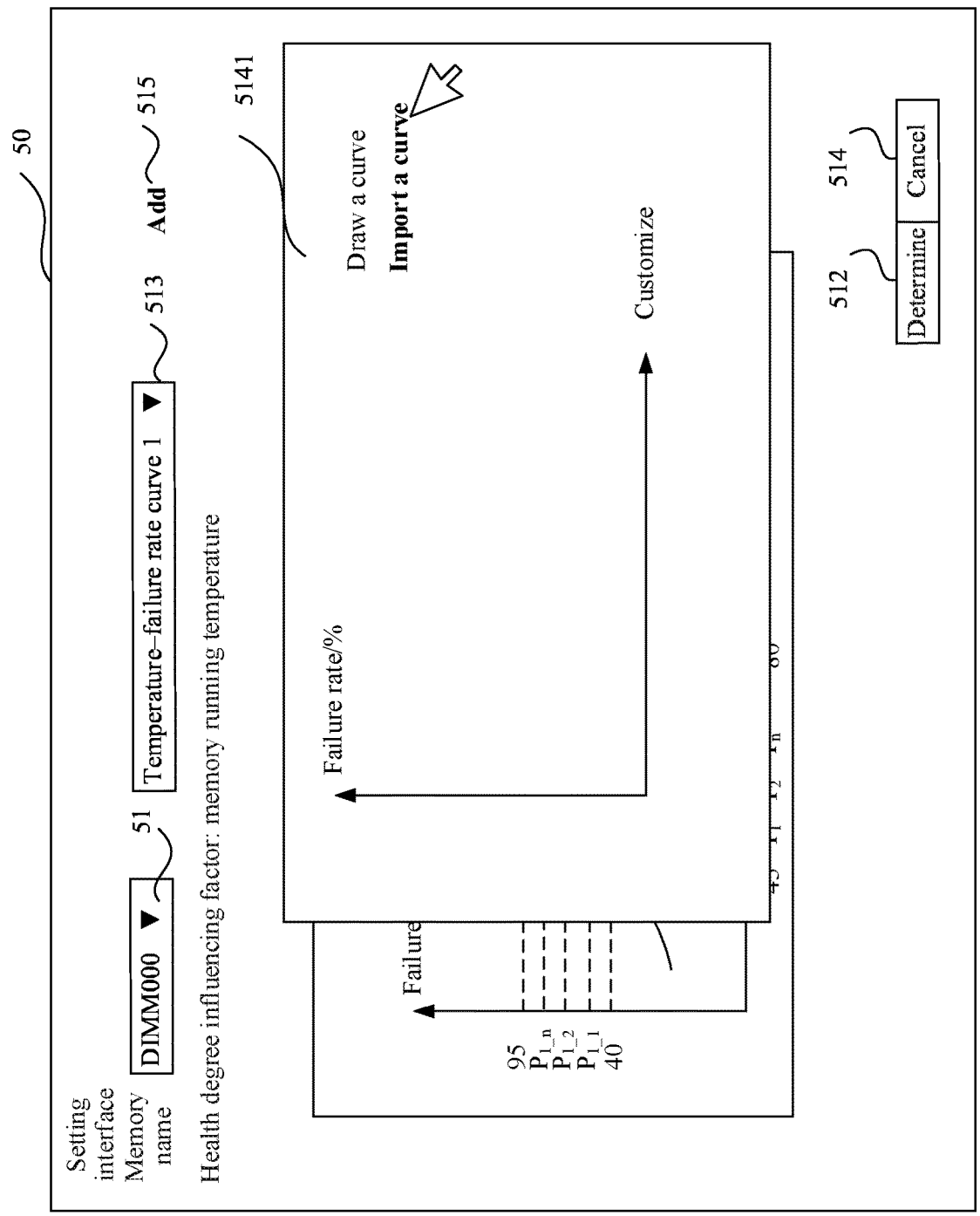
FIG. 25 is a schematic diagram of another MC interface according to an embodiment of the present application.

Further, FIG. 24 is a schematic diagram of another MC interface according to an embodiment of the present application. Referring to the MC interfaces 50 shown in FIG. 17 and FIG. 18, an MC interface 50 shown in FIG. 24 further includes an "add" option 515. The "add" option 515 is used to add a curve that describes how a failure rate changes with a corresponding running parameter to one health degree influencing factor in a health degree evaluation model. For example, after a user performs a tap/click operation on the "add" option 515 in the MC interface 50 shown in FIG. 24 by using an input device, a processor in a memory evaluation apparatus may generate a corresponding tap/click operation instruction, and instruct a display to display an MC interface 50 shown in FIG. 25. The MC interface 50 shown in FIG. 25 includes a "draw a curve" option and an "import a curve" option. The "draw a curve" option is used to provide a window 5141 for a user to draw a curve that describes how a failure rate corresponding to one health degree influencing factor of a to-be-evaluated memory changes with a corresponding running parameter. The "import a curve" option is used to provide a window 5141 for a user to import a curve that describes how a failure rate corresponding to one health degree influencing factor of a to-be-evaluated memory changes with a corresponding running parameter.

It should be noted that, according to the health degree evaluation model provided in this embodiment of the present application, the user may select a health degree influencing factor of the to-be-evaluated memory from the health degree evaluation model and data (a curve) about how a failure rate corresponding to each health degree influencing factor changes with a corresponding running parameter, or may add a health degree influencing factor of the to-be-evaluated memory to the health degree evaluation model and data (a curve) about how a failure rate corresponding to each health degree influencing factor changes with a corresponding running parameter. Therefore, the health degree evaluation model of the to-be-evaluated memory is more proper for the to-be-evaluated memory. This helps to increase accuracy of the health degree, of the to-be-evaluated memory, obtained based on the health degree evaluation model of the to-be-evaluated memory.

Figure 26:
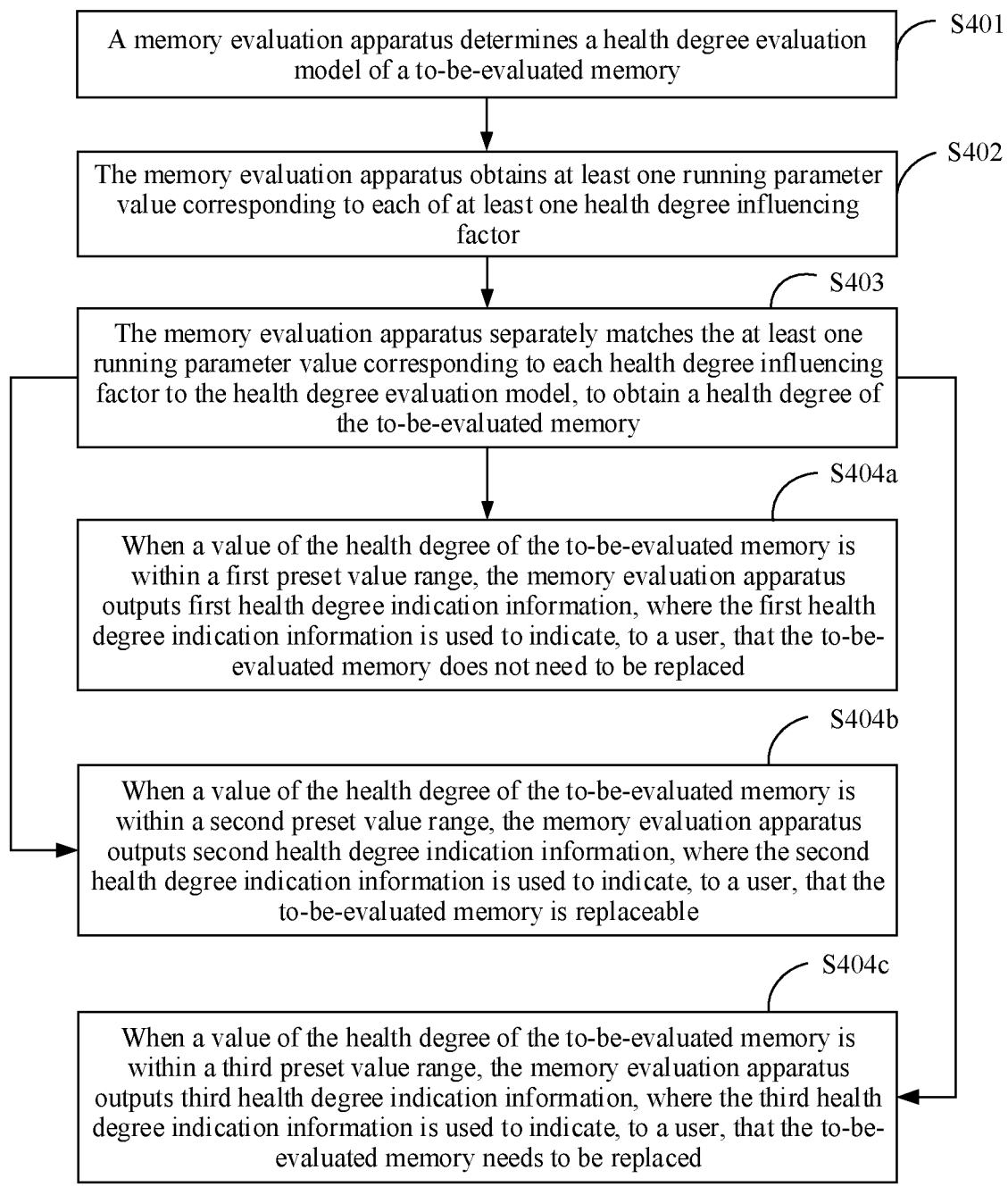
FIG. 26 is another schematic flowchart of a memory evaluation method according to an embodiment of the present application.

In an embodiment, in a process of outputting health degree indication information of the to-be-evaluated memory based on the health degree of the to-be-evaluated memory, the memory evaluation apparatus may match a value of the health degree of the to-be-evaluated memory to a preset value range, to obtain the health degree indication information of the to-be-evaluated memory. Specifically, step 404 in the foregoing embodiment may include step 404a to step 404c. For example, FIG. 26 is a schematic flowchart of another memory evaluation method according to an embodiment of the present application. In the memory evaluation method shown in FIG. 26, step 404 shown in FIG. 4 may include step 404a to step 404c.

S404a: When the value of the health degree of the to-be-evaluated memory is within a first preset value range, the memory evaluation apparatus outputs first health degree indication information, where the first health degree indication information is used to indicate, to the user, that the to-be-evaluated memory does not need to be replaced.

S404b: When the value of the health degree of the to-be-evaluated memory is within a second preset value range, the memory evaluation apparatus outputs second health degree indication information, where the second health degree indication information is used to indicate, to the user, that the to-be-evaluated memory is replaceable.

S404c: When the value of the health degree of the to-be-evaluated memory is within a third preset value range, the memory evaluation apparatus outputs third health degree indication information, where the third health degree indication information is used to indicate, to the user, that the to-be-evaluated memory needs to be replaced.

For example, the first preset value range may be [75, 100], the second preset value range may be [45, 74], and the third preset value range may be [0, 44]. Certainly, the first preset value range, the second preset value range, and the third preset value range may be alternatively other ranges. This is not limited in this embodiment of the present application.

It may be determined that, according to the memory evaluation method provided in this embodiment of the present application, the health degree indication information of the to-be-evaluated memory may be displayed to the user by using an MC interface displayed by the display.

FIG. 27 is a schematic diagram of another MC interface according to an embodiment of the present application. Referring to the MC interface shown in FIG. 3, each memory in the MC interface 30 shown in FIG. 27 further corresponds to one "health degree" option 32. Health degree indication information of a to-be-evaluated memory displayed in the MC interface is a value of health of the to-be-evaluated memory. Within a first preset value range, a second preset value range, and a third preset value range, values of health degrees are sequentially highlighted in health degree indication information of the to-be-evaluated memory. For example, a normal font (denoted as a font 1) is used in health degree indication information that is of a memory named "DINM000", a memory named "DIMM002", and a memory named "DIMM011" and that is displayed in the MC interface in FIG. 27, to indicate, to a user, that the memory does not need to be replaced. A font (denoted as a font 2) that is more highlighted than the font 1 is used in displayed health degree indication information of a memory named "DIMM012", to indicate, to the user, that the memory is replaceable, to be specific, the memory may not be replaced immediately. A font (denoted as a font 3) that is more highlighted than the font 2 is used in displayed health degree indication information of a memory named "DIMM001" and a memory named "DIMM010", to indicate, to the user, that the memory needs to be replaced immediately.

Optionally, that the font 1, the font 2, and the font 3 are successively more highlighted means that the font 1, the font 2, and the font 3 are successively enlarged and bold, or colors of the font 1, the font 2, and the font 3 are successively black, orange, and red.

Certainly, not only the foregoing highlighted font may be used in the health degree indication information that is of the to-be-evaluated memory and that is displayed in the MC interface provided in this embodiment of the present application, but also another manner may be used to highlight the health degree indication information that is of the to-be-evaluated memory and that is displayed in the MC interface provided in this embodiment of the present application.

For example, FIG. 28 is a schematic diagram of another MC interface 30 according to an embodiment of the present application.

When a value of a health degree of a to-be-evaluated memory is within a first preset value range, health degree indication information that is of the to-be-evaluated memory and that is displayed in the MC interface is "healthy", to indicate, to a user, that the to-be-evaluated memory does not need to be replaced. For example, health degree indication information of a memory named "DIMM000", a memory named "DIMM002", and a memory named "DIMM011" shown in FIG. 28 is "healthy".

When a value of a health degree of a to-be-evaluated memory is within a second preset value range, health degree indication information that is of the to-be-evaluated memory and that is displayed in the MC interface is "mediocre", to indicate, to a user, that the to-be-evaluated memory is replaceable. In this case, health degree indication information that is of a memory named "DIMM012" and that is displayed in the MC interface is "mediocre".

When a value of a health degree of a to-be-evaluated memory is within a third preset value range, health degree indication information that is of the to-be-evaluated memory and that is displayed in the MC interface is "alarm", to indicate, to a user, that the to-be-evaluated memory needs to be replaced. In this case, health degree indication information that is of a memory named "DIMM001" and a memory named "DIMM010" and that is displayed in the MC interface is "alarm".

It should be noted that in the memory evaluation method provided in this embodiment of the present application, in a process of displaying the health degree indication information of the to-be-evaluated memory to the user, the memory evaluation apparatus may display different health degree indication information for to-be-evaluated memories with different health degree values. In this way, when the to-be-evaluated memory is not faulty and a health degree of the memory is relatively low (a value of the health degree is relatively small), the memory evaluation apparatus can prompt the user to replace the to-be-evaluated memory, so that the to-be-evaluated memory can support normal operations of the server.

Figure 29:
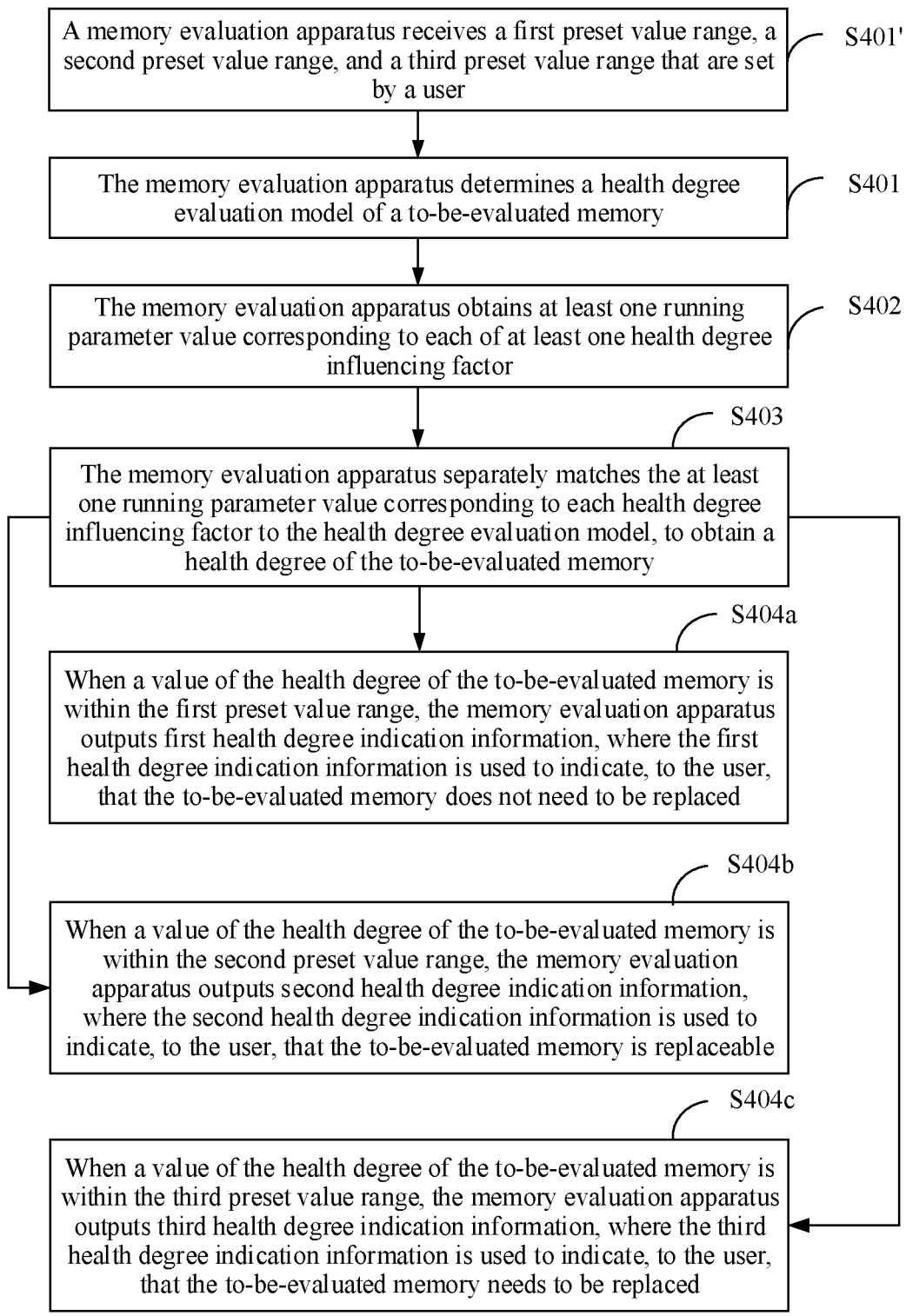
FIG. 29 is another schematic flowchart of a memory evaluation method according to an embodiment of the present application.

It may be determined that the first preset value range and the second preset value range provided in this embodiment of the present application may alternatively be autonomously set by the user based on experience. Specifically, the memory evaluation method provided in this embodiment of the present application may further include step 401' before step 401. For example, FIG. 29 is a schematic flowchart of another memory evaluation method according to an embodiment of the present application. The memory evaluation method shown in FIG. 29 may further include step 401' before step 401 shown in FIG. 26.

S401': The memory evaluation apparatus receives a first preset value range, a second preset value range, and a third preset value range that are set by a user.

For example, step 401' may be performed by the communications interface 114 in the memory evaluation apparatus 20 shown in FIG. 2B.

Figure 31:
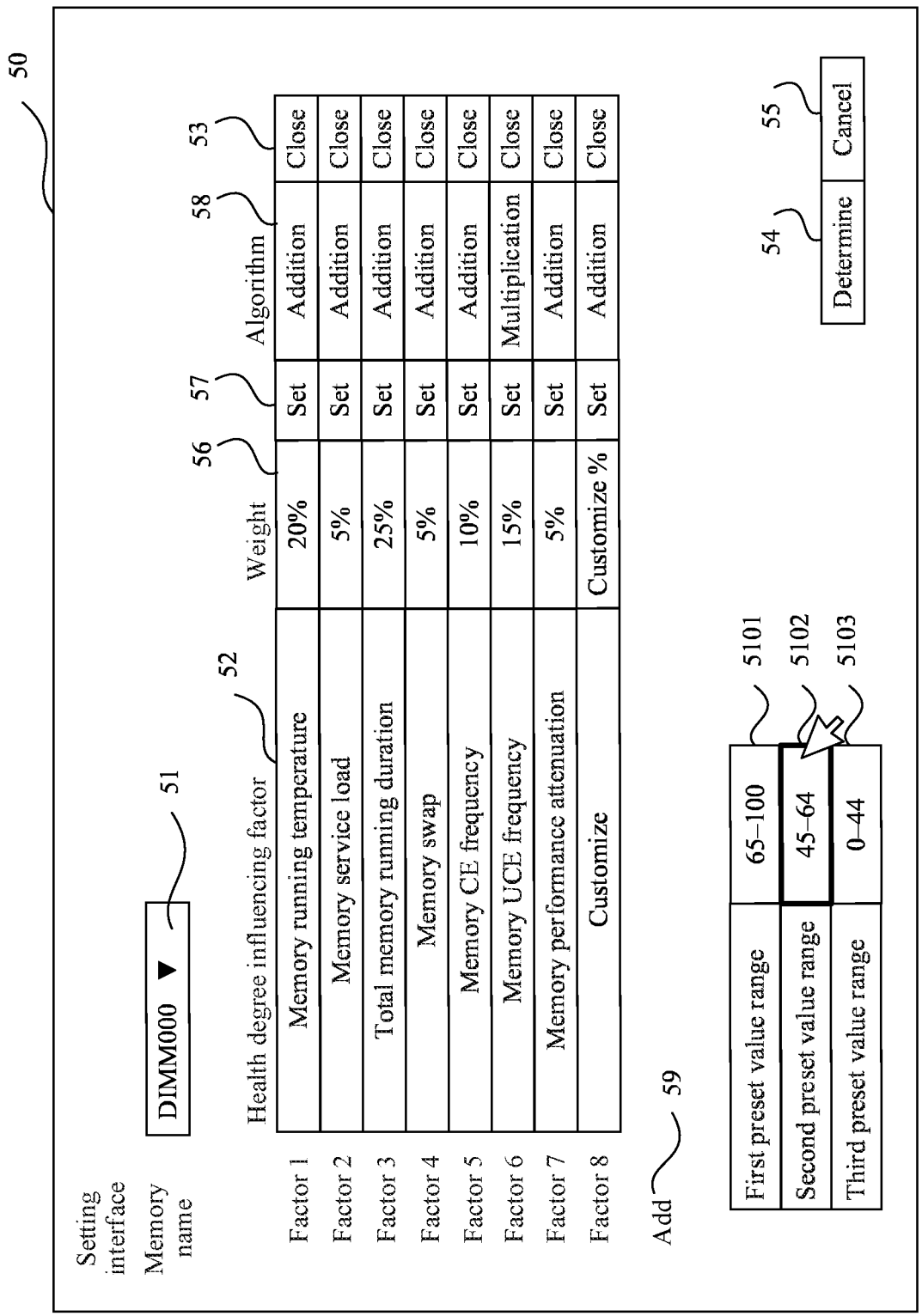
FIG. 31 is a schematic diagram of another MC interface according to an embodiment of the present application.

FIG. 30 or FIG. 31 shows another MC interface according to an embodiment of the present application. Referring to the MC interface provided in the foregoing embodiment, the MC interface 50 shown in FIG. 30 and FIG. 31 further includes a "first preset value range" option, a "second preset value range" option, and a "third preset value range" option, and the "first preset value range" option, the "second preset value range" option, and the "third preset value range" option are used by the user to set the first preset value range, the second preset value range, and the third preset value range. For example, values "45 to 74" in the "second preset value range" option included in the MC interface shown in FIG. 30 may be set by the user by using an input device. The processor in the memory evaluation apparatus may generate a corresponding instruction, and instruct the display to display the MC interface 50 shown in FIG. 31. Values "45 to 64" in the "second preset value range" option included in the MC interface 50 shown in FIG. 31.

It should be noted that, according to the memory evaluation method provided in this embodiment of the present application, the user can set different preset value ranges for different to-be-evaluated memories, so that the health degree indication information, of the to-be-evaluated memory, obtained by the memory evaluation apparatus based on the preset value range is more proper for the to-be-evaluated memory. This helps to more accurately indicate, to the user, whether the to-be-evaluated memory needs to be replaced.

Figure 32:
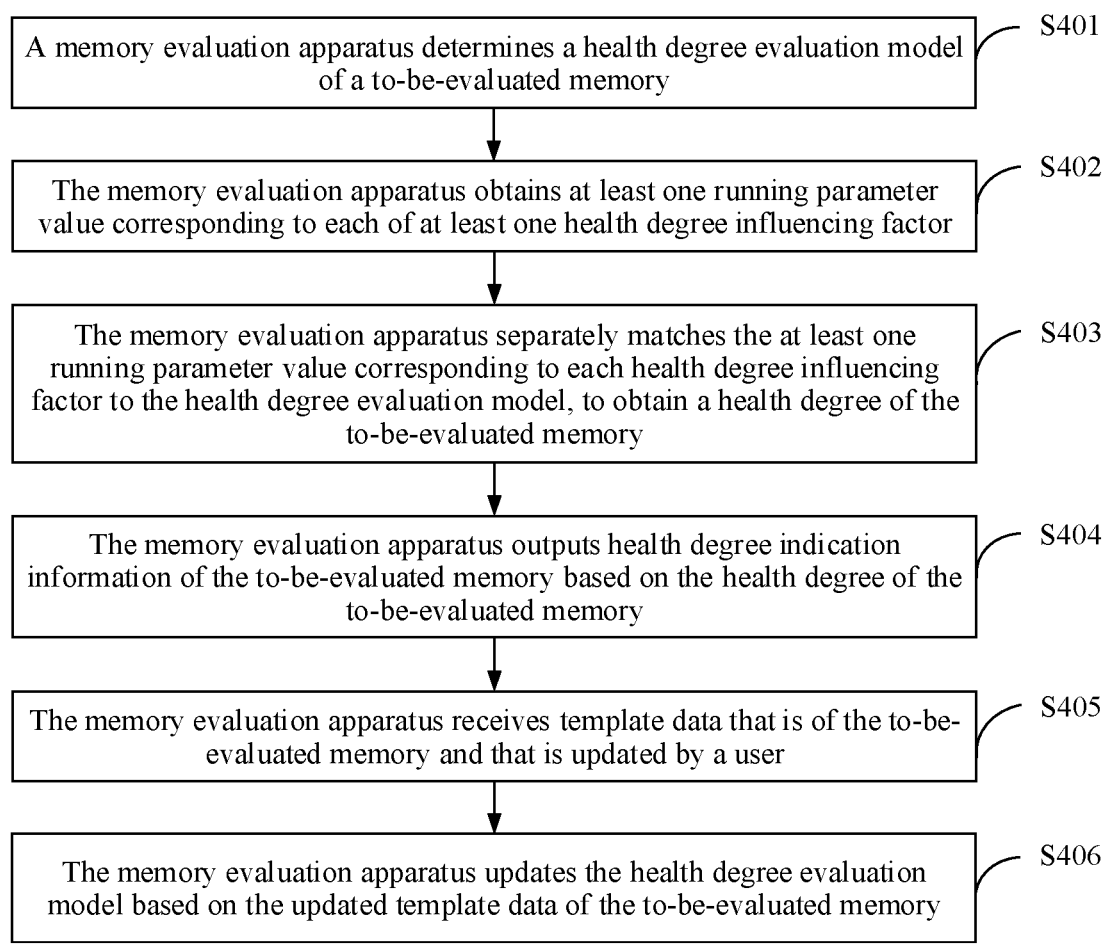
FIG. 32 is another schematic flowchart of a memory evaluation method according to an embodiment of the present application.

In an embodiment, in a running process of the to-be-evaluated memory, the memory evaluation apparatus may continuously evaluate the health degree of the to-be-evaluated memory. In this case, the user may update the health degree evaluation model of the to-be-evaluated memory, so that the health degree evaluation model is more proper for the to-be-evaluated memory. Specifically, the memory evaluation method provided in this embodiment of the present application may further include step 405 and step 406 after step 404. For example, FIG. 32 is a schematic flowchart of another memory evaluation method according to an embodiment of the present application. The memory evaluation method shown in FIG. 32 may further include step 405 and step 406 after step 404 shown in FIG. 4.

S405: The memory evaluation apparatus receives template data that is of the to-be-evaluated memory and that is updated by the user.

For example, step 405 may be performed by the communications interface 114 in the memory evaluation apparatus 20 shown in FIG. 2B.

The template data includes at least one or more of the following: the at least one health degree influencing factor, a running parameter corresponding to each of the at least one health degree influencing factor, the weight corresponding to each health degree influencing factor, an algorithm corresponding to each health degree influencing factor, a first preset value range, a second preset value range, and a third preset value range.

S406: The memory evaluation apparatus updates the health degree evaluation model based on the updated template data of the to-be-evaluated memory.

For example, step 406 may be performed by the processor 111 in the memory evaluation apparatus 20 shown in FIG. 2B.

It should be noted that, for a process in which the memory evaluation apparatus updates the template data of the to-be-evaluated memory and the health degree evaluation model of the to-be-evaluated memory, reference may be made to related description of determining the health degree evaluation model of the to-be-evaluated memory in the foregoing embodiment.

Because the user can update the health degree evaluation model of the to-be-evaluated memory, so that the health degree evaluation model is more proper for the to-be-evaluated memory, the health degree, of the to-be-evaluated memory, obtained by the memory evaluation apparatus based on the updated health degree evaluation model is more proper for the to-be-evaluated memory. This helps to more accurately indicate, to the user, whether the to-be-evaluated memory needs to be replaced.

The foregoing mainly describes the solutions provided in the embodiments of the present application from a perspective of interaction of network elements. It can be understood that each network element, such as the memory evaluation apparatus, includes a corresponding hardware structure and/ or a corresponding software module for executing functions. A person skilled in the art should be easily aware that, with reference to the examples described in the embodiments disclosed in this specification, units and algorithms steps may be implemented by hardware or a combination of hardware and computer software. Whether a function is performed by hardware or hardware driven by computer software depends on particular applications and design constraints of the technical solutions. A person skilled in the art may use different methods to implement the described functions for each particular application, but it should not be considered that the implementation goes beyond the scope of this application.

Modules of the memory evaluation apparatus may be obtained through division based on the method embodiments in the embodiments of the present application. For example, modules corresponding to functions may be obtained through division, or two or more functions may be integrated into one processing module. The integrated module may be implemented in a form of hardware, or may be implemented in a form of a software module. It should be noted that, in this embodiment of the present application, division into the modules is exemplary, is merely logical function division, and may be other division in an actual implementation.

Figure 33:
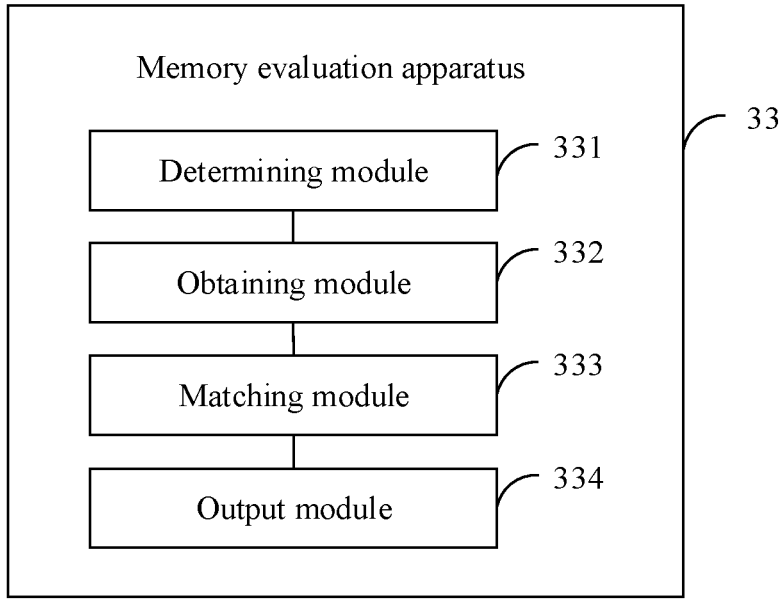
FIG. 33 is another schematic structural diagram of a memory evaluation apparatus according to an embodiment of the present application.

When functional modules corresponding to functions are obtained through division, FIG. 33 is a possible schematic diagram of composition of the memory evaluation apparatus provided in the foregoing embodiment. As shown in FIG. 33, a memory evaluation apparatus 33 may include a determining module 331, an obtaining module 332, a matching module 333, and an output module 334.

The determining module 331 is configured to support the memory evaluation apparatus 33 in performing step 401, step 401a to step 401e, and step 406 in the foregoing embodiment, and/or is configured for another process of the technology described in this specification. The obtaining module 332 is configured to support the memory evaluation apparatus 33 in performing step 402 in the foregoing embodiment, and/or is configured for another process of the technology described in this specification. The matching module 333 is configured to support the memory evaluation apparatus 33 in performing step 403, step 403a, and step 403b in the foregoing embodiment, and/or is configured for another process of the technology described in this specification. The output module 334 is configured to support the memory evaluation apparatus 33 in performing step 404 and step 404a to step 403c in the foregoing embodiment, and/or is configured for another process of the technology described in this specification.

Figure 34:
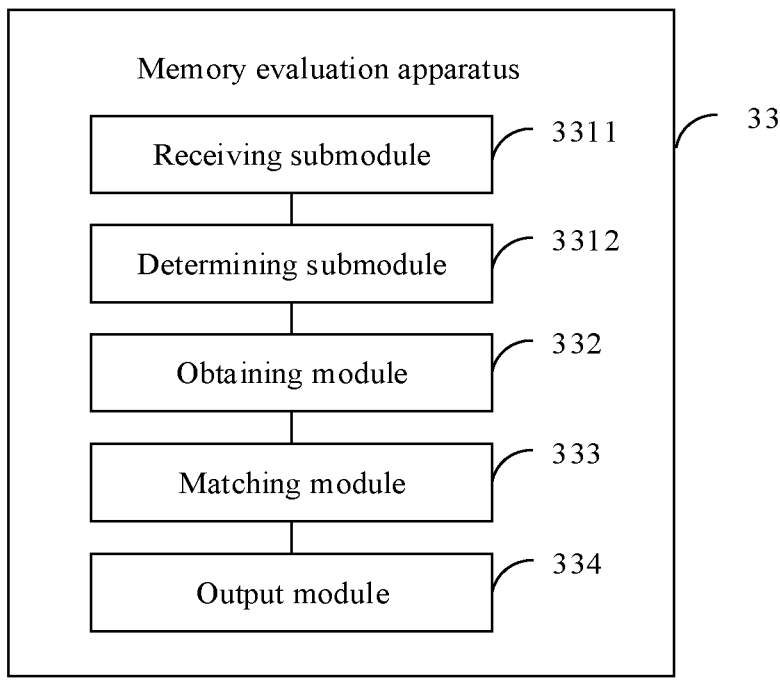
FIG. 34 is another schematic structural diagram of a memory evaluation apparatus according to an embodiment of the present application.

In a possible implementation, FIG. 34 is another possible schematic diagram of composition of the memory evaluation apparatus provided in the foregoing embodiment. In a memory evaluation apparatus 33 shown in FIG. 34, the determining module 331 may include a receiving submodule 3311 and a determining submodule 3312. The receiving submodule 3311 is configured to support the memory evaluation apparatus 33 in performing step 401a, step 401d, step 401', and step 405 in the foregoing embodiment, and/or is configured for another process of the technology described in this specification. The determining submodule 3312 is configured to support the memory evaluation apparatus 33 in performing step 401a, step 401b, step 401c, step 401e, and step 406 in the foregoing embodiment, and/or is configured for another process of the technology described in this specification.

When an integrated unit is used, the obtaining module 332, a matching module 333, and the determining submodule 3312 may be integrated into one processing module. The processing module may be a processor or a controller, for example, a CPU, a general-purpose processor, a digital signal processor (DSP), an application-specific integrated circuit (ASIC), a field programmable gate array (FPGA) or another programmable logic device, transistor logic device, hardware component, or any combination thereof. The processing module may implement or execute various illustrations logical blocks, modules, and circuits described with reference to content disclosed in the present application. The processing element may alternatively be a combination implementing a computing function, for example, a combination of one or more microprocessors, or a combination of the DSP and a microprocessor. The output module 334 and the receiving submodule 3311 may be implemented by a processor and a communications interface. The output module may include a generation submodule and an output submodule. The generation submodule may be configured to generate health degree indication information of a to-be-evaluated memory, and the output submodule may be configured to output the health degree indication information of the to-be-evaluated memory by using a display.

The storage module may be a memory. Certainly, the memory evaluation apparatus 33 may further include another functional module.

With reference to the memory evaluation apparatus shown in FIG. 2B in the foregoing embodiment, the processing module may be the processor 111 shown in FIG. 2B. The storage module may be the hard disk 112 and the at least one memory 113 shown in FIG. 2B. The communications module may be the communications interface 114 shown in FIG. 2B. The communications bus 114 may be a peripheral component interconnect (PCI) bus, an extended industry standard architecture (EISA) bus, or the like. The communications bus 114 may be classified into an address bus, a data bus, a control bus, and the like. This is not limited in this embodiment of the present application.

It should be noted that, for detailed descriptions of the modules in the memory evaluation apparatus 33 provided in this embodiment of the present application and technical effects brought after the modules perform related method steps in the foregoing embodiment, reference may be made to related descriptions in the method embodiment of the present application. Details are not described herein.

The foregoing descriptions about implementations allow a person skilled in the art to clearly understand that, for the purpose of convenient and brief description, only division into the foregoing functional modules is taken as an example for illustration. In actual application, the foregoing functions can be allocated to different functional modules and implemented by the different functional modules based on a requirement, to be specific, an inner structure of an apparatus is divided into different functional modules to implement all or some of the functions described above. For a detailed working process of the foregoing system, apparatus, and unit, reference may be to a corresponding process in the foregoing method embodiments, and details are not described herein.

In the several embodiments provided in this application, it should be understood that the disclosed system, apparatus, and method may be implemented in other manners. For example, the described apparatus embodiment is merely an example. For example, the division into the modules or units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of this application essentially, or the part contributing to some approaches, or all or some of the technical solutions may be implemented in the form of a software product. The computer software product is stored in a storage medium and includes several instructions for instructing a computer device (which may be a personal computer, a server, a network device, or the like) or a processor to perform all or some of the steps of the methods described in the embodiments of this application. The foregoing storage medium includes: any medium that can store program code, such as a flash memory, a removable hard disk, a read-only memory, a random-access memory, a magnetic disk, or an optical disc.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A memory evaluation method, comprising:
   implementing an evaluation model for evaluating a health degree of a memory of a server;
   obtaining error information of the memory;
   generating the health degree of the memory by analyzing the error information using the evaluation model;
   generating health degree indication information corresponding to the health degree, wherein the health degree indication information indicates whether the memory is to be replaced before the memory is faulty; and
   displaying, when the memory is not faulty and the health degree of the memory is less than a threshold of a preset health degree range, the health degree indication information as an alarm signal instructing replacement of the memory,
   wherein the memory is random-access memory (RAM).

2. The method according to claim 1, wherein the memory evaluation method is implemented by a management controller (MC).

3. The method according to claim 2, further comprising monitoring, by the MC, running data of the memory in the server.

4. The method according to claim 1, wherein displaying the health degree indication information comprises displaying the health degree indication information through a graphical user interface (GUI).

5. The method according to claim 1, wherein the evaluation model is trained with historical memory running data.

6. The method according to claim 1, further comprising matching the error information to the evaluation model to generate the health degree.

7. The method according to claim 1, wherein the error information comprises at least one of a memory correctable error (CE), a memory uncorrectable error (UCE), or memory performance attenuation.

8. The method according to claim 7, wherein obtaining the error information comprises at least one of:
   obtaining a value of memory correctable errors (CEs) of the memory, wherein the value of CEs comprises at least one of a first quantity of CEs of the memory or a first CE frequency of the memory;
   obtaining a value of memory uncorrectable errors (UCEs) of the memory, wherein the value of UCEs comprises at least one of a second quantity of CEs of the memory or a second CE frequency of the memory; and
   obtaining a performance value attenuation magnitude of the memory.

9. The method according to claim 1, further comprising:
   outputting first health degree indication information when a value of the health degree is within a first preset value range, wherein the first health degree indication information indicates, to a user, that the memory does not need to be replaced;
   outputting second health degree indication information when the value of the health degree is within a second preset value range, wherein the second health degree indication information indicates, to the user, that the memory is replaceable; and
   outputting third health degree indication information when the value of the health degree is within a third preset value range, wherein the third health degree indication information indicates, to the user, that the memory needs to be replaced.

10. The method according to claim 8, wherein in the evaluation model, the health degree changes with a memory error parameter.

11. The method according to claim 1, wherein the evaluation model comprises a first submodel and a second submodel that correspond to each of a plurality of health degree influencing factors, wherein the first submodel of a first health degree influencing factor is a relationship between a health degree impairment value corresponding to the first health degree influencing factor and a running parameter and a failure rate parameter corresponding to the first health degree influencing factor, and wherein the second submodel is a relationship in which the health degree of the memory changes with the health degree impairment value corresponding to each health degree influencing factor and a relationship in which the health degree of the memory changes with a weight corresponding to each health degree influencing factor.

12. A server comprising:
a memory; and
a management controller (MC) coupled to the memory and configured to:
  implement an evaluation model for evaluating a health degree of the memory;
  obtain error information of the memory;
  generate the health degree of the memory by analyzing the error information using the evaluation model;
  generate a health degree indication information corresponding to the health degree, wherein the health degree indication information indicates whether the memory is to be replaced before the memory is faulty; and
  display, when the memory is not faulty and the health degree of the memory is less than a threshold of a preset health degree range, the health degree indication information as an alarm signal instructing replacement of the memory,
  wherein the memory is random-access memory (RAM).

13. The server of claim 12, wherein the MC is configured to monitor running data of the memory in the server.

14. The server of claim 12, wherein the MC is configured to display the health degree indication information using a graphical user interface (GUI).

15. The server of claim 12, wherein the MC is configured to match the error information to the evaluation model to generate the health degree.

16. The server of claim 12, wherein the error information comprises at least one of a memory correctable error (CE), a memory uncorrectable error (UCE), or memory performance attenuation.

17. The server of claim 16, wherein the MC is configured to perform one or more of the following:
  obtain a value of memory correctable errors (CEs) of the memory, wherein the value of CEs comprises at least one of a first quantity of CEs of the memory or a first CE frequency of the memory;
  obtain a value of memory uncorrectable errors (UCEs) of the memory, wherein the value of UCEs comprises at least one of a second quantity of CEs of the memory or a second CE frequency of the memory; and
  obtain a performance value attenuation magnitude of the memory.

18. A computer program product comprising instructions that are stored on a non-transitory computer-readable medium and that, when executed by a processor, cause an apparatus to:
  implement an evaluation model for evaluating a health degree of a memory of a server;
  obtain error information of the memory;
  generate the health degree of the memory by analyzing the error information of the memory using the evaluation model;
  generate health degree indication information corresponding to the health degree of the memory, wherein the health degree indication information indicates whether the memory is to be replaced before the memory is faulty; and
  display, when the memory is not faulty and the health degree of the memory is less than a threshold of a preset health degree range, the health degree indication information of the memory as an alarm signal instructing replacement of the memory,
  wherein the memory is random-access memory (RAM).

19. The computer program product of claim 18, wherein the error information comprises at least one of: memory correctable error (CE), memory uncorrectable error (UCE), and memory performance attenuation.

20. The computer program product of claim 19, wherein obtaining the error information of the memory comprises at least one of:
  obtaining a value of memory correctable errors (CEs) of the memory, wherein the value of CEs comprises at least one of a first quantity of CEs of the memory or a first CE frequency of the memory;
  obtaining a value of memory uncorrectable errors (UCEs) of the memory, wherein the value of UCEs comprises at least one of a second quantity of CEs of the memory or a second CE frequency of the memory; and
  obtaining a performance value attenuation magnitude of the memory.

* * * * *